(12) United States Patent
Liff et al.

(10) Patent No.: US 11,756,943 B2
(45) Date of Patent: Sep. 12, 2023

(54) MICROELECTRONIC ASSEMBLIES

(71) Applicant: Intel Corporation, Santa Clara, CA (US)

(72) Inventors: Shawna M. Liff, Scottsdale, AZ (US); Adel A. Elsherbini, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 16/650,698

(22) PCT Filed: Dec. 29, 2017

(86) PCT No.: PCT/US2017/068903
§ 371 (c)(1),
(2) Date: Mar. 25, 2020

(87) PCT Pub. No.: WO2019/132958
PCT Pub. Date: Jul. 4, 2019

(65) Prior Publication Data
US 2020/0286871 A1    Sep. 10, 2020

(51) Int. Cl.
*H01L 25/16* (2006.01)
*H01L 25/065* (2006.01)
(Continued)

(52) U.S. Cl.
CPC .......... *H01L 25/167* (2013.01); *G02B 6/4206* (2013.01); *G02B 6/43* (2013.01);
(Continued)

(58) Field of Classification Search
CPC . H01L 25/167; H01L 25/0652; H01L 25/071; H01L 25/112; H01L 23/5383;
(Continued)

(56) References Cited

U.S. PATENT DOCUMENTS 6,885,106 B1 * 4/2005 Damberg ............ H01L 25/0657
439/58
9,165,793 B1 * 10/2015 Wang .................... H01L 25/115
(Continued)

FOREIGN PATENT DOCUMENTS

WO    2017171878 A1    10/2017
WO    2019132958 A1    7/2019

OTHER PUBLICATIONS

PCT International Search Report and Written Opinion dated Sep. 28, 2018 in PCT/US2017/068903; 13 pages.

*Primary Examiner* — Ida M Soward
(74) *Attorney, Agent, or Firm* — Akona IP PC

(57) ABSTRACT

Microelectronic assemblies, and related devices and methods, are disclosed herein. For example, in some embodiments, a microelectronic assembly may include a photonic receiver; and a die coupled to the photonic receiver by interconnects, wherein the die includes a device layer between a first interconnect layer of the die and a second interconnect layer of the die. In still some embodiments, a microelectronic assembly may include a photonic transmitter; and a die coupled to the photonic transmitter by interconnects, wherein the die includes a device layer between a first interconnect layer of the die and a second interconnect layer of the die.

17 Claims, 35 Drawing Sheets

(51) Int. Cl.
- *H01L 25/07* (2006.01)
- *H01L 25/11* (2006.01)
- *H01L 23/538* (2006.01)
- *H01L 27/14* (2006.01)
- *G02B 6/42* (2006.01)
- *G02B 6/43* (2006.01)
- *H01L 21/48* (2006.01)
- *H01L 23/00* (2006.01)

(52) U.S. Cl.
CPC ...... *H01L 21/4853* (2013.01); *H01L 21/4857* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/071* (2013.01); *H01L 25/112* (2013.01); *H01L 2224/214* (2013.01)

(58) Field of Classification Search
CPC . H01L 23/5386; H01L 23/5389; H01L 24/20; H01L 24/73; H01L 24/06; H01L 24/08; H01L 24/26; H01L 24/29; H01L 24/32; H01L 27/1464; H01L 2224/0401; H01L 2224/06181; H01L 2224/08145; H01L 2224/08225; H01L 2224/12105; H01L 2224/16145; H01L 2224/16227; H01L 2224/16235; H01L 2224/18; H01L 2224/29187; H01L 2224/2919; H01L 2224/73203; H01L 2224/73267; H01L 2224/2518; H01L 2225/06589; G02B 6/4206; G02B 6/43

See application file for complete search history.

(56) References Cited

U.S. PATENT DOCUMENTS

| | | | |
|---|---|---|---|
| 9,324,626 | B2 * | 4/2016 | Shen .................... H01L 21/4803 |
| 2003/0113067 | A1 | 6/2003 | Koh et al. |
| 2005/0135732 | A1 | 6/2005 | Crow et al. |
| 2008/0017971 | A1 * | 1/2008 | Hollis ............... H01L 21/76804 |
| | | | 257/698 |
| 2011/0165707 | A1 | 7/2011 | Lott et al. |
| 2014/0042607 | A1 | 2/2014 | Knickerbocker |
| 2016/0284753 | A1 * | 9/2016 | Komai ................ H01L 27/1469 |
| 2018/0012863 | A1 * | 1/2018 | Yu ...................... H01L 21/76877 |
| 2018/0040584 | A1 * | 2/2018 | Kang ...................... H01L 24/94 |
| 2018/0040658 | A1 * | 2/2018 | Kang ............... H01L 27/14627 |
| 2018/0090530 | A1 * | 3/2018 | Jeong ............... H01L 27/14618 |
| 2019/0006549 | A1 * | 1/2019 | Yim ..................... H01L 23/367 |

* cited by examiner

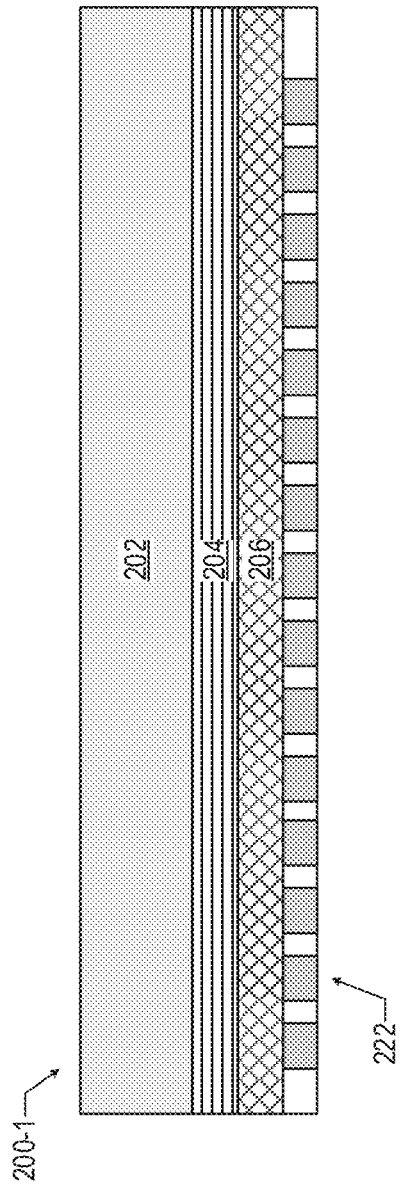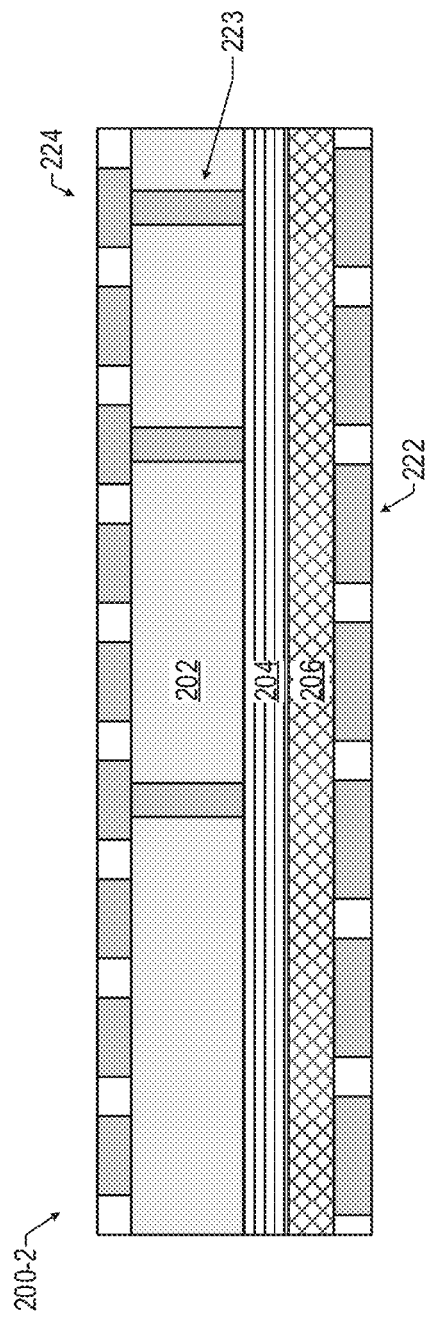

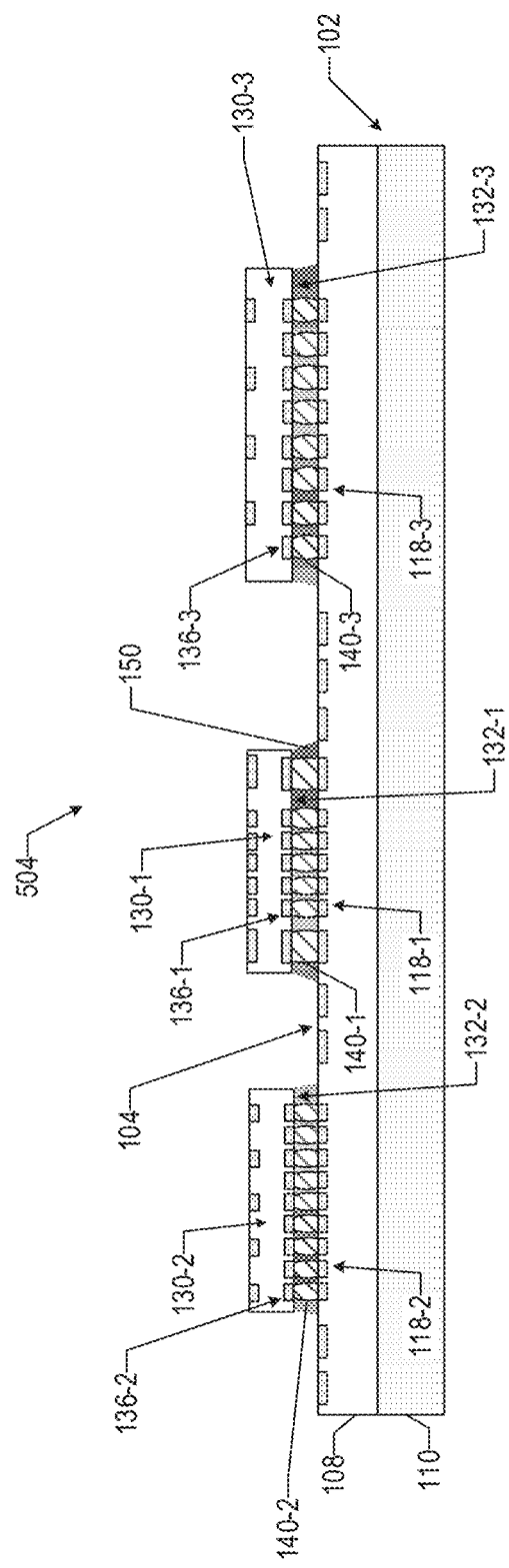

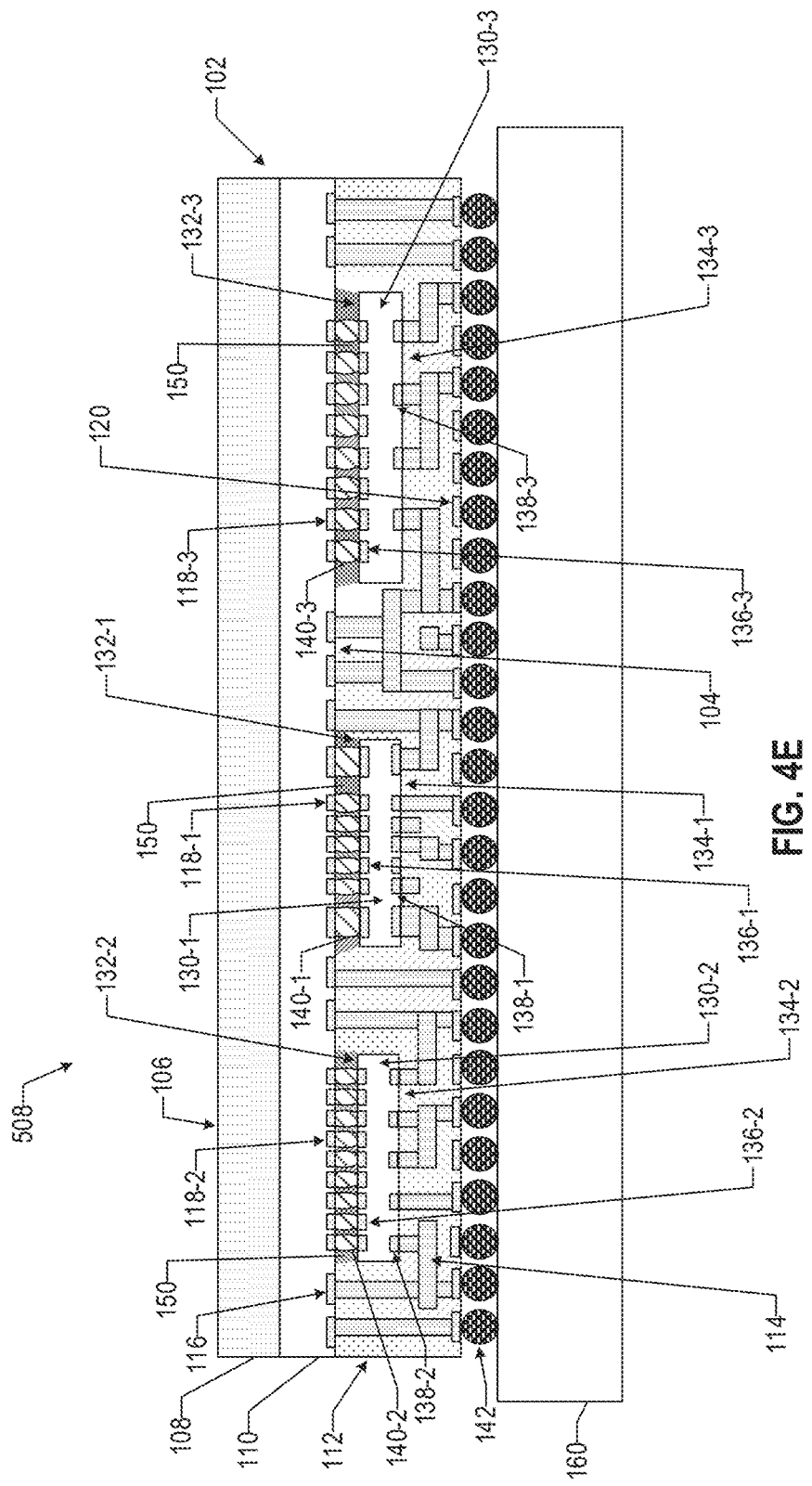

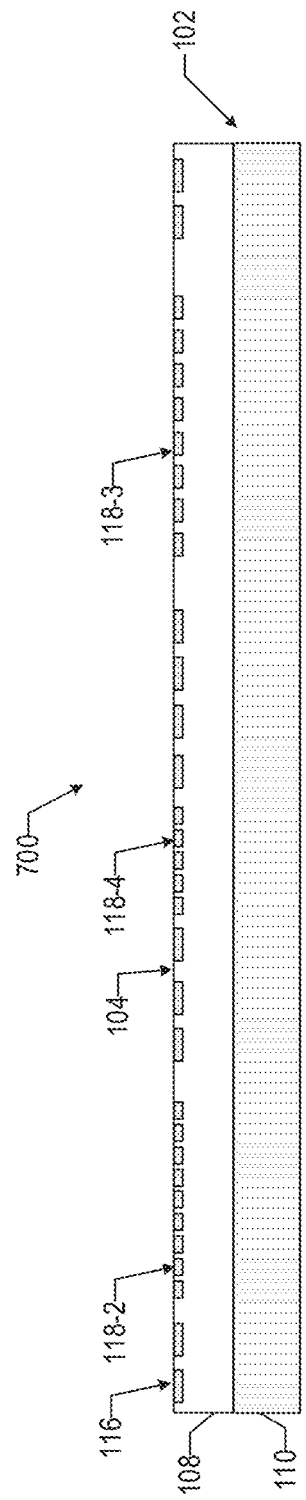

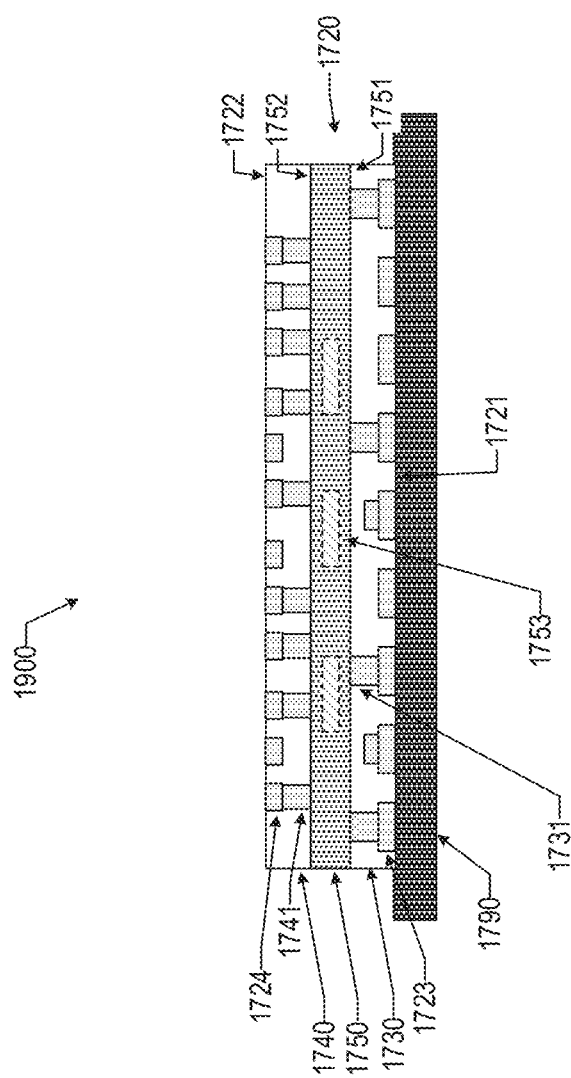

MICROELECTRONIC ASSEMBLIES

CROSS-REFERENCE TO RELATED APPLICATION

This application is a national stage application under 35 U.S.C. § 371 of PCT International Application Serial No. PCT/US2017/068903, filed on Dec. 29, 2017 and entitled "MICROELECTRONIC ASSEMBLIES," which is hereby incorporated by reference herein in its entirety.

BACKGROUND

Integrated circuit devices (e.g., dies) are typically coupled together to integrate features or functionality and to facilitate connections to other components, such as circuit boards. However, current techniques for coupling integrated circuit devices are limited by manufacturing, device size, thermal considerations, and interconnect congestion, which may impact costs and implementations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 2A-2D are side, cross-sectional views of example dies that may be included in a microelectronic assembly, in accordance with various embodiments.

FIGS. 4A-4E are side, cross-sectional views of various stages in an example process for manufacturing the microelectronic assembly of FIG. 1, in accordance with various embodiments.

FIGS. 6A-6G are side, cross-sectional views of various stages in an example process for manufacturing the microelectronic assembly of FIG. 5, in accordance with various embodiments.

FIGS. 14A-14C are side, cross-sectional views of various stages in an example process for manufacturing the microelectronic assembly of FIG. 12, in accordance with various embodiments.

DETAILED DESCRIPTION

Figure 1:
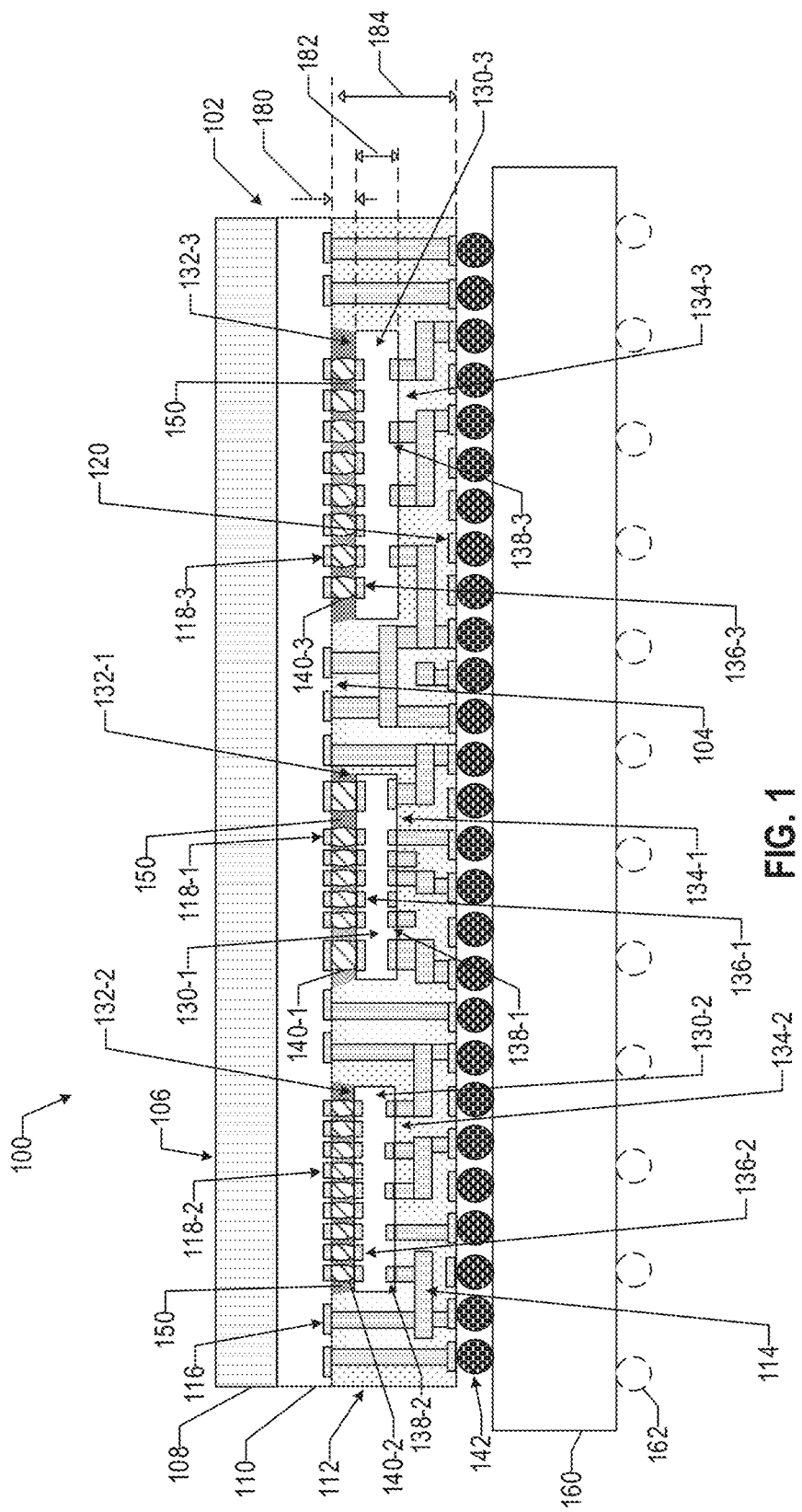
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a first die comprising a first face and a second face; and a second die, the second die comprising a first face and a second face, wherein the second die further comprises a plurality of first conductive contacts at the first face and a plurality of second conductive contacts at the second face, and the second die is between first-level interconnect contacts of the microelectronic assembly and the first die. In some embodiments, a microelectronic assembly may include a backside illuminated image sensor comprising a pixel array layer and a logic layer; and a double-sided die coupled to the logic layer by interconnects, wherein the logic layer is between the double-sided die and the pixel array layer. In still some embodiments, a microelectronic assembly may include a photonic receiver; and a die coupled to the photonic receiver by interconnects, wherein the die comprises a device layer between a first interconnect layer of the die and a second interconnect layer of the die. In still some embodiments, a microelectronic assembly may include a photonic transmitter; and a die coupled to the photonic transmitter by interconnects, wherein the die comprises a device layer between a first interconnect layer of the die and a second interconnect layer of the die.

Communicating large numbers of signals between two or more dies in a multi-die integrated circuit (IC) package, sometimes referred to as a "composite die," is challenging due to the increasingly small size of such dies, thermal constraints, and power delivery constraints, among others. Various ones of the embodiments disclosed herein may help achieve reliable attachment of multiple IC dies at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, server architectures, consumer electronics (e.g., wearable devices), and/or any other devices that may include heterogeneous technology integration.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 4" may be used to refer to the collection of drawings of FIGS. 4A-4E, the phrase "FIG. 6" may be used to refer to the collection of drawings of FIGS. 6A-6G, etc. although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad, socket, bump, or pillar, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the double-sided die 130-2, the double-sided die 130-3, the second-level interconnects 162 and/or the package substrate 160 may not be included. Further, FIG. 1 illustrates a number of elements that are omitted from subsequent drawings for ease of illustration, but may be included in any of the microelectronic assemblies disclosed herein. Examples of such elements include the second-level interconnects 162 and/or the package substrate 160. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies disclosed herein may serve as a system-in-package (SiP) in which multiple dies 102 and double-sided dies 130 having different functionality are included. In such embodiments, the microelectronic assembly 100 may be referred to as a SiP.

The microelectronic assembly 100 may include a double-sided die 130-1 coupled to a die 102 at a first face 104 of the die 102 and at a first face 132-1 of the double-sided die 130-1 by die-to-die (DTD) interconnects 140-1. In particular, the first face 104 of die 102 may include a set of conductive contacts 118-1 and the first face 132-1 of the double-sided die 130-1 may include a set of conductive contacts 136-1. The conductive contacts 118-1 at the first face 104 of die 102 may be electrically and mechanically coupled to the conductive contacts 136-1 at the first face 132-1 of the double-sided die 130-1 by DTD interconnects 140-1. The first face 104 of die 102 may also include conductive contacts 116 to electrically couple the die 102 to one or more interconnect structures 114 of a routing layer, such as a redistribution layer (RDL) 112 shown in the embodiment of FIG. 1. The double-sided die 130-1 may also include conductive contacts 138-1 at a second face 134-1 of the double-sided die 130-1. The conductive contacts 138-1 at the second face 134-1 of the die 130-1 may electrically couple the die double-sided 130-1 to one or more interconnect structures 114 of the redistribution layer 112. In some embodiments, die 102 may also be a double-sided die.

As referred to herein in this Specification, a double-sided die is a die that has interconnect layers (e.g., a metallization stack) on both sides (e.g., a "top" side and an opposing "bottom" side) of a device layer (which can potentially include multiple device layers) of the die. In a double-sided die, a device layer (which can potentially include multiple device layers) may be sandwiched by two metallization stacks providing conductive pathways between the device layer and the conductive contacts at the faces of the die, or by a metallization stack providing conductive pathways between the device layer and the conductive contacts at one face of the die and a semiconductor substrate with thru-semiconductor vias (TSVs) providing conductive pathways between the device layer and the conductive contacts at the other face of the die.

Stated differently, a die may be double-sided in the sense that circuitry for the double-sided die may have interconnect layers and associated conductive contacts on both sides of the device layer (or layers).

The redistribution layer 112 may include an insulating material (e.g., a dielectric material formed in multiple layers, as known in the art) and one or more conductive pathways, referred to herein as interconnect structures 114, through the dielectric material (e.g., including conductive traces and/or conductive vias). In some embodiments, the insulating material of the redistribution layer may be composed of dielectric materials, bismaleimide triazine (BT) resin, polyimide materials, epoxy materials (e.g., glass reinforced epoxy matrix materials, epoxy build-up films, or the like), mold materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). The redistribution layer 112, via interconnect structures 114, may provide for the ability to fan-out or fan-in composite to package interconnects (e.g., first-level interconnects 142). For example, interconnects providing electrical connectivity between die 102 and package substrate 160 that may lie inside the X-Y area of die 102 may be considered fan-in interconnects. In another example, interconnects providing electrical connectivity between double-sided die 130-1 and package substrate 160 that may lie outside the X-Y area of double-sided die 130-1 may be considered fan-out interconnects.

Interconnect structures 114 of the redistribution layer 112 may extend between or among any dies 102/130 and conductive contacts 120 of the redistribution layer 112. Conductive contacts 120 of the redistribution layer 112 may be electrically and mechanically coupled to conductive contacts (not shown) of the package substrate 160 by first-level interconnects 142. Any of the conductive contacts disclosed herein (e.g., the conductive contacts 116, 118-1, 118-2, 118-3, 136-1, 136-2, 136-3, 138-1, 138-2, 138-3, and/or 120) may include bond pads, posts or pillars, bumps, or any other suitable conductive contact, for example.

In some embodiments, one or more of the interconnect structures 114 of the redistribution layer 112 may extend between one or more conductive contacts 116 at the first face 104 of the die 102 and one or more conductive contacts 120 of the redistribution layer 112 to provide electrical interconnection between the die 102 and the conductive contacts. In some embodiments, one or more of the interconnect structures 114 of the redistribution layer 112 may extend between a conductive contact at the second face of a die coupled to die 102, such as a conductive contact 138-1 at a second face 134-1 of double-sided die 130-1, and one or more conductive contacts 120 of the redistribution layer 112 to provide electrical interconnection among the conductive contacts. In still some embodiments, one or more interconnect structures 114 of the redistribution layer 112 may electrically interconnect two or more conductive contacts 116 at the first face 104 of the die 102 and one or more conductive contacts 120 of the redistribution layer 112 to provide electrical interconnection among the conductive contacts. In still some embodiments, one or more interconnect structures 114 of the redistribution layer 112 may electrically interconnect two or more conductive contacts at the second face of a die (e.g., conductive contacts 138-3 at the second face 134-3 of double-sided die 130-3) coupled to die 102 and one or more conductive contacts 120 of the redistribution layer 112 to provide electrical interconnections among the conductive contacts. In still some embodiments, one or more interconnect structures 114 of the redistribution layer 112 may electrically interconnect one or more conductive contacts 116 at the first face 104 of the die 102 and one or more conductive contacts at the second face of one or more dies coupled to die 102.

The dies 102/130, among others disclosed herein, may include circuitry, which may include one or more device layers including active or passive circuitry (e.g., transistors, diodes, resistors, inductors, capacitors, among others) and one or more interconnect layers (e.g., as discussed below with reference to FIGS. 17-18). In various embodiments, one or more interconnect layers may be present on one or both sides of circuitry for dies 102/130 (e.g., as discussed below with reference to FIGS. 17-18). In some embodiments, the double-sided die 130-1 may be the source and/or destination of signals communicated between the double-sided die 130-1 and other double-sided dies 130 and/or die 102 included in the microelectronic assembly 100. In some embodiments, interconnect layers for a die (e.g., die 130-1, etc.) may include conductive pathways to route power, ground, and/or signals between different ones of the double-sided dies 130 and die 102, between die 102 and one or more conductive contacts 120 of the redistribution layer 112, and/or between different ones of double-sided dies 130 and one or more conductive contacts 120 of the redistribution layer 112.

In some embodiments, the double-sided die 130-1 may couple directly to power and/or ground lines in the redistribution layer 112. By allowing the double-sided die 130-1 to couple directly to power and/or ground lines in the redistribution layer 112, such power and/or ground lines need not be routed through the die 102, allowing the die 130-1 to be made smaller or to include more active circuitry or signal pathways. Thus, the larger interconnect structures 114 of the redistribution layer 112 (e.g., larger in comparison to interconnect layers within dies) can, in some embodiments, provide direct power delivery to all components (e.g., double-sided dies 130) coupled to the die 102 rather than routing power and/or ground through die 102.

Although FIG. 1 illustrates a specific number and arrangement of interconnect structures 114 in the redistribution layer 112, these are simply illustrative and any suitable number and arrangement may be used. The interconnect structures 114 disclosed herein (e.g., conductive traces and/or conductive vias) may be formed of any appropriate conductive material, such as copper, silver, nickel, gold, aluminum, or other metals or alloys, for example.

The dies 102/130, among others disclosed herein, may include an insulating material (e.g., a dielectric material formed in multiple layers, or semiconductor material, as known in the art) and multiple conductive pathways formed through the insulating material. In some embodiments, the insulating material of a die 102/130 may include a dielectric material, such as BT resin, polyimide materials, glass reinforced epoxy matrix materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). For example, one or more of the dies 102/130 may include a dielectric build-up film, such as epoxy or polyimide based dielectric build-up film. In some embodiments, the active material of dies 102/130 may be a semiconductor material, such as silicon, germanium, indium antimonide, lead telluride, indium arsenide, indium phosphide, gallium arsenide, or gallium antimonide. Further active materials classified as group II-VI, III-V, or IV may also be used as the active substrate materials of dies 102/130.

One or more of dies 102/130, among others disclosed herein, may also include a die substrate on one, both, or no sides of circuitry for a given die. For the embodiment of FIG. 1, for example, die 102 may include circuitry 110 and a die substrate 108 extending from the circuitry 110 to a second face 106 of the die 102. The die substrate 108 may be a crystalline substrate formed using a bulk silicon or silicon-on-insulator (SOI) substructure, silicon carbide, etc. Other substrate materials may be used, as desired depending on design and/or implementation. In some embodiments, thru-semiconductor vias (TSVs), which may include a conductive material via, such as a metal via, isolated from the surrounding substrate by a barrier material, such as oxide, may be included in the die substrate for a die (e.g., on one or both sides of the die) through which power, ground, and/or signals may be transmitted between a die and one or more other dies, package substrates (e.g., printed circuit boards), interposers, combinations thereof, or the like that may be interconnected with the die.

The microelectronic assembly 100 of FIG. 1 may also include a double-sided die 130-2. The double-sided die 130-2 may be electrically and mechanically coupled to die 102 by DTD interconnects 140-2. In particular, the first face 104 of die 102 may include a set of conductive contacts 118-2 and the first face 132-2 of the double-sided die 130-2 may include a set of conductive contacts 136-2. The conductive contacts 118-2 at the first face 104 of die 102 may be electrically and mechanically coupled to the conductive contacts 136-2 at the first face 132-2 of the double-sided die 130-2 by DTD interconnects 140-2. The double-sided die 130-2 may also include conductive contacts 138-2 at a second face 134-2 of the double-sided die 130-2. The conductive contacts 138-2 at the second face 134-2 of the die 130-2 may electrically couple the double-sided die 130-2 to one or more interconnect structures 114 of the redistribution layer 112.

The microelectronic assembly 100 of FIG. 1 may also include a double-sided die 130-3. The double-sided die 130-3 may be electrically and mechanically coupled to die 102 by DTD interconnects 140-3. In particular, the first face 104 of die 102 may include a set of conductive contacts 118-3 and the first face 132-3 of the double-sided die 130-3 may include a set of conductive contacts 136-3. The conductive contacts 118-3 at the first face 104 of die 102 may be electrically and mechanically coupled to the conductive contacts 136-3 at the first face 132-3 of the double-sided die 130-3 by DTD interconnects 140-3. The double-sided die 130-3 may also include conductive contacts 138-3 at a second face 134-3 of the double-sided die 130-3. The conductive contacts 138-3 at the second face 134-3 of the die 130-3 may electrically couple the double-sided die 130-3 to one or more interconnect structures 114 of the redistribution layer 112.

In some instances, die 102 may be referred to as a base, larger die and double-sided dies 130 may be referred to as smaller dies (in the sense that die 102 may have a larger X-Y area than the X-Y areas of each of individual ones of double-sided dies 130-1/130-2/130-3). In some embodiments, die 102 may be a single die or may be a composite die or monolithic IC (sometimes referred to as a "3D IC", "3D stack", "3D monolithic IC", combinations thereof, or the like).

The base, larger die 102 may include "coarser" conductive contacts 116 coupled to interconnect structures 114 of the redistribution layer 112 and "finer" conductive contacts 118 coupled to smaller double-sided dies 130. For the embodiment of FIG. 1, the die 102 of the microelectronic assembly 100 may be a single-sided die (in the sense that the die 102 only has conductive contacts 116/118 on a single surface) and may be a mixed pitch die (in the sense that the die 102 has sets of die-to-routing layer conductive contacts 116 and DTD conductive contacts 118 with different pitch). Further, die 102 may accommodate mixed pitch DTD conductive contacts for different individual ones of double-sided dies 130-1, 130-2, and 130-3. Even further, die 102 may accommodate mixed pitch DTD conductive contacts for an individual one of the smaller dies, such as conductive contacts 136-1 of double-sided die 130-1.

As noted above, dies 130 may be double-sided dies in the sense that circuitry for the double-sided dies 130 have interconnect layers and conductive contacts on both sides of device layer (or layers). Individual ones of double-sided dies 130-1, 130-2, 130-3, or any other double-sided dies discussed herein, may, in various embodiments, have same or different pitches on either side of the dies (e.g., conductive contacts 136-2 at the first face 132-2 of double-sided die 130-2 may have a different pitch than conductive contacts 138-2 at the second face 134-2 of double-sided die 130-2). Features of double-sided dies are discussed in more detail in FIGS. 2A-2D herein. Although the embodiment of FIG. 1 includes base die 102 as a single-sided die, in other embodiments, base die 102 may also be a double-sided die.

In various embodiments, the pitch of coarser pitch conductive contacts (e.g., conductive contacts 116 of die 102) may range between 40 microns and 200 microns. In general, coarser pitches are better for power delivery than finer pitches. In various embodiments, the pitch of finer pitch conductive contacts (e.g., conductive contacts 118 of double-sided dies 130) may range between 0.1 microns and 55 microns. In general, finer pitches are better for high bandwidth signaling than coarser pitches. In some embodiments, an underfill material 150 may extend between different ones of double-sided dies 130 and die 102 around associated DTD interconnects 140. The underfill material 150 may be an insulating material, such as an appropriate epoxy material or carbon-doped or spin-on-dielectric or oxide. In some embodiments, the underfill material 150 may be an epoxy flux that assists with coupling the double-sided dies 130-1/130-2/130-3 to the die 102 when forming the DTD interconnects 140-1/140-2/140-3, and then polymerizes and encapsulates the interconnects. The underfill material 150 may be selected to have a coefficient of thermal expansion (CTE) that may mitigate or minimize the stress between the dies 102/130 arising from uneven thermal expansion in the microelectronic assembly 100. In some embodiments, the CTE of the underfill material 150 may have a value that may be larger than the CTE of the die 102 (e.g., the CTE of the dielectric material of the die 102) and a CTE of the double-sided dies 130 if the modulus of the dies is low.

The microelectronic assembly 100 of FIG. 1 may also include a package substrate 160. The microelectronic assembly 100 may be coupled to the package substrate 160 by first-level interconnects 142. In particular, conductive contacts 120 of the redistribution layer 112, which may also be referred to as first-level interconnect contacts of the microelectronic assembly 100, may be electrically and mechanically coupled to conductive contacts (not shown) of the package substrate 160 by the first-level interconnects 142 using any suitable technique. The first-level interconnects 142 illustrated in FIG. 1 are solder balls (e.g., for a ball grid array arrangement), but any suitable first-level interconnects 142 may be used (e.g., solder or non-solder, pins in a pin grid array arrangement, lands in a land grid array arrangement, wirebond, or copper pillar with solder cap). In some embodiments, the package substrate 160 may be coupled to a circuit board (not shown) by second-level interconnects 162 using any suitable technique. The second-level interconnects 162 illustrated in FIG. 1 are solder balls (e.g., for a ball grid array arrangement), but any suitable second-level interconnects 162 may be used (e.g., solder, non-solder, pins in a pin grid array arrangement, lands in a land grid array arrangement, wirebond, or copper pillar with solder cap).

The package substrate 160 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 160 may be a dielectric material, such as an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 160 is formed using standard printed circuit board (PCB) processes, the package substrate 160 may include FR-4, and the conductive pathways in the package substrate 160 may be formed by patterned sheets of copper separated by build-up layers of the FR-4. The conductive pathways in the package substrate 160 may be bordered by liner materials, such as adhesion liners and/or barrier liners, as suitable.

The DTD interconnects 140 disclosed herein may take any suitable form. The DTD interconnects 140 may have a finer pitch than the connections to interconnect structures 114 of the redistribution layer 112 in a microelectronic assembly. In some embodiments, the dies 102/130 on either side of a set of DTD interconnects 140 may be unpackaged dies, and/or the DTD interconnects 140 may include small conductive bumps or pillars (e.g., copper bumps or pillars) attached to conductive contacts by solder. In some embodiments, a set of DTD interconnects 140 may include solder. DTD interconnects 140 that include solder may include any appropriate solder material, such as any of the materials discussed above. In some embodiments, a set of DTD interconnects 140 may include an anisotropic conductive material, such as any of the materials discussed above. In some embodiments, the DTD interconnects 140 may be used as data transfer lanes, while interconnections to interconnect structures 114 of the redistribution layer 112 may be used for power and ground lines, among others.

In some embodiments, some or all of the DTD interconnects 140 in a microelectronic assembly 100 may be metal-to-metal interconnects such as copper-to-copper interconnects, plated interconnects (e.g., copper, nickel, and/or gold capped pillar or pad with solder such as Sn, SnAg, SnIn) or any other known metallurgy. In such embodiments, the conductive contacts on either side (e.g., conductive contacts 136-1 and conductive contacts 118-1, conductive contacts 136-2 and conductive contacts 118-2, and/or conductive contacts 136-3 and conductive contacts 118-3) of the DTD interconnect 140 (e.g., 140-1, 140-2, and/or 140-3) may be bonded together without the use of intervening solder or an anisotropic conductive material. Metal-to-metal interconnect techniques may include direct bonding or hybrid bonding, sometimes referred to as diffusion bonding. In some metal-to-metal interconnects that utilize direct bonding, a first die or wafer (if die are redistributed) having a pristine, planar, and active surface may be placed, typically at room temperature, on a second die or wafer also having a pristine, planar, and active surface (e.g., to perform die-to-wafer bonding, die-to-die bonding, or wafer-to-wafer bonding). A force is applied to the dies (in batch) and/or wafers to form a van der Waals bond between the dies and/or wafers. The bonded dies and/or wafers are then annealed at a high temperature (e.g., typically 150° Celsius (C) or higher) to form permanent bonds between the conductive contacts and between dielectric surfaces.

In some metal-to-metal interconnects that utilize hybrid bonding, a dielectric material (e.g., silicon oxide, silicon nitride, or silicon carbide, among others) may be present between the metals bonded together (e.g., between copper pads or posts that provide the associated conductive contacts). For hybrid bonding, conductive contacts may be bonded together under elevated pressure and/or temperature (e.g., thermal compression bonding, typically performed at temperatures greater than 150° C. and greater than 20 megapascals (MPa), which may vary depending on bump pitch, materials, etc.). In some embodiments, a spin-on-dielectric material may be patterned around the conductive to fill any void spaces during bonding.

Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 140 in a microelectronic assembly 100 may be solder interconnects that include a solder with a higher melting point than a solder included in some or all of the first-level interconnects 142. For example, when the DTD interconnects 140 in a microelectronic assembly 100 are formed before the first-level interconnects 142 are formed (e.g., as discussed below with reference to FIGS. 4A-4E), solder-based DTD interconnects 140 may use a higher temperature solder (e.g., with a melting point above 200° C.), while the first-level interconnects 142 may use a lower temperature solder (e.g., with a melting point below 200° C.). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium. In some embodiments, if the DTD interconnects 140 leverage an intermetallic compound (IMC), the interconnect may be designed to convert in its entirety such that the subsequent first level reflow may not impact this interconnect even if the formulations are identical.

In various embodiments of the microelectronic assembly of FIG. 1, the DTD interconnects 140 may vary in distance 180 ranging from the sub-ten microns to the low tens of microns. The distance 180 may extend between the first face 104 of the die 102 and any first face 132 of any of individual ones of double-sided dies 130. Distances 180 between die 102 and individual ones of double-sided dies 130 may be different among the double-sided dies 130. For embodiments in which metal-to-metal interconnects are used (e.g., direct bonding or hybrid bonding), the distance 180 may range between 1.5 microns and 10 microns or less. For embodiments in which solder interconnects are used, the distance 180 may range between 4 microns and 40 microns.

In various embodiments, interconnecting dies using DTD interconnects 140 may provide various advantages as compared to interconnecting dies using other interconnect techniques such as side-by-side interconnects. In at least one embodiment, parasitics (e.g., parasitic capacitances or parasitic resistances) may be lowered using DTD interconnects 140 as compared to using side-by-side interconnects. In general, long interconnects may degrade operating performance of interconnected dies more than short interconnects through one or more of: reducing signaling bandwidth between dies, inducing insertion loss, inducing cross-talk interference between or among signals communicated between dies, inducing resistance which drives the amplification power needed to send a signal farther, among others.

When connecting dies side-by-side, interconnects are typically routed down from one die, through a substrate, over, and back up to another die, which may create a long transmission line that may cause parasitics to be induced among the interconnects.

For various embodiments of the microelectronic assembly 100 of FIG. 1, DTD interconnects 140 may provide one or more advantages in comparison to other interconnect techniques including, but not limited to, providing shorter interconnect distances, which may reduce parasitics for interconnected dies.

The elements of the microelectronic assembly 100 and/or other microelectronic assemblies disclosed herein may have any suitable dimensions. In some embodiments, individual ones of double-sided dies 130 may range in thickness 182 from 10 microns to 75 microns. For example, ultrathin dies may range in thickness from 10 microns to 30 microns. In some embodiments, the microelectronic assembly 100 may include individual ones of double-sided dies 130 having a same or different thickness, as discussed in further detail herein. In various embodiments, the base die 102 may range in thickness between 50 microns and 780 microns. In various embodiments, the redistribution layer 112 may range in thickness 184 between 15 microns and 100 microns and may depend on the thicknesses of the double-sided dies 130.

Further, the microelectronic assembly 100 and/or other microelectronic assemblies disclosed herein may, in some embodiments, advantageously provide for incorporating mixed node (e.g., different process technologies such as 10 nanometer (nm), 14 nm, 28 nm, etc.) and/or heterogeneous technology integration (e.g., GaN versus radio frequency (RF) complementary metal-oxide-semiconductor (CMOS) versus SOI versus SiGe) into a composite die, packaged solution. For example, within a particular technology (e.g., silicon) there may be different manufacturing processes depending on the semiconductor type (e.g., type of silicon such as high resistivity, low resistivity, doped, etc.) or process node. Further, for a given semiconductor type there may be different manufacturing processes (e.g., process temperature limitations for InP relative to standard silicon CMOS) and minimum feature length scale for different process node technologies (e.g., 7 nm vs 28 nm) and different types of devices (e.g., very low power may use one type of transistors, very high power may use another type of transistors, etc.). A technology node may refer to the minimum features size associated with a semiconductor process flow (e.g., transistor gate length and leakage or product attributes, etc.) formed using a particular semiconductor type, process, feature size, etc. Even further, some technology nodes may be better suited for analog devices, some for digital devices, some for optical devices, and so on. When designing mixed device type circuits on one technology node, an integrated device manufacturer (IDM) typically selects the best technology node that suits a particular product or performance and, as a result, sub-optimizes the device types that are not best suited for the particular technology node.

In contrast, embodiments of the microelectronic assembly 100 and/or other microelectronic assemblies disclosed herein may advantageously provide for integrating mixed nodes and/or heterogeneous technologies into a composite die, packaged solution, such as a composite die that may include double-sided dies 130 coupled to die 102 and the redistribution layer 112 providing fan-in and/or fan-out interconnect structures 114 to interconnect to a package substrate (e.g., package substrate 160). Thus, embodiments of microelectronic assembly 100 and/or other microelectronic assemblies disclosed herein may advantageously provide for increased flexibility for integrating mixed nodes and/or heterogeneous technologies in which: a minimum area may be needed per integrated circuit function (e.g., the best process for low power RF may be used, the best process for digital static random access memory (SRAM) circuit shrink may be used, etc.); fine pitch interconnects may be used in high bandwidth areas (e.g., for DTD interconnects) to ease routing congestion issues; and/or direct power delivery may be provided with reduced power penalties (e.g., by using power and/or ground layers within the redistribution layer 112, as opposed to routing power and/or ground through die 102).

In some embodiments, another advantage of microelectronic assembly 100 and/or other microelectronic assemblies disclosed herein may include improved thermal spreading for dies 130. For example, the base die 102 may be a thermal spreader for the small dies 130 leveraging the interconnect structures 114 as well. In some embodiments in which the small dies 130 may be ultrathin dies, CTE matching between the base die 102 and the ultrathin dies may improve the robustness of the ultrathin dies.

The dies 102/130 included in a microelectronic assembly 100 may have any suitable structure. For example, FIGS. 2A-2D illustrate example ones of dies 200 that may be included in a microelectronic assembly 100. The dies 200 illustrated in FIGS. 2A-2D may include a die substrate 202, one or more device layers 204, and/or one or more metallization stacks 206; these elements are discussed in further detail below with reference to FIGS. 18-19.

FIG. 2A is a side, cross-sectional view of an example die 200-1, in accordance with various embodiments. In at least one embodiment, example die 200-1 may be die 102 of the embodiment of FIG. 1. As illustrated in FIG. 2A, the die 200-1 may include a die substrate 202, one or more device layers 204, and a metallization stack 206. The metallization stack 206 may be between conductive contacts 222 and the device layer 204, and the device layer 204 may be between the die substrate 202 and the metallization stack 206. Conductive pathways through the metallization stack 206 (e.g., formed of conductive lines and/or vias) may conductively couple devices (e.g., transistors) in the device layer 204 and the conductive contacts 222. Although the die 200-1 of FIG. 2A is discussed with reference to die 102 of the embodiment of FIG. 1, the structure of the die 200-1 represented in FIG. 2A may be the structure of any suitable ones of the single-sided dies disclosed herein.

FIG. 2B is a side, cross-sectional view of an example die 200-2, in accordance with various embodiments. In some embodiments, the example die 200-2 may be any of the double-sided dies 130 of the embodiment of FIG. 1. As illustrated in FIG. 2B, the die 200-2 may include a die substrate 202, one or more device layers 204, and a metallization stack 206. The metallization stack 206 may be between conductive contacts 222 and the device layer 204, the device layer 204 may be between the die substrate 202 and the metallization stack 206, and the die substrate 202 may be between the device layer 204 and the conductive contacts 224. One or more TSVs 223 may extend through the die substrate 202. Conductive pathways through the metallization stack 206 (e.g., formed of conductive lines and/or vias) may conductively couple devices (e.g., transistors) in the device layer 204 and the conductive contacts 222, while the TSVs 223 may conductively couple devices in the device layer 204 and the conductive contacts 224. Although the die 200-2 of FIG. 2B is discussed with reference to the double-sided dies 130 of the embodiment of FIG. 1, the structure of the die 200-2 represented in FIG. 2B may be the structure of any suitable ones of the double-sided dies disclosed herein.

Figure 2C:
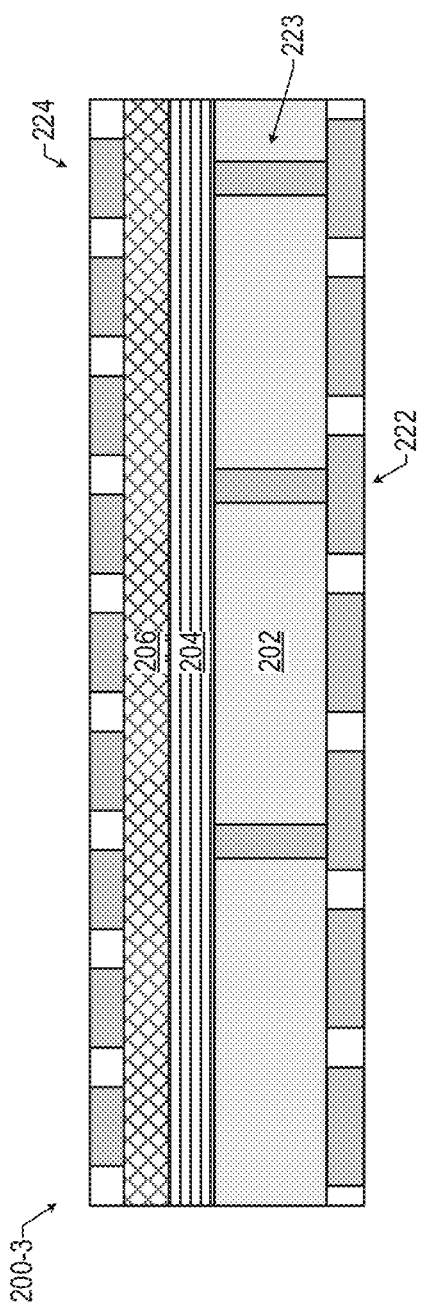

FIG. 2C is a side, cross-sectional view of an example die 200-3, in accordance with various embodiments. In some embodiments, the example die 200-3 may be any of the double-sided dies 130 of the embodiment of FIG. 1. As illustrated in FIG. 2C, the die 200-3 may include a die substrate 202, one or more device layers 204, and a metallization stack 206. The metallization stack 206 may be between the conductive contacts 224 and the device layer 204, the device layer 204 may be between the die substrate 202 and the metallization stack 206, and the die substrate 202 may be between the device layer 204 and the conductive contacts 222. One or more TSVs 223 may extend through the die substrate 202. Conductive pathways through the metallization stack 206 may conductively couple devices in the device layer 204 and the conductive contacts 224, while the TSVs 223 may conductively couple devices in the device layer 204 and the conductive contacts 222. Although the die 200-2 of FIG. 2B is discussed with reference to the double-sided dies 130 of the embodiment of FIG. 1, the structure of the die 200-2 represented in FIG. 2B may be the structure of any suitable ones of the double-sided dies disclosed herein.

Figure 2D:
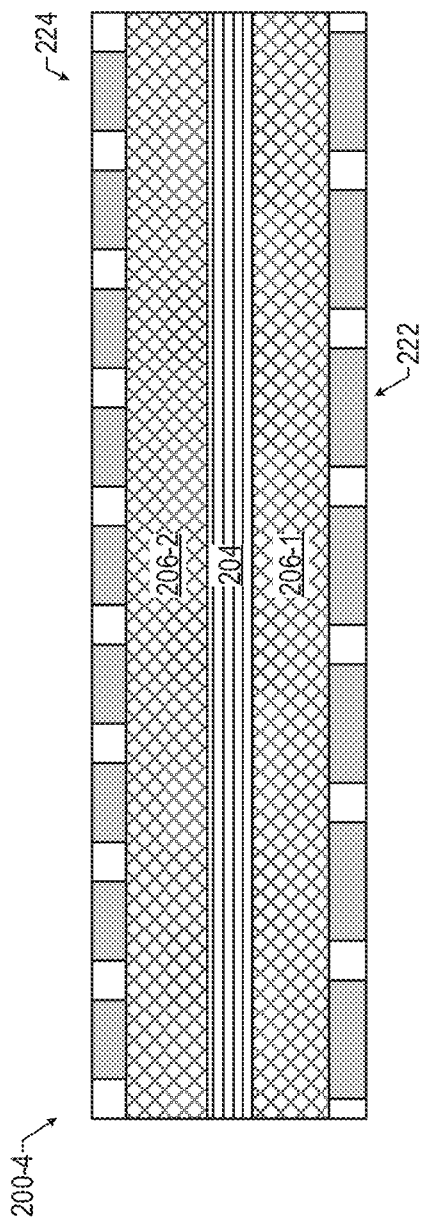

FIG. 2D is a side, cross-sectional view of an example die 200-4, in accordance with various embodiments. In some embodiments, the example die 200-4 may be any of the double-sided dies 130 of the embodiment of FIG. 1. As illustrated in FIG. 2D, the die 200-4 may include a first metallization stack 206-1, one or more device layers 204, and a second metallization stack 206-2. The first metallization stack 206-1 may be between the conductive contacts 222 and the device layer 204, the device layer 204 may be between the first metallization stack 206-1 and the second metallization stack 204-2, and the second metallization stack 206-2 may be between the device layer 204 and the conductive contacts 224. Conductive pathways through the first metallization stack 206-1 may conductively couple devices in the device layer 204 and the conductive contacts 222, while the conductive pathways through the second metallization stack 206-2 may conductively couple devices in the device layer 204 and the conductive contacts 224. In the embodiment of FIG. 2D, the device layer 204 may first be fabricated on a die substrate 202 (e.g., as discussed below for FIG. 17), one metallization stack 206 may be formed on the device layer 204 (e.g., as discussed below for FIG. 17), then the bulk of the die substrate 202 may be removed and the second metallization stack 206-2 formed on the other side of the device layer 204.

The dies discussed herein may have structures other than those depicted in FIGS. 2A-2D. For example, in some embodiments, a double-sided die 130 may have a structure similar to that depicted in FIG. 2D, and further including a die substrate (and TSVs therein) between the first metallization stack and the conductive contacts.

Other advantages of the microelectronic assembly 100 and/or other microelectronic assemblies disclosed herein may be realized through integrating double-sided dies into microelectronic assemblies. For example, transistor density may be reduced for dies having TSVs because there are "restricted zones" in the device layers that surround TSVs in which transistors cannot be placed. Whereas for dies having no TSVs conductive pathways through metallization stacks can "land" on different layers within the device layers of a die without effecting transistor density of the device layer of the die. Thus, embodiments of microelectronic assembly 100 and/or other microelectronic assemblies disclosed herein may facilitate new 3D monolithic integration approaches that may provide more freedom for integrating mixed nodes and/or heterogeneous technologies having less perforation of device layers.

Figure 3:
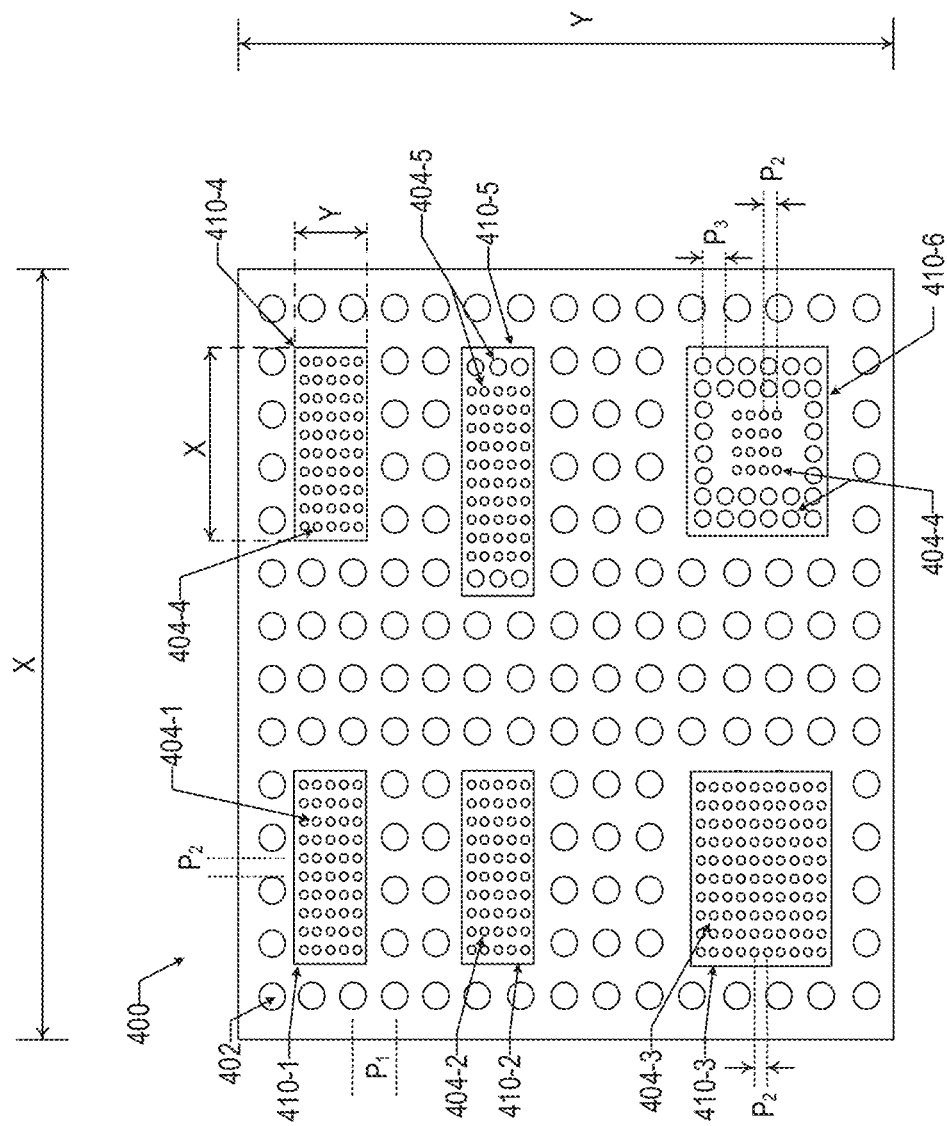
FIG. 3 is a bottom view of an example die that may be included in a microelectronic assembly, in accordance with various embodiments.

Referring to FIG. 3, FIG. 3 is a bottom view of an example die 400 that may be included in microelectronic assemblies discussed herein, in accordance with various embodiments. For the embodiment of FIG. 3, die 400 may be a larger, base die to which a number of smaller dies (not shown) may be coupled. Die 400 may include a number of "landing zones" 410 that include DTD conductive contacts 404 arranged in a particular footprint (e.g., a pattern or arrangement of conductive contacts) that facilitates coupling smaller dies to the base die 400 at the landing zones 410. Although the embodiment of FIG. 3 illustrates six (6) landing zones 410-1/410-2/410-3/410-4/410-5/410-6 to accommodate coupling six dies to die 400, it is to be understood that any number of one or more dies may be coupled to a base die according to embodiments disclosed herein depending on size, design, implementation, thermal, and/or any other relevant considerations.

As illustrated in the embodiment of FIG. 3, die 400 can include "coarser" pitch conductive contacts 402 having a pitch $P_1$ to interconnect die 400 to a package substrate (e.g., package substrate 160 of FIG. 1). Die 400 can further include "finer" pitch conductive contacts 404 to interconnect smaller dies (not shown) to die 400 at landing zones 410. For example, a first landing zone 410-1 may include first conductive contacts arranged in a particular footprint having a pitch $P_2$, which may be a finer pitch than pitch $P_1$. A second landing zone 410-2 may include second conductive contacts 404-2 arranged in a particular footprint. A third landing zone 410-3 may include third conductive contacts 404-3 arranged in a particular footprint. A fourth landing zone 410-4 may include fourth conductive contacts 404-4 arranged in a particular footprint. A fifth landing zone 410-5 may include fifth conductive contacts 404-5. A sixth landing zone 410-6 may include sixth conductive contacts 404-6 arranged in a particular footprint. The sixth landing zone 410-6 may include mixed pitch conductive contacts having pitches $P_2$ and $P_3$, which may be different pitches. The fifth landing zone 410-5 may also include mixed pitch conductive contacts having a different footprint than the footprint of the sixth landing zone.

In some instances, a landing zone can correspond to the X-Y dimensions of a particular die. For example, fourth landing zone 410-4 may have X-Y dimensions corresponding to the X-Y dimensions of the particular die to be coupled to die 400 at the fourth conductive contacts 404-4. As illustrated for the embodiment of FIG. 3, die 400 may have an X-Y area that is larger than the X-Y area of individual ones of dies to be coupled at the landing zones 410.

Any suitable techniques may be used to manufacture the microelectronic assemblies disclosed herein. For example, FIGS. 4A-4E are side, cross-sectional views of various stages in an example process for manufacturing the microelectronic assembly of FIG. 1, in accordance with various embodiments. Although the operations discussed below with regard to FIGS. 4A-4E (and others of the accompanying drawings representing manufacturing processes) are illustrated in a particular order, these operations may be performed in any suitable order. Additionally, although particular assemblies are illustrated in FIGS. 4A-4E (and others of the accompanying drawings representing manufacturing processes), the operations discussed below with reference to FIGS. 4A-4E may be used to form any suitable assemblies. In some embodiments, microelectronic assemblies manufactured in accordance with the process of FIGS. 4A-4E may have DTD interconnects 140 that may be non-solder interconnects (e.g., metal-to-metal interconnects or anisotropic conductive material interconnects). In the embodiment of FIGS. 4A-4E dies 102/130 may first be assembled into a "composite die," and then the composite die may be coupled to the package substrate 160. In general, a composite die may refer to a semiconductor structure in which multiple dies may be coupled together and assembled such that the assembly can be treated as a single die. In particular, the assembly may have a planar surface with conductive contacts for first-level interconnects. This approach may allow for tighter tolerances in the formation of DTD interconnects 140, and may be particularly desirable for integrating relatively small dies into a composite die assembly.

Figure 4A:
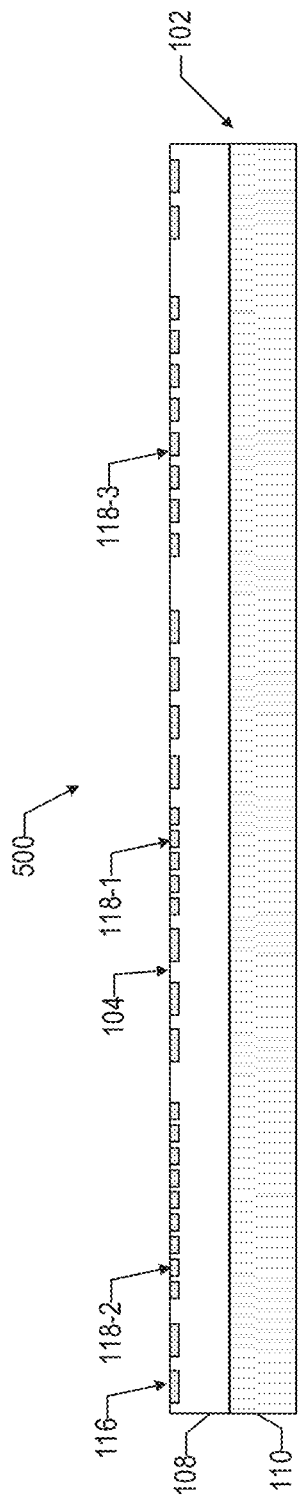

FIG. 4A illustrates an assembly 500 including the die 102. The die 102 is "upside down" in the sense that conductive contacts 116 and 118 at the first face 104 of die 102 are facing up. In some embodiments, the die 102 in the assembly 500 may be included in a wafer (not shown) that includes multiple copies of the die 102, while in other embodiments, the die 102 may be singulated from other dies 102 before inclusion in the assembly 500.

Figure 4B:
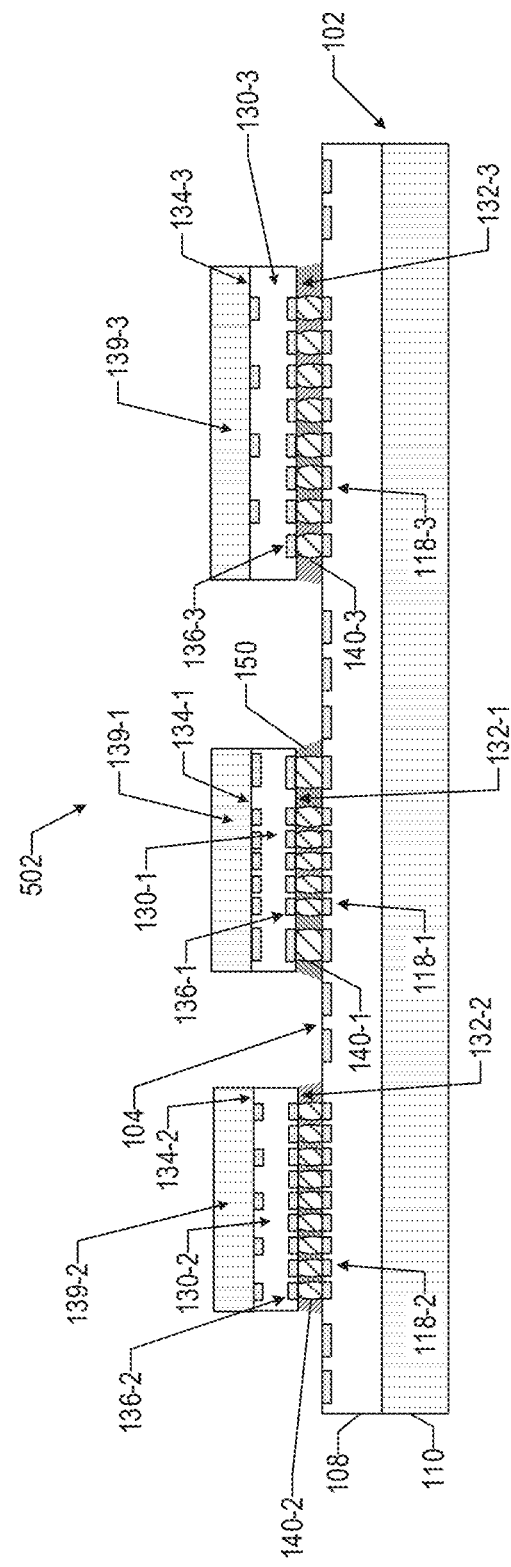

FIG. 4B illustrates an assembly 502 subsequent to coupling dies 130-1, 130-2, and 130-3 to die 102. In particular for the assembly 502, conductive contacts 136-1 at the first face 132-1 of die 130-1 may be coupled to conductive contacts 118-1 at the first face 104 of die 102 (e.g., via DTD interconnects 140-1). Conductive contacts 136-2 at the first face 132-2 of die 130-2 may be coupled to conductive contacts 118-2 at the first face 104 of die 102 (e.g., via DTD interconnects 140-2). Conductive contacts 136-3 at the first face 132-3 of die 130-3 may be coupled to conductive contacts 118-1 at the first face 104 of die 102 (e.g., via DTD interconnects 140-3). Any suitable technique may be used to form the DTD interconnects 140 of the assembly 502, such as metal-to-metal attachment techniques, solder techniques, or anisotropic conductive material techniques. In some embodiments, DTD interconnects 140 may be formed using die-to-die or die-to-wafer bonding techniques. For example, when the assembly 500 includes a wafer of multiple ones of the dies 102, the dies 130 may be attached to the die 102 using one or more die-to-wafer bonding operations. In still some embodiments, dies 130-1/130-2/130-3 may be redistributed on a carrier using an adhesive and DTD interconnects 140 may be formed using wafer-to-wafer bonding techniques. Individual ones of dies 130 may include a die substrate 139 extending from the second face 134 of the dies 130. The die substrate 139-1/139-2/139-3 may range in thickness from 10 microns to 780 microns. Underfill material 150 may be applied between individual ones of dies 130-1/130-2/130-3 and die 102 using any suitable technique.

FIG. 4C illustrates an assembly 504 subsequent to removing the die substrates 139 from individual ones of dies 130. Any suitable technique may be used to remove the die substrates including, but not limited to, chemical mechanical polishing (CMP), grinding, etching, debonding, or peeling, among others.

Figure 4D:
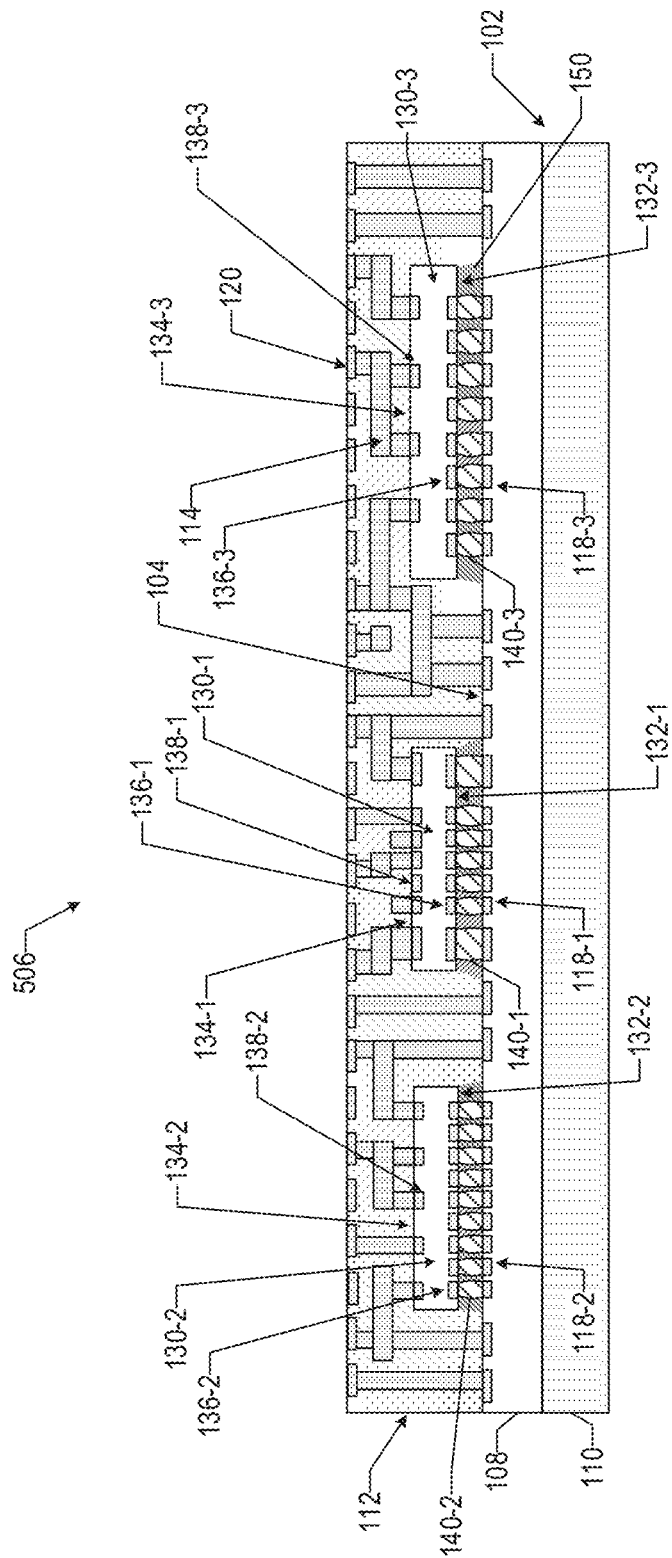

FIG. 4D illustrates an assembly 506 subsequent to forming the redistribution layer 112 including interconnect structures 114 extending between the conductive contacts 116 at the first face 104 of die 102 and the conductive contacts 120 of the redistribution layer 112 and extending between conductive contacts 138 at the second face 134 of individual ones of dies 130 and the conductive contacts 120 of the redistribution layer 112. Any suitable technique may be used to form the redistribution layer 112 including, but not limited to building up interconnect structures 114 by laminating or spinning on a dielectric material, and creating conductive vias and lines by laser drilling, lithography, and plating to provide DTD interconnects, fan-in interconnects, and/or fan-out interconnects among dies 102/130 and/or between dies 102/130 and conductive contacts 120 of the redistribution layer. In some embodiments, the assembly 506 may be referred to as a composite die.

FIG. 4E illustrates an assembly 508 subsequent to "flipping" the assembly 506 of FIG. 4D and coupling the assembly to the package substrate 160 using the first-level interconnects 142. The first-level interconnects may take any of the forms disclosed herein (e.g., solder interconnects or anisotropic conductive material interconnects), and any suitable techniques may be used to form the first-level interconnects (e.g., a mass reflow process or a thermal compression bonding process). The assembly 508 may take the form the microelectronic assembly 100 of FIG. 1.

Figure 5:
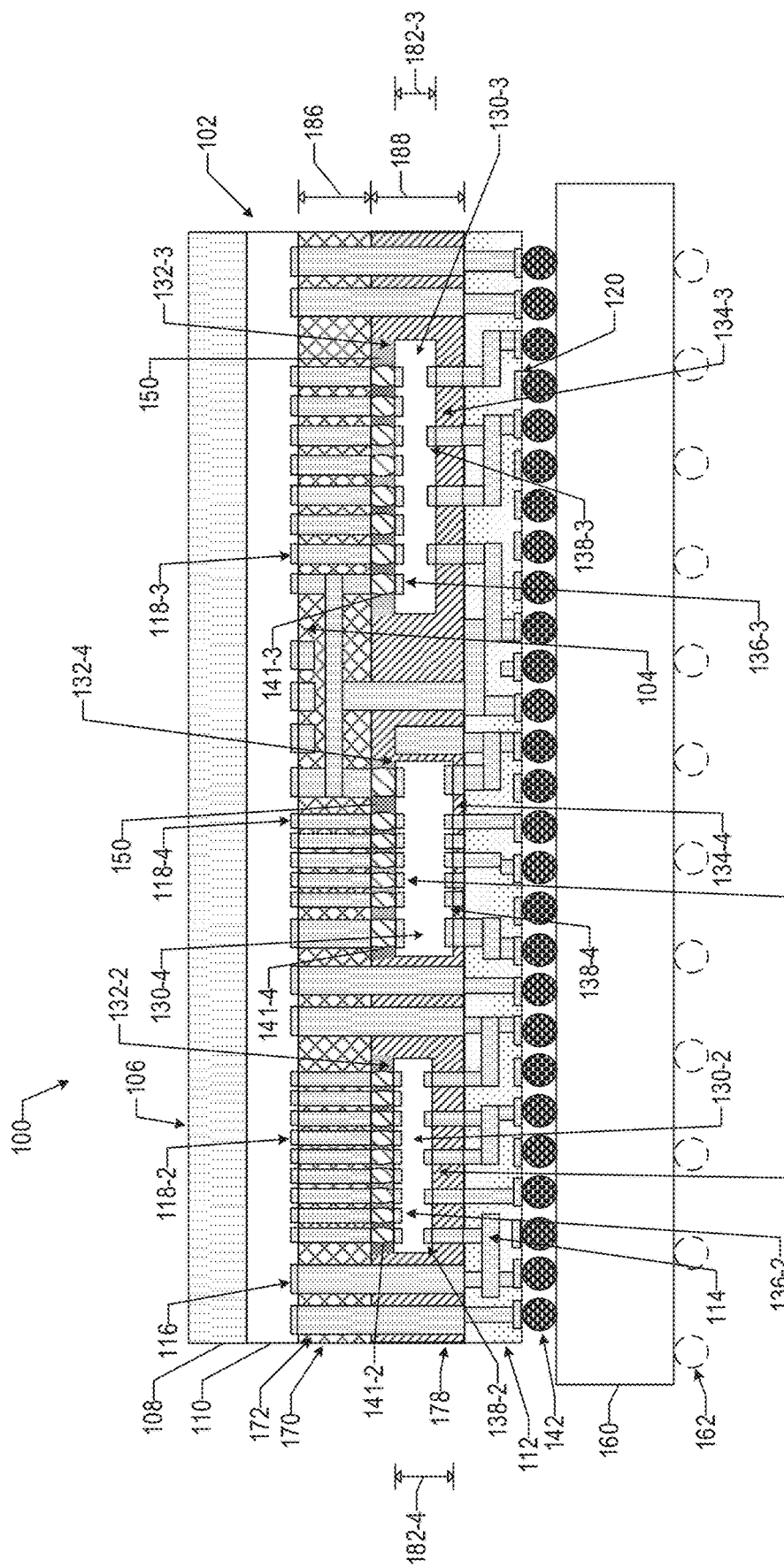
FIG. 5 is a side, cross-sectional view of another example microelectronic assembly, in accordance with various embodiments.

As noted above, double-sided dies 130 coupled to die 102 for the microelectronic assembly 100 may have different thicknesses. FIG. 6 is a side, cross-sectional view of a microelectronic assembly 100 sharing a number of elements with FIG. 1 but including a first insulating layer 170, a second insulating layer 178, and a double-sided die 130-4. In various embodiments, interconnect structures 172 may be included in the first insulating layer 170 and the second insulating layer 178 to provide electrical interconnections among the dies 102/130, between the dies 102/130 and the RDL 112, or any combination thereof similar to interconnect structures 114 of the RDL 112. For example, interconnect structures 172 may be formed vertically or laterally (e.g., formed as conductive lines or vias). In some embodiments, interconnect structures 172 may be included in the first insulating layer 170 to electrically interconnect sets of conductive contacts 118 at the first face 104 of die 102 and sets of conductive contacts 136 at the first face 132 of individual ones of double-sided dies 130 (e.g., via interconnects 141). In some embodiments, interconnect structures 172 may be included in the first insulating layer to interconnect various ones of double-sided dies 130 (e.g., to interconnect double-sided dies 130-4 and 130-3, as shown in the embodiment of FIG. 5). Interconnect structures 172 may also be included in the second insulating layer 178 to provide electrical interconnections horizontally or vertically as discussed herein.

For the embodiment of FIG. 5, double-sided die 130-4 may have a thickness 182-4 that is different than the thickness 182-3 of double-sided die 130-3. The second insulating layer 178 may be formed to a thickness 188 to account for topology differences (e.g., different distances of the second face 134 of each die 130 from the first insulating layer 170 due to die thickness differences) among individual ones of double-sided dies 130 coupled to the die 102 via the first insulating layer 170.

In various embodiments, the first insulating layer 170 and the second insulating layer 178 may be composed of dielectric materials, mold materials, epoxy materials (e.g., glass reinforced epoxy matrix materials, epoxy build-up films, or the like), polyimide materials, or oxide-based materials (e.g., silicon dioxide or spin on oxide). In various embodiments, the first insulating layer 170 may range in thickness 186 from 1 micron to 40 microns. In some embodiments, finer pitch conductive contacts may be associated with thinner insulating layers being formed for a microelectronic assembly while coarser pitch conductive contacts may be associated with thicker insulating layers being formed for a microelectronic assembly 100. The thickness 188 of the second insulating layer 178 may vary depending on the thickness of dies 130 included in the microelectronic assembly. At a minimum, the thickness 188 of the second insulating layer 178 may be at least as thick as the distance from the surface of the first insulating layer for the thickest double-sided die 130 plus its interconnect distance that may be coupled to the first insulating layer 170.

Any suitable techniques may be used to manufacture the microelectronic assembly 100 of FIG. 5. For example, FIGS. 6A-6G are side, cross-sectional views of various stages in an example process for manufacturing the microelectronic assembly 100 of FIG. 5, in accordance with various embodiments.

FIG. 6A illustrates an assembly 700 including the die 102. The die 102 is "upside down" in the sense that conductive contacts 116 and 118 at the first face 104 of die 102 are facing up. In some embodiments, die 102 may be an individual one of multiple dies of a wafer. The wafer may be composed of a semiconductor material of which die substrate 108 is composed and on which circuitry 110 may be formed.

Figure 6B:
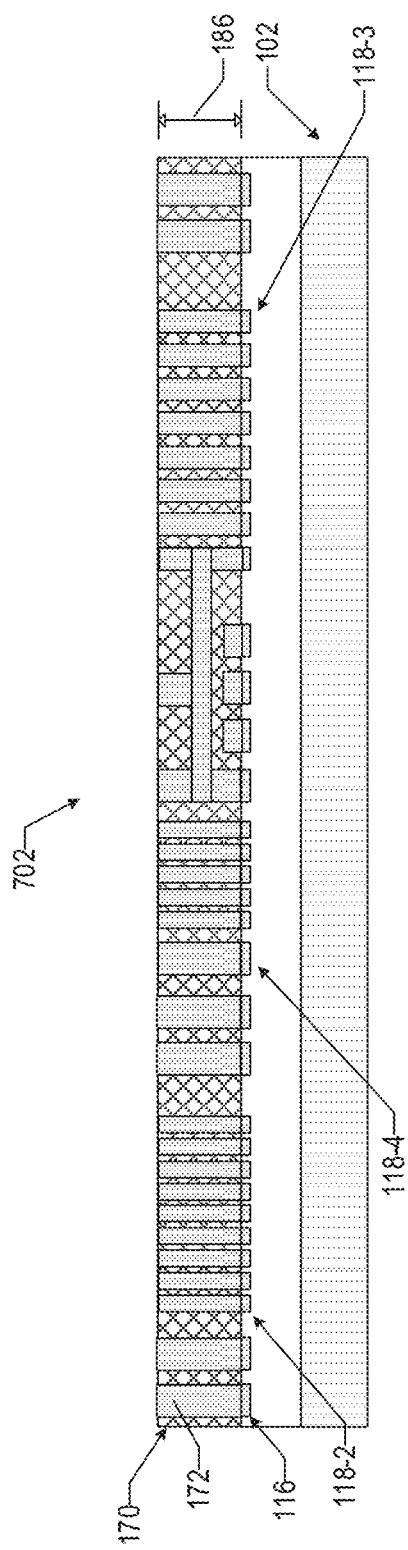

FIG. 6B illustrates an assembly 702 subsequent to forming the first insulating layer 170 including interconnect structures 172 on the first face 104 of the die 102. The interconnect structures 172 may take the form of any of the embodiments disclosed herein, and may be formed using any suitable technique. The first insulating layer 170 may take the form of any of the embodiments disclosed herein, and may be formed using any suitable technique.

Figure 6C:
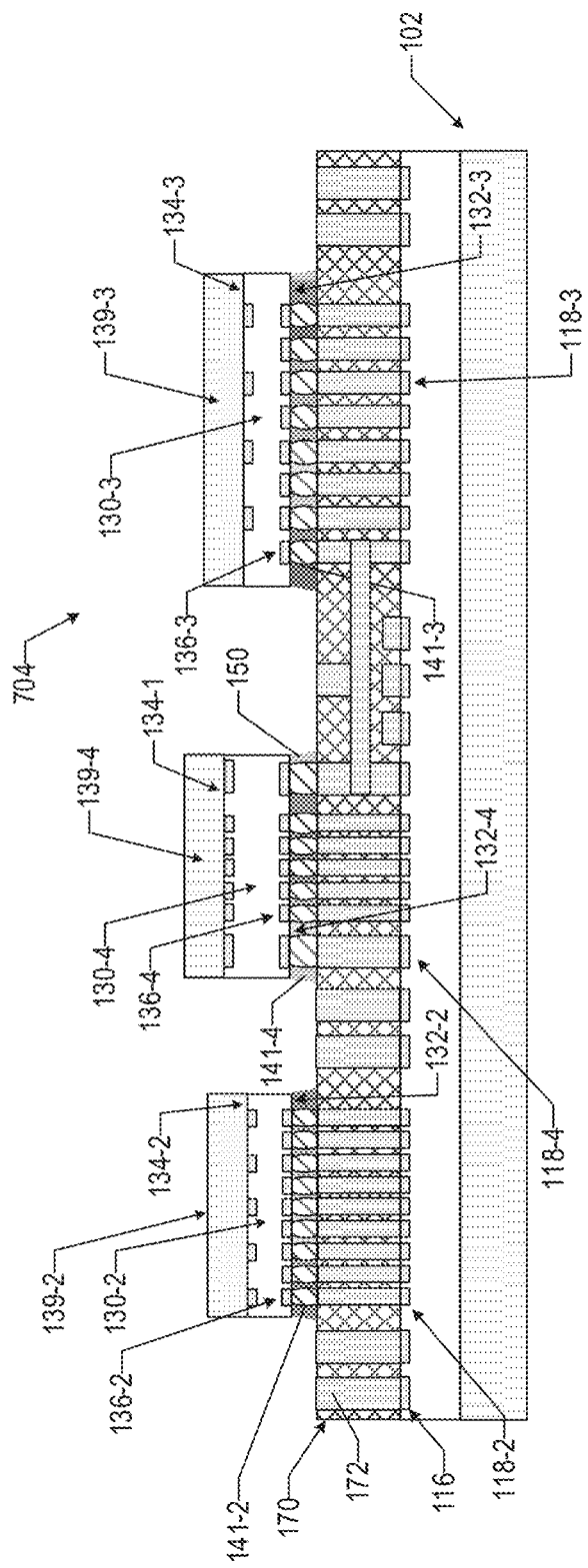

FIG. 6C illustrates an assembly 704 subsequent to coupling dies 130-2, 130-3, and 130-4 to die 102. In particular for the assembly 704, conductive contacts 136-4 at the first face 132-4 of the die 130-4 may be coupled to corresponding interconnect structures 172 of the first insulating layer 170 (e.g., via interconnects 141-4). Conductive contacts 136-2 at the first face 132-2 of the die 130-2 may be coupled to corresponding interconnect structures 172 of the first insulating layer 170 (e.g., via interconnects 141-2). Conductive contacts 136-3 at the first face 132-3 of the die 130-3 may be coupled to corresponding interconnect structures 172 of the first insulating layer 170 (e.g., via DTD interconnects 141-3). Any suitable technique as discussed herein may be used to form the interconnects 141 of the assembly 704, such as metal-to-metal attachment techniques, solder techniques, or anisotropic conductive material techniques. Underfill material 150 may be applied between individual ones of dies 130-2/130-3/130-4 and the first insulating layer 170 using any suitable technique.

Figure 6D:
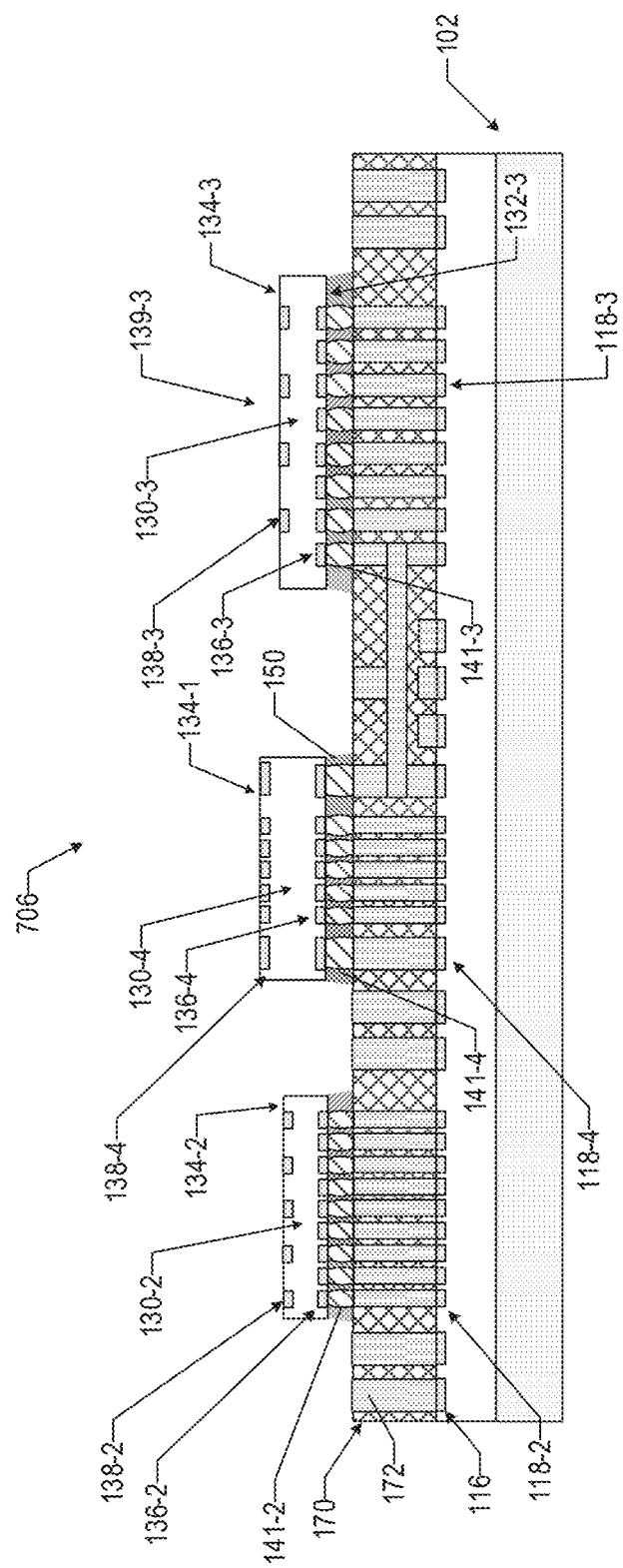

FIG. 6D illustrates an assembly 706 subsequent to removing the die substrates 139 from individual ones of dies 130. Any suitable technique may be used to remove the die substrates as disclosed herein. Depending on the size of the dies and the manufacturing equipment, thin dies 130 may be placed directly on the substrates without the need for the carrier die/substrate.

Figure 6E:
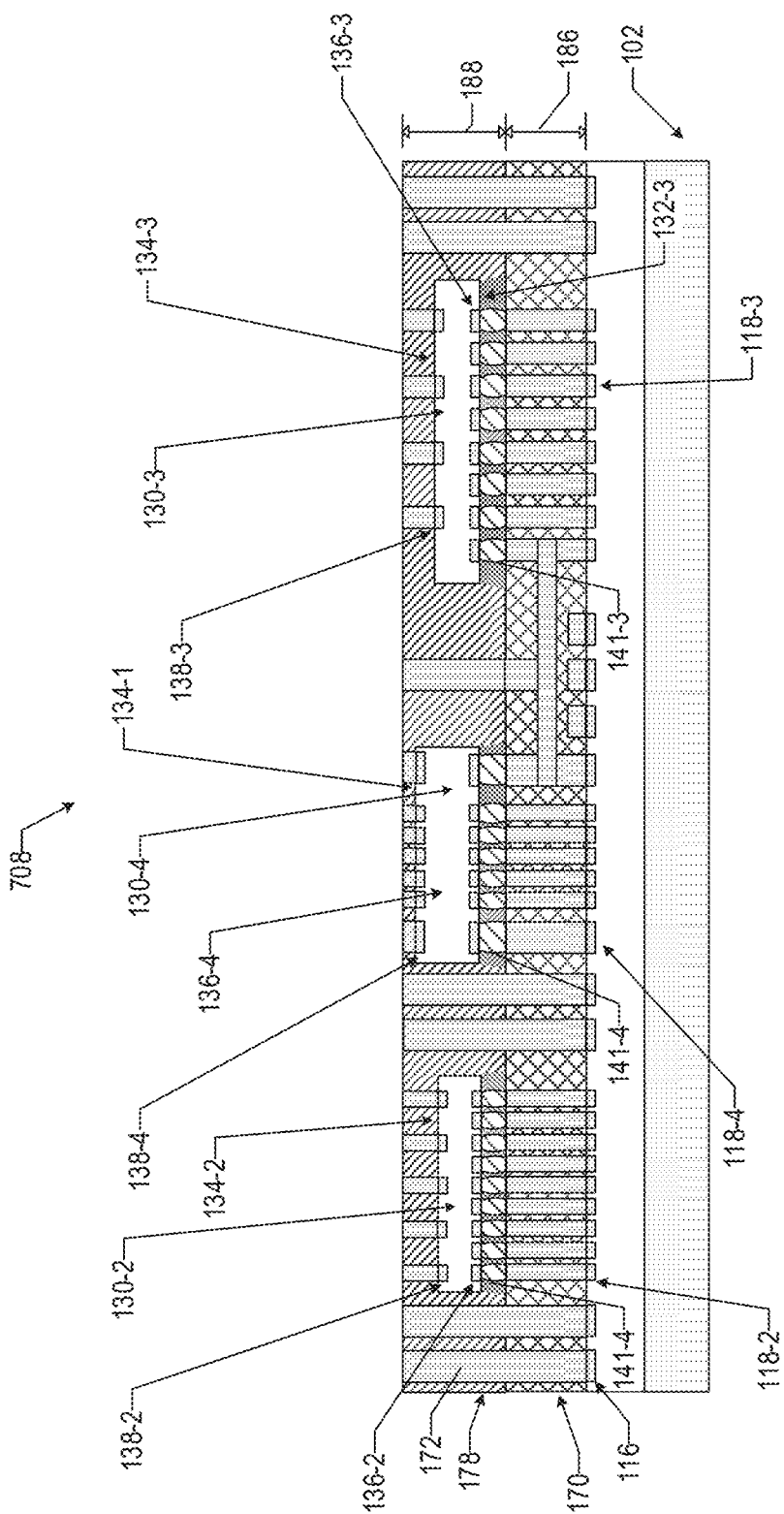

FIG. 6E illustrates an assembly 708 subsequent to forming the second insulating layer 178 including interconnect structures 172 over the first insulating layer 170 and over double-sided dies 130. The second insulating layer 178 may take the form of any of the embodiments disclosed herein, and may be formed using any suitable technique. For example, in some embodiments, the interconnect structures 172 may be encapsulated in insulating material by laminating or spinning on the insulating material and an optional planarizing process may be performed on the insulating (e.g., if needed to reduce the height of the second insulating layer 178 to be equal to the desired thickness 188 of the second insulating layer 178).

Figure 6F:
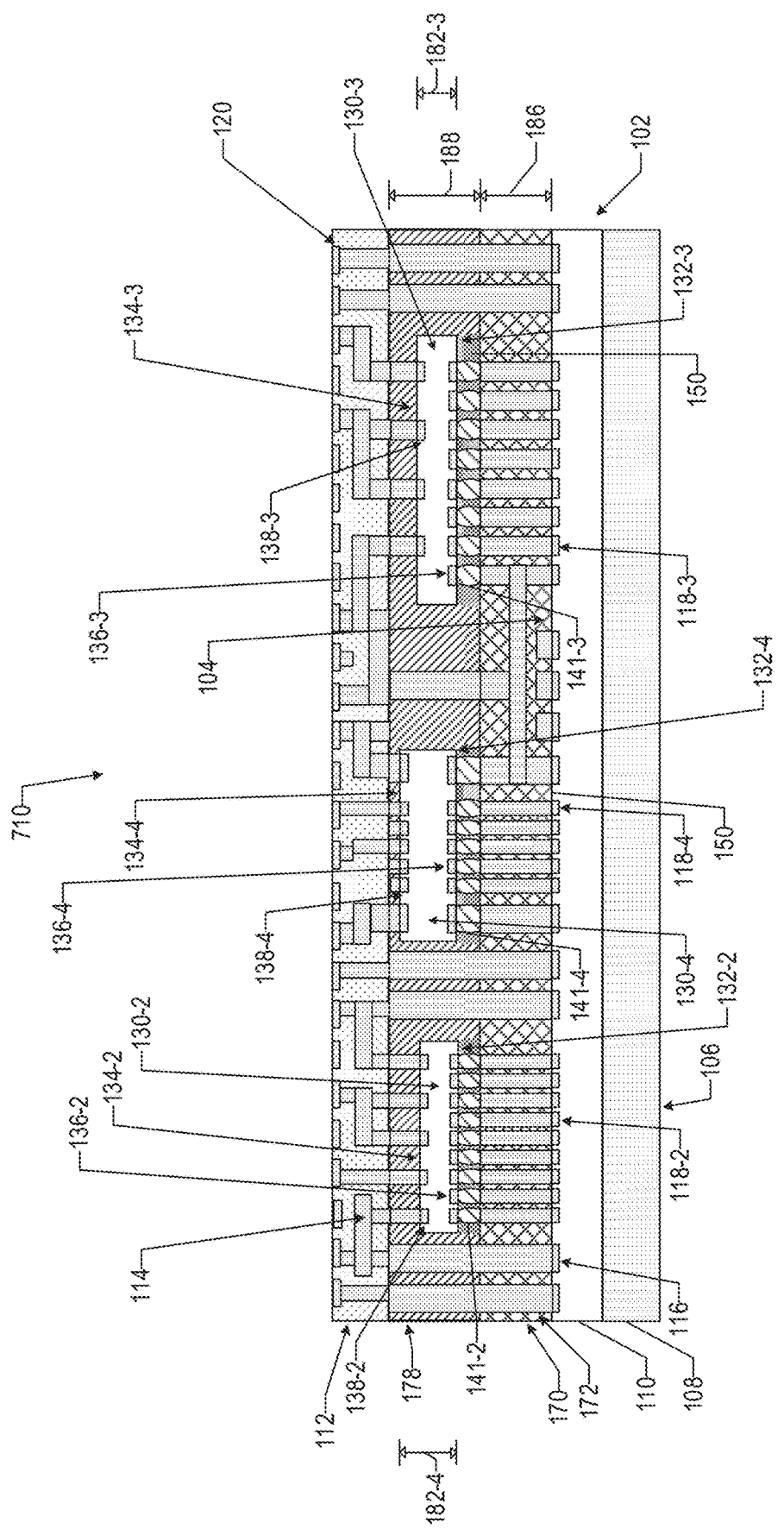

FIG. 6F illustrates an assembly 710 subsequent to forming the redistribution layer 112 including interconnect structures 114 and conductive contacts 120 on the interconnect structures 172 of the second insulating layer 178. Any suitable technique may be used to form the redistribution layer 112 as discussed herein.

Figure 6G:
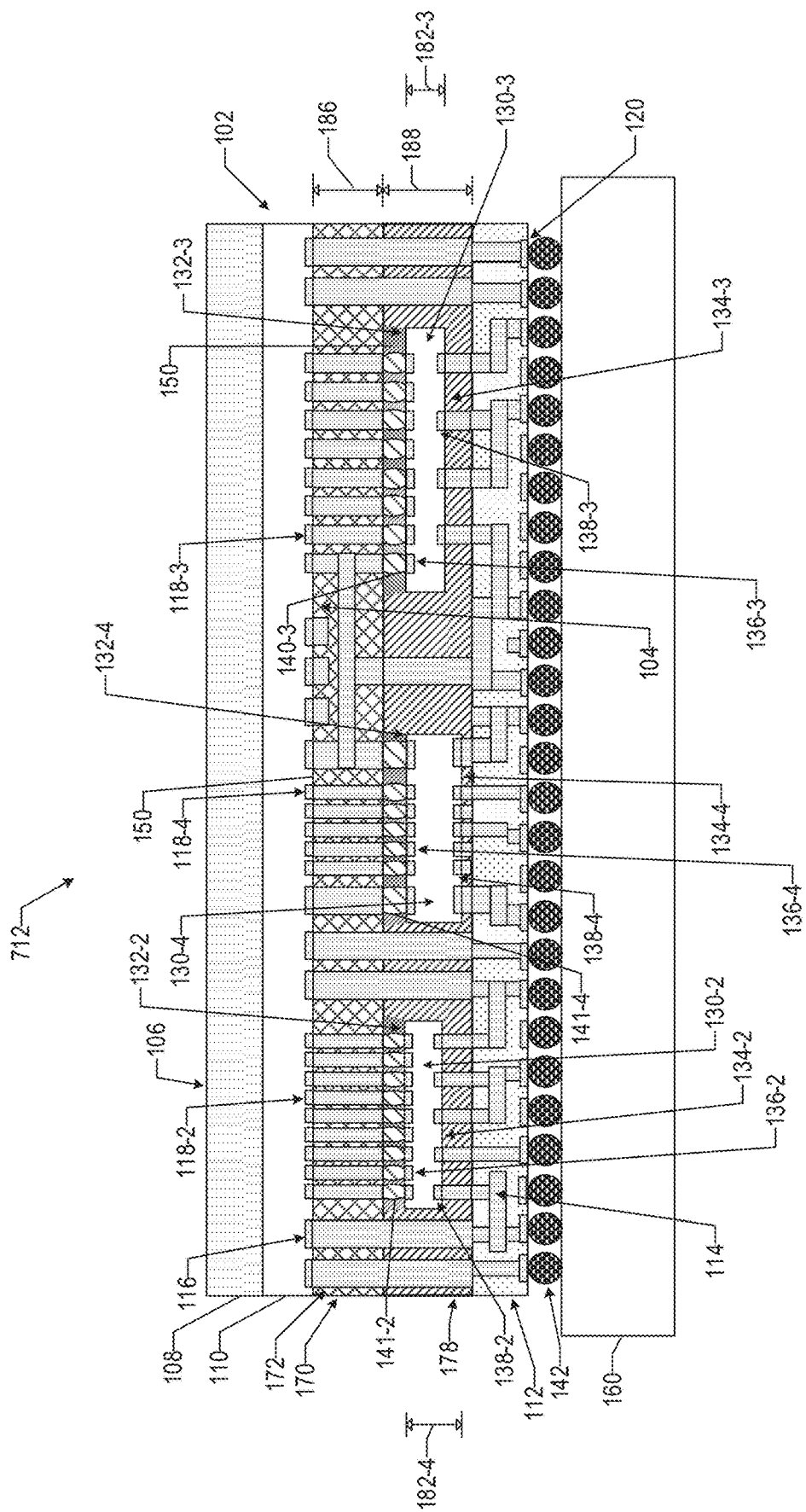

FIG. 6G illustrates an assembly 712 subsequent to "flipping" the assembly 710 of FIG. 6F and coupling the assembly to the package substrate 160 using first-level interconnects 142. The first-level interconnects may take any of the forms disclosed herein (e.g., solder interconnects or anisotropic conductive material interconnects), and any suitable techniques may be used to form the first-level interconnects (e.g., a mass reflow process or a thermal compression bonding process). The assembly 712 may take the form of the microelectronic assembly 100 of FIG. 5.

Figure 7:
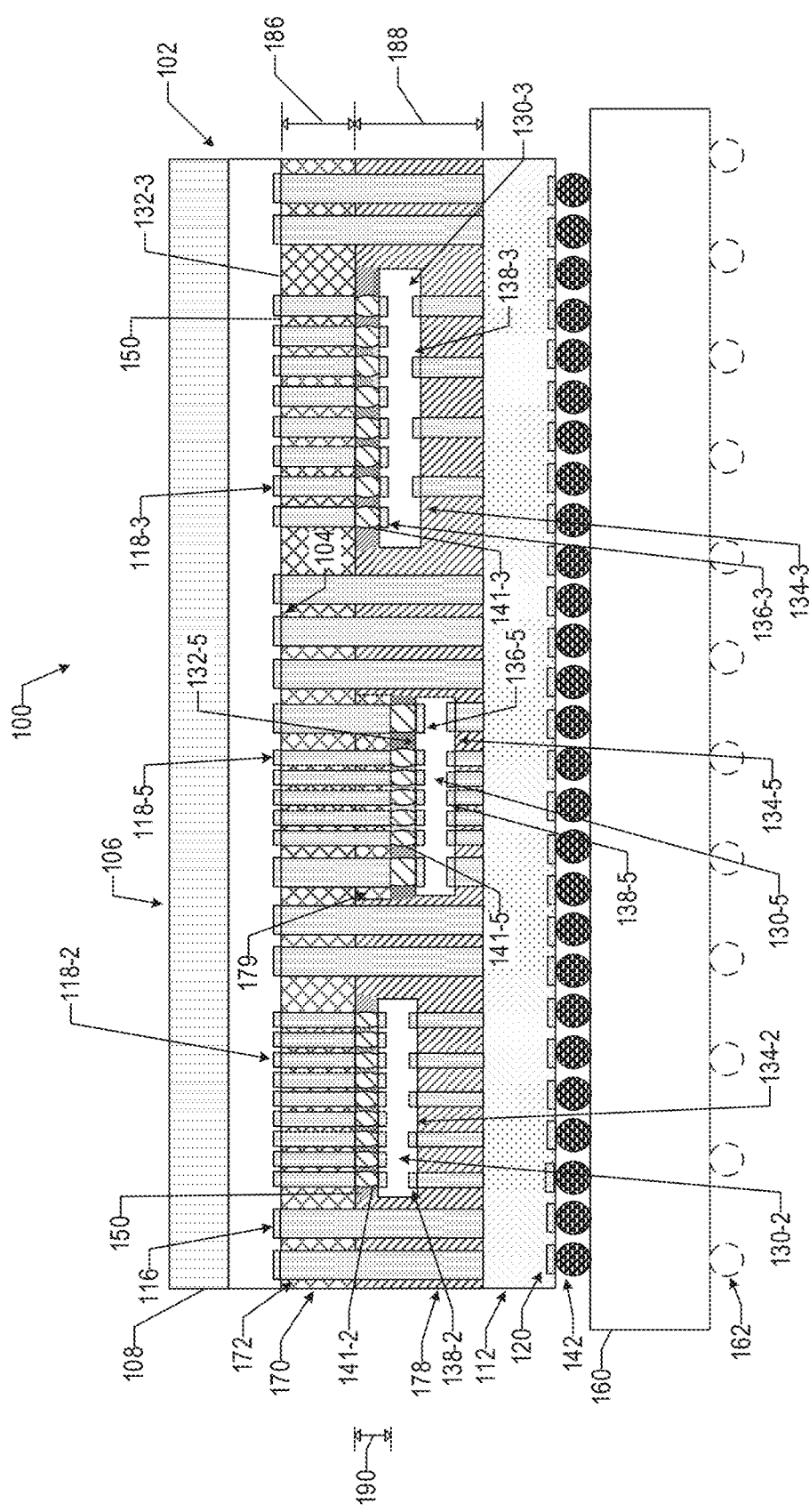
FIG. 7 is a side, cross-sectional view of another example microelectronic assembly, in accordance with various embodiments.

Beyond integrating double-sided dies of different thicknesses into the microelectronic assembly, double-sided dies 130 may be integrated into the assembly on different planes or thicknesses of insulating material. FIG. 7 is a side, cross-sectional view of a microelectronic assembly 100 sharing a number of elements with FIGS. 1 and 5 but further including a third insulating layer 179 between the first insulating layer 170 and the second insulating layer 178 and a double-sided die 130-5 electrically interconnected to the die 102. In various embodiments, interconnect structures 172 may be included in the third insulating layer 179 to provide electrical interconnections as discussed herein (e.g., to electrically interconnect the set of conductive contacts 118-5 at the first face 104 of die 102 and to the set of conductive contacts 136-5 at the first face 132-5 of double-sided die 130-5 via interconnects 141-5). The third insulating layer 179 may have a thickness 190, which may range between 1 micron and 40 microns. Thus, dies 130 can be electrically coupled to die 102 and/or to each other on two distinct planes for the embodiment of FIG. 7. Any suitable techniques may be used to manufacture the microelectronic assembly 100 of FIG. 7 in which another insulating layer (e.g., third insulating layer 179) and any combination of vertical and/or lateral interconnect structures 172 may be formed therein to provide electrical interconnections as discussed herein.

The microelectronic assemblies disclosed herein may be used for any suitable application. For example, in some embodiments, a microelectronic assembly 100 and/or 1000 (as discussed below) may be used to provide an ultra-high density and high bandwidth interconnect for field programmable gate array (FPGA) transceivers and III-V amplifiers. Such applications may be particularly suitable for military electronics, 5G wireless communications, WiGig communications, and/or millimeter wave communications.

More generally, the microelectronic assemblies disclosed herein may allow "blocks", sometimes referred to as Intellectual Property blocks "IP blocks," of different kinds of functional circuits to be distributed into different ones of the dies discussed herein, instead of having all of the circuits included in a single large die, per some conventional approaches. In some such conventional approaches, a single large die would include all of these different circuits to achieve high bandwidth, low loss communication between the circuits, and some or all of these circuits may be selectively disabled to adjust the capabilities of the large die. However, because the DTD interconnects of the microelectronic assemblies discussed herein may allow high bandwidth, low loss communication between different ones of the dies discussed herein, different circuits may be distributed into different dies, reducing the total cost of manufacture, improving yield, and increasing design flexibility by allowing different dies (e.g., dies formed using different fabrication technologies) to be readily swapped to achieve different functionality.

In another example, the die 102 in a microelectronic assembly 100 may be a processing device (e.g., a central processing unit, a graphics processing unit, a FPGA, a modem, an applications processor, etc.), and the die 130-1 may include high bandwidth memory, transceiver circuitry, and/or input/output circuitry (e.g., Double Data Rate transfer circuitry, Peripheral Component Interconnect Express circuitry, etc.). In another example, the die 102 in a microelectronic assembly 100 may be a cache memory (e.g., a third level cache memory), and one or more dies 130 may be processing devices (e.g., a central processing unit, a graphics processing unit, a FPGA, a modem, an applications processor, etc.) that share the cache memory of the die 102.

In another example, a microelectronic assembly may include image sensor devices (e.g., front-side illuminated (FSI) image sensors and/or backside illuminated (BSI) image sensors including pixels, sensor circuitry, memory, etc.) for image sensor applications such as still and/or live digital image and/or video cameras, or the like that may be integrated into cell phones, wearables, drones, etc. to capture images for storage, processing, or the like. Digital image and/or video cameras can include millions of pixels, such as 12 megapixels (MP) or more, which can generate large amounts of raw image data during operation. Raw image data is typically stored in memory and may then be compressed (e.g., reduced in size) for processing and/or other applications. Transferring large amounts of raw image data from an image sensor to memory, compression processors, and/or other processing and/or application devices may be impacted by power constraints and/or parasitics (e.g., interconnect parasitics) among devices of a camera system. In some embodiments, microelectronic assemblies as discussed herein may provide for reducing power consumption and/or parasitics for electronic devices including image sensors. Further, in some embodiments, microelectronic assemblies as discussed herein may provide for control of individual ones of pixels for an image sensor.

Figure 8:
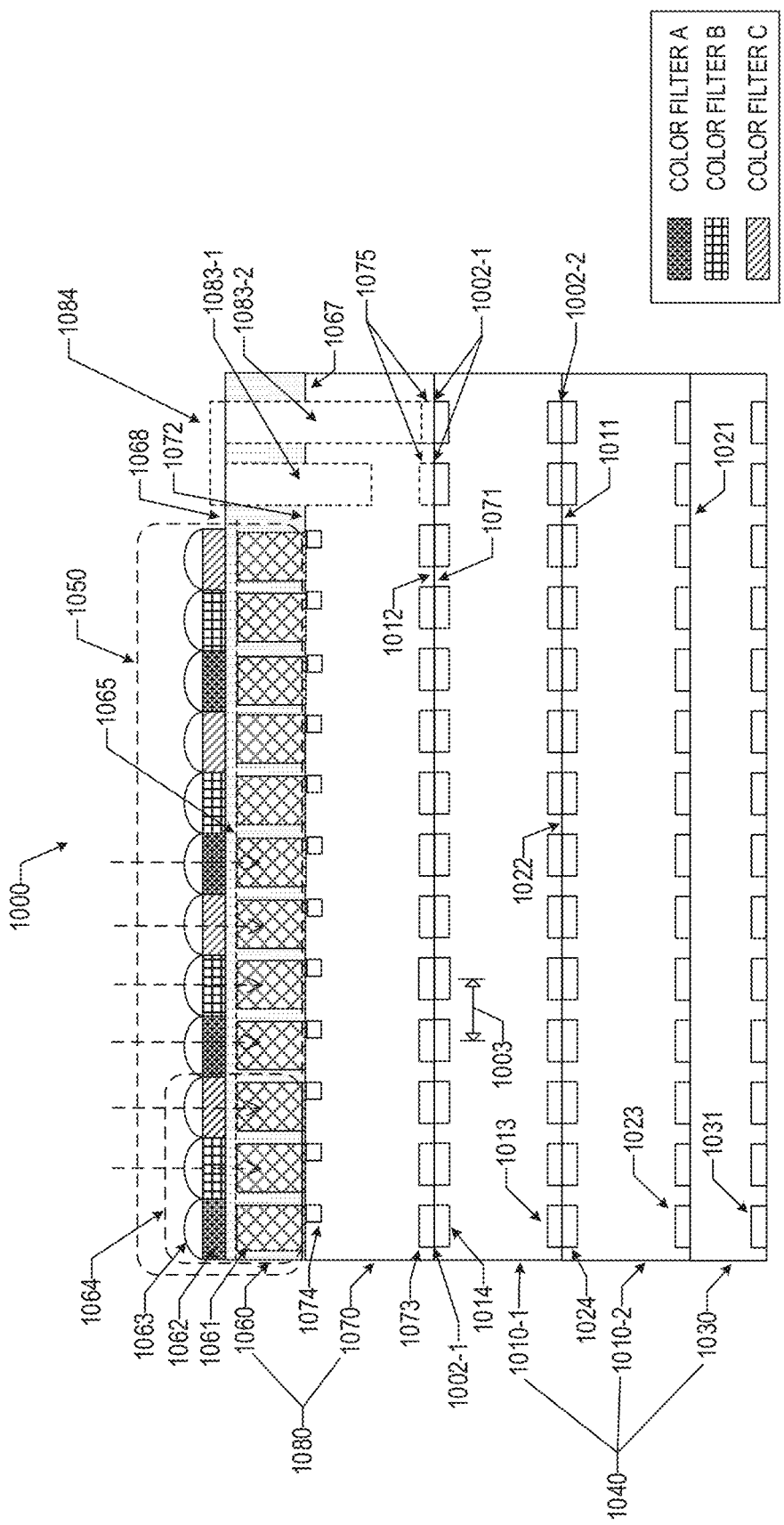
FIG. 8 is a side, cross-sectional view of another microelectronic assembly, in accordance with various embodiments.

FIG. 8 is a side, cross-sectional view of a microelectronic assembly 1000 including an image sensor 1050, a first double-sided integrated circuit logic layer 1010-1, and a second double-sided integrated circuit logic layer 1010-2. The image sensor 1050 may be composed of devices or pixel arrays 1064 (e.g., photodiodes with color filters and microlenses) for an integrated device with a pixel array layer 1060 and a pixel sensor circuitry layer 1070 in which the pixel array layer 1060 is coupled to the pixel sensor circuitry layer 1070. Any suitable solder or non-solder metal-to-metal or hybrid bonding technique may be used to interconnect the layers 1060/1070. In some embodiments, the layers 1060/1070 may be dies or wafers oxide bonded together using any suitable technique. TSVs or circuitry built-up on layer 1060 may be used to interconnect the two layers 1060/1070 in some embodiments. The pixel array layer 1060 may have a first face 1067 and an opposing second face 1068 and the pixel sensor circuitry layer 1070 may have a first face 1071 and an opposing second face 1072. In some embodiments, the interconnected layers 1060/1070 may be a composite integrated circuit assembly 1080; however, in other embodiments they may not be a composite integrated circuit assembly.

Individual pixels 1064 of image sensor 1050 may include various devices to facilitate capturing optical inputs (e.g., light, illustrated as the dashed-line arrow in FIG. 8). For example, image sensor 1050 may be a BSI image sensor including a number of pixels 1064. A pixel 1064 may include an array of lenses 1063, color filters 1062, photodiodes 1061. In some embodiments, reflectors (e.g., metallization) at a side of the photodiodes opposite a light receiving surface 1065. For example, the pixel 1064 may include photodiodes 1061 included in the pixel array layer 1060. The pixel array layer 1060 may be composed of a semiconductor material that is sensitive to light, such as silicon. Color filters 1062 may be arranged above the photodiodes 1061 at the second face 1068 of the pixel array layer 1060 and lenses (sometimes referred to as microlenses) 1063 may be arranged above the color filters 1062. Each pixel 1064 may be configured to detect optical inputs (e.g., light) for different colors (e.g., Red, Green, Blue, White, etc.); thus, each pixel may include a number of color filters in order to detect different colors. Three color filters, A, B, and C (e.g., Red, Green, and Blue), are illustrated for the embodiment of FIG. 8.

Each photodiode 1061 of each pixel 1064 may be electrically connected to sensor circuitry (e.g., capacitors, amplifiers, switches, etc.) within the subsequent pixel sensor circuitry layer 1070 via pixel electrodes 1074 at the second face 1072 of the pixel sensor circuitry layer 1070. During operation of an image sensor 1050, light received by photodiodes 1061 at the light receiving surface 1065 may be transformed to electrical output signals signaled to sensor circuitry of the pixel sensor circuitry layer 1070 via the pixel electrodes 1074. The sensor circuitry may "capture" the output signals as raw image data. In some embodiments, captured light may be sampled or otherwise averaged over periods of time, which may occur over millisecond ranges (e.g., 10 milliseconds, 20 milliseconds, etc.) for live view cameras. Raw image data from the sensor circuitry of the layer 1070 may be output to the double-sided integrated circuit logic layer 1010-1, which may, in some embodiments, include logic (e.g., memory) to store the raw image data.

The pixel sensor circuitry layer 1070 may be coupled to a double-sided integrated circuit logic layer 1010-1 by DTD interconnects 1002-1. In particular, the double-sided integrated circuit logic layer 1010-1 may have a first face 1011 and an opposing second face 1012. The first face 1071 of the pixel sensor circuitry layer 1070 may include conductive contacts 1073 and the second face 1012 of the double-sided integrated circuit logic layer 1010-1 may include conductive contacts 1014. The conductive contacts 1073 at the first of the pixel sensor circuitry layer 1070 may be electrically and mechanically coupled to conductive contacts 1014 at the second face of the double-sided die 1010 by DTD interconnects 1002-1 using any suitable techniques. Non-solder metal-to-metal (e.g., direct or hybrid bonded) interconnects 1002-1 are illustrated for the embodiment of FIG. 8; however, it is to be understood that any solder or non-solder interconnects may be used to couple the pixel sensor circuitry layer 1070 to die 1010-1.

In some embodiments, the conductive contacts 1073 and the conductive contacts 1014 may have a pitch 1003 between 0.1 microns and 10 microns. In some embodiments, the pitch 1003 may facilitate per-pixel level operations (e.g., raw image data storage, control, drive, etc.) for individual ones of pixels 1064 of image sensors 1050.

In some embodiments, the pixel sensor circuitry layer 1070 can be coupled to the double-sided integrated circuit logic layer 1010-1 using TSVs 1083-1 and 1083-2 to provide electrical interconnections between circuitry of the pixel sensor circuitry layer 1070 and circuitry of the first double-sided integrated circuit logic layer 1010-1. For such embodiments, TSV 1083-1 and TSV 1083-2 can be formed using any suitable techniques (e.g., laser drilling or plasma etching and plating, etc.) subsequent to interconnecting layer 1060 and layer 1070 (e.g., via any suitable wafer bonding technique) but prior to finishing the stack with microlenses and color filters. TSV 1083-1 may extend from the second face 1068 of the pixel array layer 1060 to device layers (not shown) of the pixel sensor circuitry layer 1070 and TSV 1083-2 may extend from the second face 1068 of the pixel array layer 1060 to the first face 1071 of the pixel sensor circuitry layer 1070 or, alternatively, to at least one conductive contact 1075 at the first face 1071 of the pixel sensor circuitry layer 1070. TSVs 1083-1/1083-2 may be electrically connected by an interconnect structure 1084 (e.g., a metal line) at the second face of pixel array layer 1060. The conductive contact(s) 1075 at the first face 1071 of the pixel sensor circuitry layer 1070 may be electrically and mechanically coupled to conductive contacts 1014 at the second face 1012 of the first double-sided integrated circuit logic layer 1010-1 using any suitable techniques.

The first double-sided integrated circuit logic layer 1010-1 may be interconnected to the second double-sided integrated circuit logic layer 1010-2 by DTD interconnects 1002-2. Second double-sided integrated circuit logic layer 1010-2 may have a first face 1021 and an opposing second face 1022. The first face 1011 of the first double-sided integrated circuit logic layer 1010-1 may include conductive contacts 1013 and the second face 1022 of the second double-sided integrated circuit logic layer may include conductive contacts 1024. The conductive contacts 1013 at the first face 1011 of the first double-sided integrated circuit logic layer 1010-1 may be electrically and mechanically coupled to the conductive contacts 1024 at the second face 1022 of the second double-sided integrated circuit logic layer 1010-2 by DTD interconnects 1002-2. Non-solder metal-to-metal (e.g., direct or hybrid bonded) DTD interconnects 1002-2 are illustrated for the embodiment of FIG. 8; however, it is to be understood that any solder or non-solder (e.g., metal-to-metal interconnects or anisotropic conductive material interconnects) interconnects may be used to couple the pixel sensor circuitry layer 1070 to the double-sided integrated circuit logic layer 1010-1.

The microelectronic assembly 1000 may further include a redistribution layer 1030 including conductive contacts 1031, which may also be referred to as first-level interconnect contacts of the microelectronic assembly, to fan-in or fan-out interconnections between the microelectronic assembly 1000 and a package substrate. In various embodiments, the redistribution layer 1030 may include features as discussed herein for redistribution layer 112. In some embodiments, the first double-sided integrated circuit logic layer 1010-1, the second double-sided integrated circuit logic layer 1010-2, and the redistribution layer 1030 interconnected together may form a composite integrated circuit assembly 1040; however, in other embodiments, they may not form a composite integrated circuit assembly.

In some embodiments, the first double-sided integrated circuit logic layer 1010-1 may be memory (such as high bandwidth memory or the like) to store raw image data output from sensor circuitry of the pixel sensor circuitry layer 1070. In some embodiments, the second double-sided integrated circuit logic layer 1010-2 may include a compression processing device, a Mobile Industry Processor Interface (MIPI), a machine learning processing device or a neural network processing device (e.g., for object find applications and/or algorithms), a graphics processing unit (GPU), an FPGA, combinations thereof, or the like. In still some embodiments, the second double-sided integrated circuit logic layer 1010-2 may include timers, controllers, wake-up and/or other power management circuitry and/or devices.

In various embodiments, microelectronic assembly 1000 and/or other microelectronic assemblies discussed herein may provide an advantageous approach for mixed node and/or heterogeneous technology integration into a stacked image sensor solution; in particular, dies formed using different manufacturing technologies and/or processes may be combined in the microelectronic assembly 1000. In addition, microelectronic assembly 1000 and/or other microelectronic assemblies discussed herein may facilitate per-pixel level operations (e.g., raw image data storage, control, drive etc.) for pixels 1064. Thus, in various embodiments, microelectronic assembly 1000 and other microelectronic assemblies discussed herein may provide for optimizing node and/or size per function, lowering overall system power consumption, and/or providing faster responsivity for a stacked image sensor solution. In some embodiments, for example, such a stacked image sensor solution may provide for the ability to accelerate image processing without additional power losses being incurred to transmit image data across a circuit board or interposer.

Figure 9:
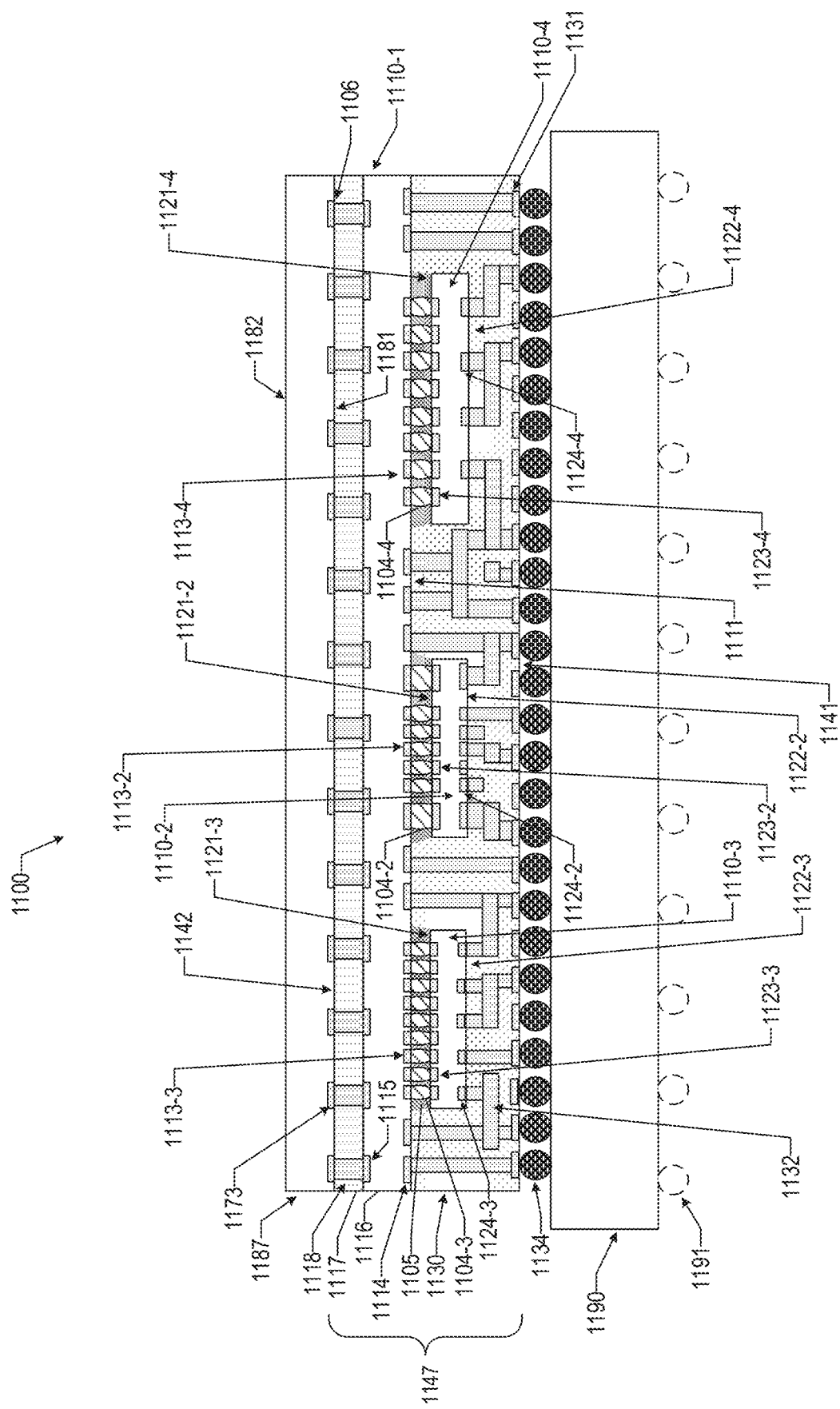
FIG. 9 is a side, cross-sectional view of another microelectronic assembly, in accordance with various embodiments.

FIG. 9 is a side, cross-sectional view of another example microelectronic assembly 1100 in which dies having smaller X-Y areas may be integrated into lower layers of the microelectronic assembly 1100, in accordance with various embodiments. The microelectronic assembly 1100 may include a first composite die 1180 coupled to a second composite die 1140.

The first composite die 1180 may have a first face 1181 and a second face 1182 and may include layers 1060/1070 (FIG. 8) coupled together and singulated to form an image sensor. Various features related to layers 1060/1070, image sensors, etc. are not illustrated in the embodiment of FIG. 9 for the sake of clarity; however, it is to be understood that features of layers 1060/1070 and image sensors therein may be included for the composite die 1180, as discussed for various embodiments herein.

The second composite die 1140 may have a first face 1141 and a second face 1142 and may include double-sided dies 1110-2/1110-3/1110-4 coupled to double-sided die 1110-1, and redistribution layer 1030 and the double-sided die 1110-1. In some embodiments, double-sided die 1110-1 may be memory (e.g., a logic layer) and double-sided dies 1110-2/1110-3/1110-4 may be processing devices configured to perform compression, neural network processing, machine learning processing, or any other processing on raw image data stored in the memory. In some embodiments, double-sided dies 1110-2/1110-3/1110-4 may include other circuitry as discussed herein such as additional memory, timers, controllers, wake-up and/or other power management circuitry and/or devices, combinations thereof or the like. In some embodiments, double-sided dies 1110-2/1110-3/1110-4 may be a combination of devices discussed herein to perform various processing and/or other operations on image data.

For the embodiment of FIG. 9, double-sided die 1110-1 may include circuitry 1116 and a die substrate 1117 extending from the circuitry 1116 to the second face 1142 of the composite die 1140. The circuitry 1116 may include interconnect layers on both sides of a device layer. The double-sided die 1110-1 may include may include sets of conductive contacts 1113 at the bottom side of the circuitry arranged in various footprints for electrically and mechanically coupling double-sided dies 1110-2/1110-3/1110-4 to double-sided die 1110-1. The double-sided die 1110-1 may further include conductive contacts 1114 at the bottom side of the circuitry 1116 for electrically coupling double-sided die 1110-1 to interconnect structures 1132 of the redistribution layer 1130. The double-sided die 1110-1 may further include conductive contacts 1115 at the top side of the circuitry 1116. The die substrate 1117 may include TSVs 1118 extending between the second face 1142 of the composite die 1140 and the conductive contacts 1115 at the top side of the circuitry 1116.

Conductive contacts 1173 at the first face 1181 of the first composite die 1180 (e.g., the conductive contacts 1173 of the die 1170 included in the composite die 1180) may be electrically and mechanically coupled to the TSVs 1118 by interconnects 1106. Any suitable technique may be used to form the interconnects 1106 including but not limited to solder techniques or non-solder techniques (e.g., metal-to-metal interconnects or anisotropic conductive material interconnects).

For the composite die 1140, the double-sided dies 1110-2/1110-3/1110-4 may be electrically and mechanically coupled to double-sided die 1110-1 between at least a portion of conductive contacts 1131 of the redistribution layer 1130. The conductive contacts 1131 may also be referred to as first-level interconnect contacts. The microelectronic assembly 1100 may be electrically and mechanically coupled to the package substrate 1190 by first-level interconnects 1134. In some embodiments, the microelectronic assembly may be electrically and mechanically coupled to a PCB by second-level interconnects 1191 using any suitable technique.

Conductive contacts 1123-2 at the first face 1121-2 of double-sided die 1110-2 may be electrically and mechanically coupled to conductive contacts 1113-2 at the first face 1111 of the double-sided die 1110-1 by DTD interconnects 1104-2. Conductive contacts 1124-2 at the second face 1122-2 of the double-sided die 1110-2 may be electrically coupled to one or more interconnect structures of 1132 of the redistribution layer 1130.

Conductive contacts 1123-3 at the first face 1121-3 of double-sided die 1110-3 may be electrically and mechanically coupled to conductive contacts 1113-3 at the first face 1111 of the double-sided die 1110-1 by DTD interconnects 1104-3. Conductive contacts 1124-3 at the second face 1122-3 of the double-sided die 1110-3 may be electrically coupled to one or more interconnect structures of 1132 of the redistribution layer 1130.

Conductive contacts 1123-4 at the first face 1121-4 of double-sided die 1110-4 may be electrically and mechanically coupled to conductive contacts 1113-4 at the first face 1111 of the double-sided die 1110-1 by DTD interconnects 1104-4. Conductive contacts 1124-4 at the second face 1122-4 of the double-sided die 1110-4 may be electrically coupled to one or more interconnect structures of 1132 of the redistribution layer 1130. In some embodiments, an underfill material 1105, as discussed herein, may extend between different ones of double-sided dies 1110-2/1110-3/1110-4 and double-sided integrated circuit logic layer 1010-1 around associated DTD interconnects 1004.

Figure 10:
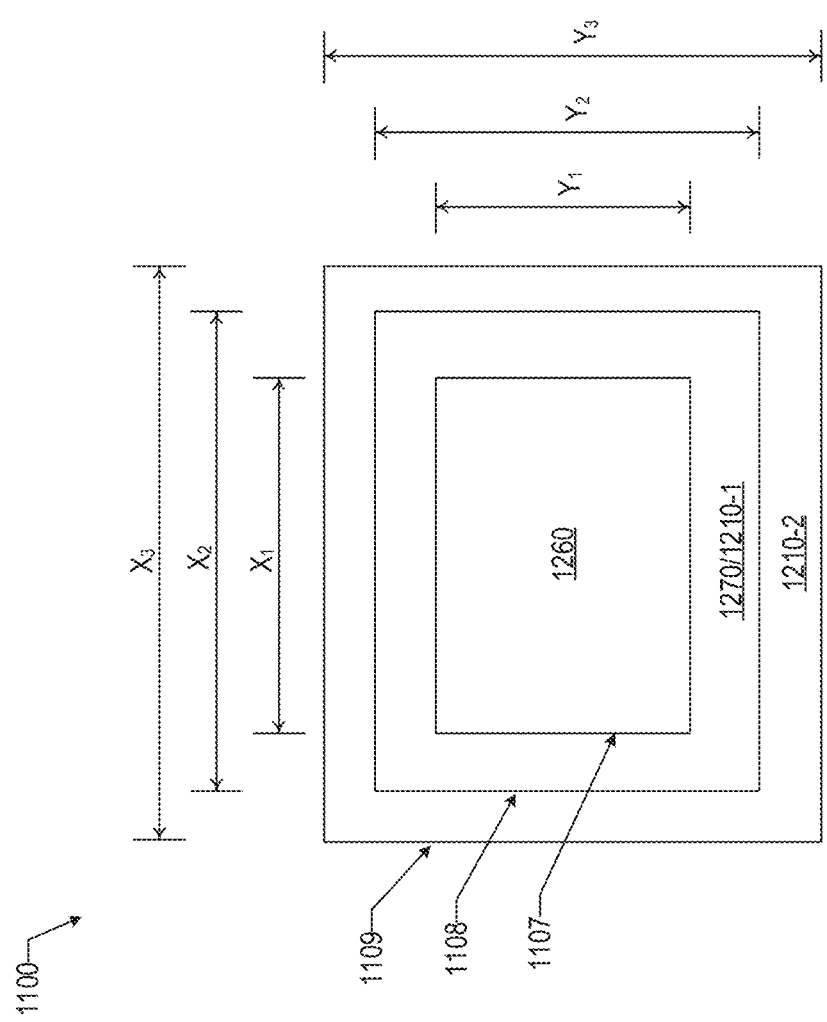
FIG. 10 is a top view of another microelectronic assembly, in accordance with various embodiments.

In various embodiments, the X-Y area of a top die in a microelectronic assembly 1100 may be less than or equal to an X-Y area of a middle die, which may be less than or equal to subsequent dies included in the microelectronic assembly. FIG. 10 is a top view of an example microelectronic assembly 1100 in which dies having larger X-Y areas may be integrated into lower layers of the microelectronic assembly 1000, in accordance with various embodiments. For the embodiment of FIG. 10, a die 1260 (which may include an image sensor) may have an X-Y area $A_1=X_1*Y_1$, a die 1270 (which may include pixel sensor circuitry) and a double-sided die 1210-1 (which may be memory) may each have an X-Y area $A_2=X_2*Y_2$, and a double-sided die 1210-2 (which may be include processing devices, etc., as discussed herein) may have an X-Y area $A_3=X_3*Y_3$, in which the relationship $A_1<A_2<A_3$ may exist. In various embodiments, an image sensor may have an X-Y area ranging between 3 millimeters by 5 millimeters to 24 millimeters by 36 millimeters and may have a thickness between 3 microns and 10 microns. In various embodiments, pixels of an image sensor may by arranged in squares have an X-Y area ranging between 0.9 microns by 0.9 microns to 3 microns by 3 microns.

For the embodiment of FIG. 10, die 1260, having the smallest X-Y area, $A_1$, may be included at a top layer 1107 of the microelectronic assembly 1100; die 1270 and double-sided die 1210-1, each having an X-Y area, $A_2$, between the X-Y area, $A_1$, of die 1260 and the X-Y area, $A_3$, of double-sided die 1210-2, may be included at middle layers 1108 of the microelectronic assembly 1100; and double-sided die 1210-2, having the largest X-Y area, $A_3$, may be included at a bottom layer 1109 of the microelectronic assembly 1100.

Although the embodiment of FIG. 10 illustrates an example microelectronic assembly 1100 in which dies having larger X-Y areas may be integrated into lower layers of the microelectronic assembly 1100, in some embodiments, dies having smaller X-Y areas may be integrated into lower layers of a microelectronic assembly (e.g., as illustrated in the microelectronic assembly 1000 of the embodiment of FIG. 9).

Figure 11A:
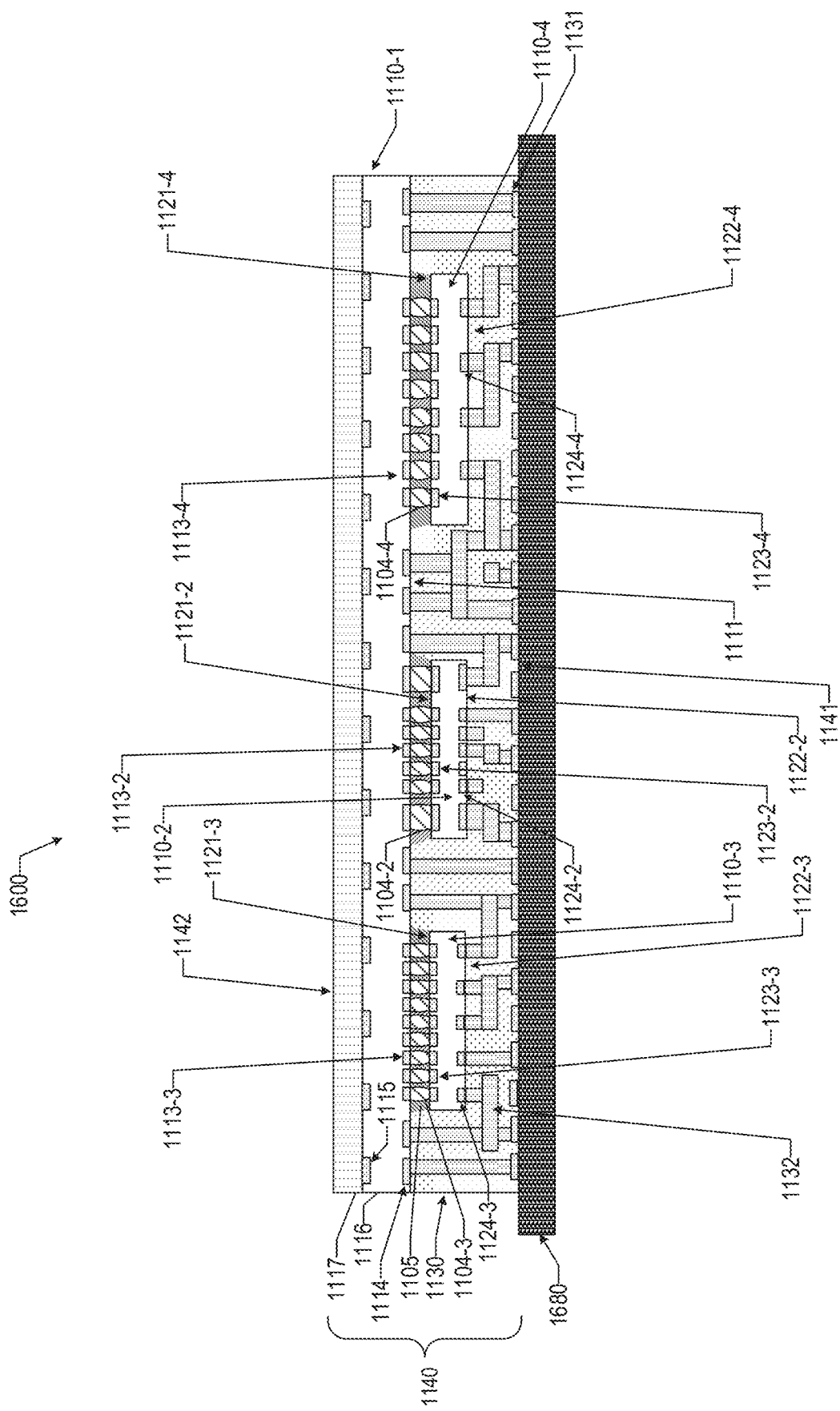
FIGS. 11A-11D are side, cross-sectional views of various stages in an example process for manufacturing the microelectronic assembly of FIG. 9, in accordance with various embodiments.

FIGS. 11A-11D are side, cross-sectional views of various stages in an example process for manufacturing the microelectronic assembly of FIG. 9, in accordance with various embodiments. FIG. 11A illustrates an assembly 1600 including a composite die 1140 secured to a carrier 1680. The composite die 1140 of the assembly 1600 may be manufactured as discussed above with reference to FIGS. 4A-4D, in some embodiments; the assembly 1600 is subsequent to "flipping" the composite die 1040 and securing the composite die 1140 to the carrier 1680. The composite die 1140 may be secured to the carrier 1680 using any suitable technique, such as a removable adhesive. The carrier 1680 may include any suitable material for providing mechanical stability during subsequent manufacturing operations.

Figure 11B:
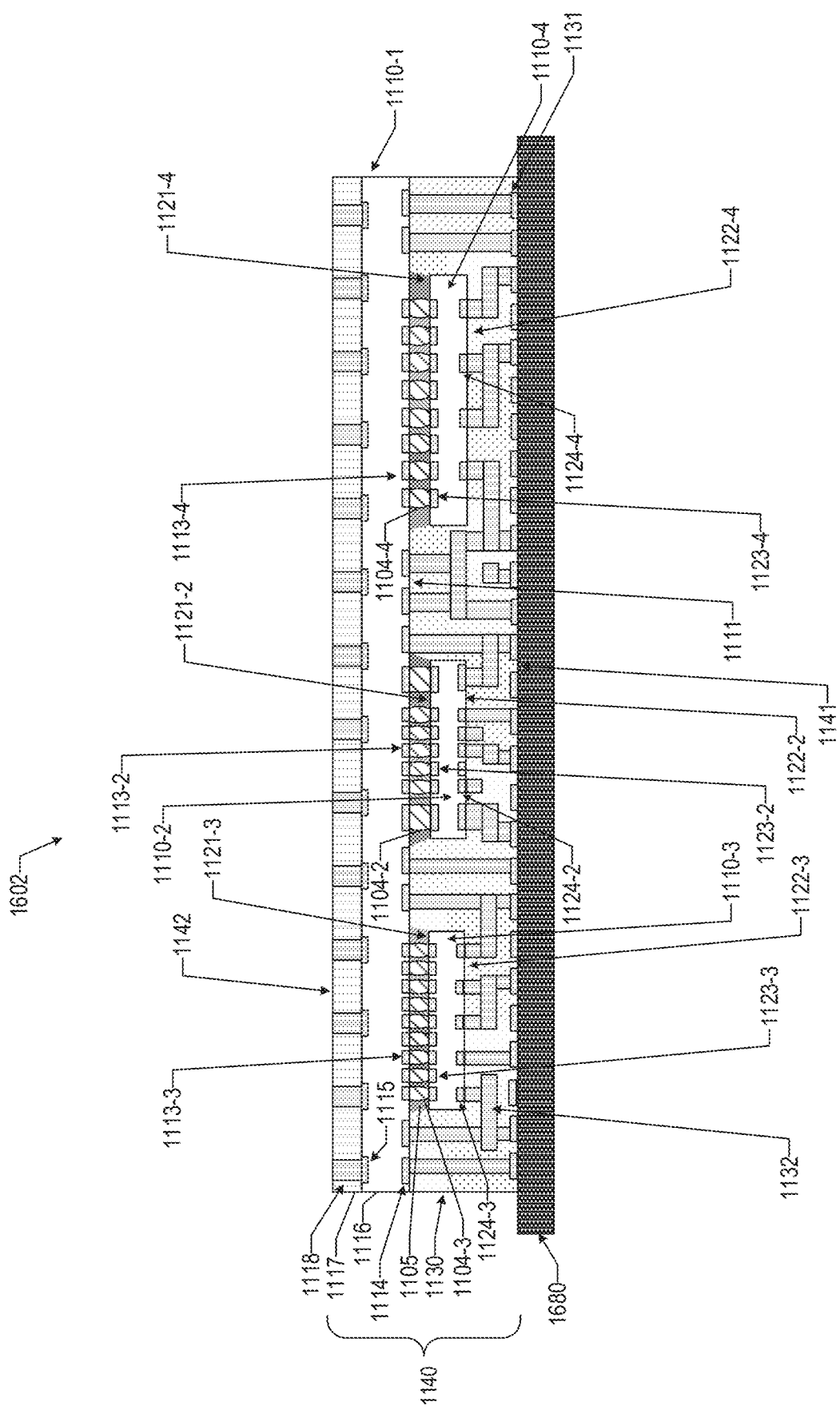

FIG. 11B illustrates an assembly 1602 subsequent to forming TSVs 1118 in the die substrate 1117 to electrically connect to conductive contacts 1115 at the top side of circuitry 1116. Although the embodiment of FIG. 11B illustrates a TSV last process, the TSVs 1118 could be a TSV mid process in which the TSVs 1118 are within the die substrate 1117, which is ground back to reveal the TSVs 1118. The TSVs 1118 may extend between the conductive contacts 1115 at the top side of the circuitry 1116 and the second face 1142 of the composite die 1140. Any suitable technique may be used to form the TSVs 1118 of the assembly 1602 (e.g., laser drilling or plasma etching, plating, and optional planarizing).

Figure 11C:
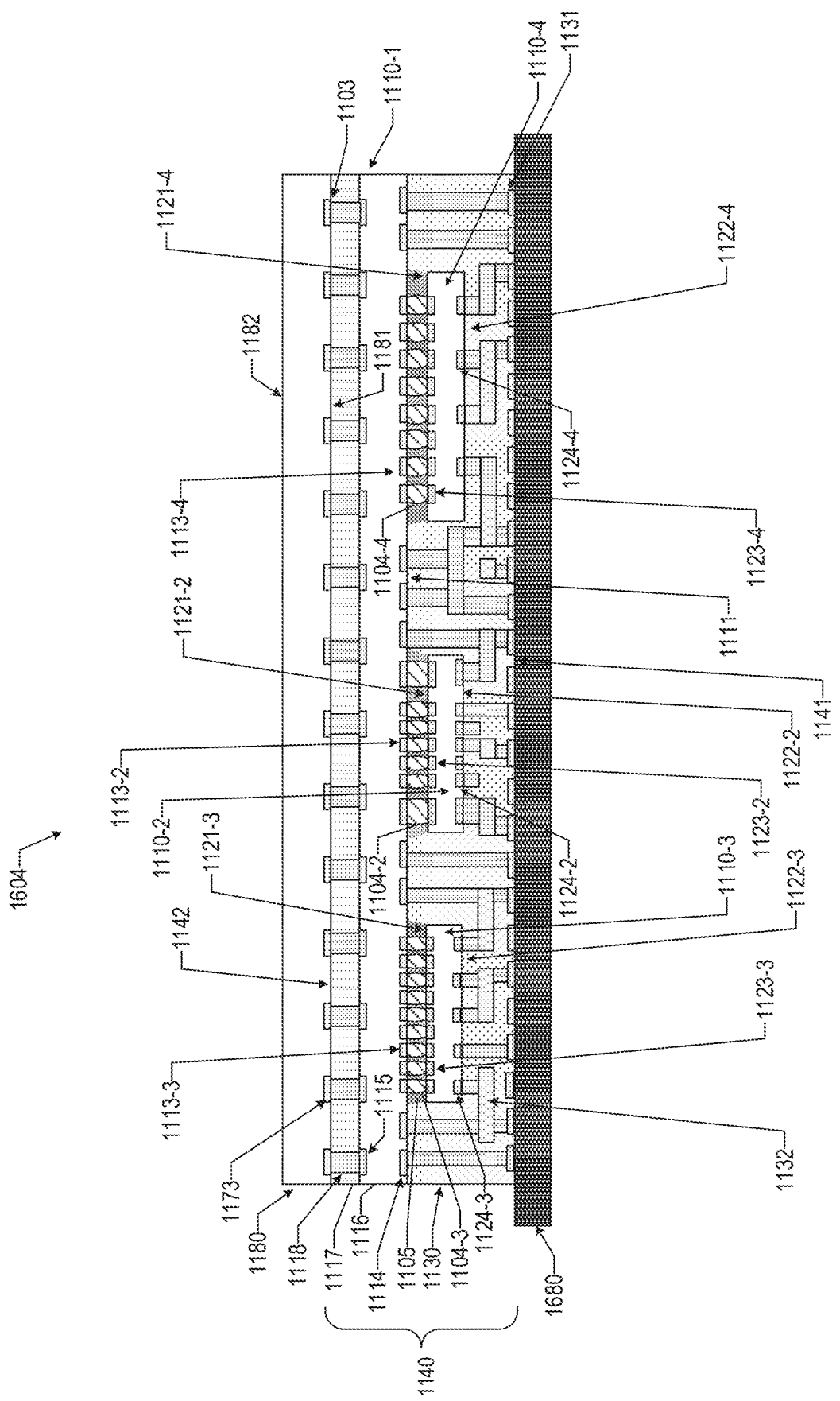

FIG. 11C illustrates an assembly 1604 subsequent to coupling composite die 1180 to composite die 1140. Conductive contacts 1173 at the first face 1181 may be electrically and mechanically coupled to TSVs 1118 at the second face 1142 of the composite die 1140 by interconnects 1106.

Any suitable technique may be used to form interconnects 1106 of the assembly 1604 such as solder techniques or non-solder techniques (e.g., metal-to-metal attachment techniques or anisotropic conductive material techniques). In some embodiments, interconnects 1106 may be formed using die-to-die, die-to-wafer, or wafer-to-wafer bonding techniques.

Figure 11D:
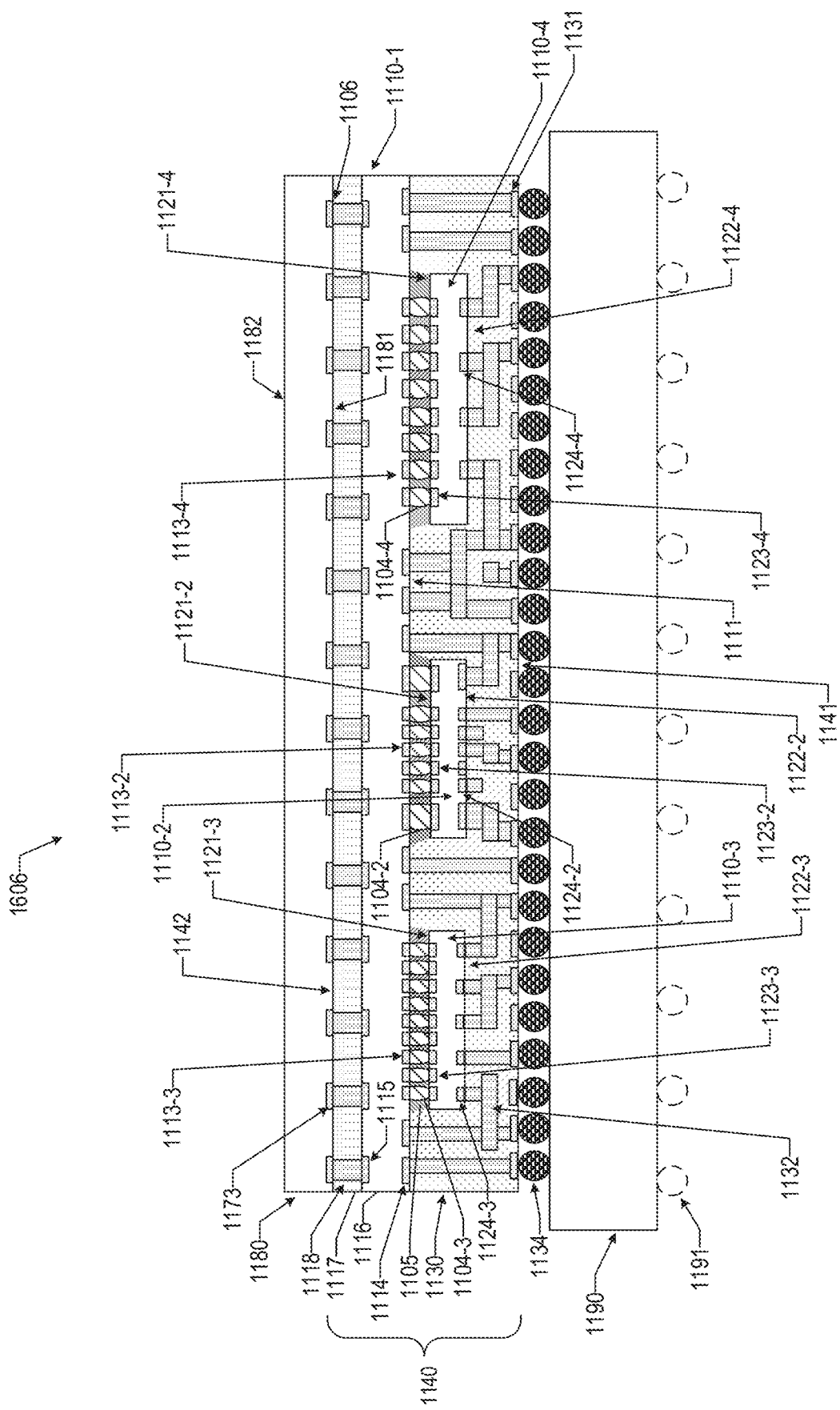

FIG. 11D illustrates an assembly 1606 subsequent to removing the carrier 1680 from the assembly 1604 and coupling the assembly to package substrate 1090 by first-level interconnects 1034. Any suitable techniques may be used to form the first-level interconnects 1034 (e.g., a mass reflow process or laser heated reflow bonding). The assembly 1606 may take the form of the microelectronic assembly 1100 of FIG. 9.

In another example, a microelectronic assembly may include photonic devices, such as a photonic receiver, a photonic transmitter, or a combination thereof (e.g., in a combined bidirectional photonics package-based solution). In some instances, a photonic receiver and/or transmitter can include III-V devices, such as photodetectors, lasers, modulators, etc. integrated into a silicon light circuit platform or die to which operational devices (e.g., drivers, control, timing, amplification, clocking, etc.) may be coupled to form a composite die-based photonic solution. For such microelectronic assemblies, operational devices associated with a photonic transmitter or a photonic receiver may be included in a double-sided die that may be electrically and mechanically coupled to the transmitter or receiver. A photonic transmitter and/or a photonic receiver typically operates at a higher frequency than image sensors. For example, optical signals (e.g., light) for a photonics microelectronic assembly may transmitted and/or received over tens of nanoseconds in order to achieve gigabit per second (Gbps) data transfer rates (e.g., between 10 Gbps and 200 Gbps, or faster). Such transfer rates may be impacted by interconnect parasitics between photonic devices and optical-to-electronic conversion operational devices associated with the operation of the photonic devices. In various embodiments, operational devices associated with photonic devices may include photonics modulator drive circuitry, power rails, trans-impedance amplifiers (TIAs), clock and/or re-timer elements, clock and data recovery (CDR) elements, thermodes (e.g., thermal diodes), transistors, capacitors, resistors, combinations thereof, or the like. Among other advantages discussed herein, microelectronic assemblies 1700 (FIG. 12) and 1800 (FIG. 13) may provide for reducing interconnect parasitics between photonic devices and operational devices associated therewith.

Figure 12:
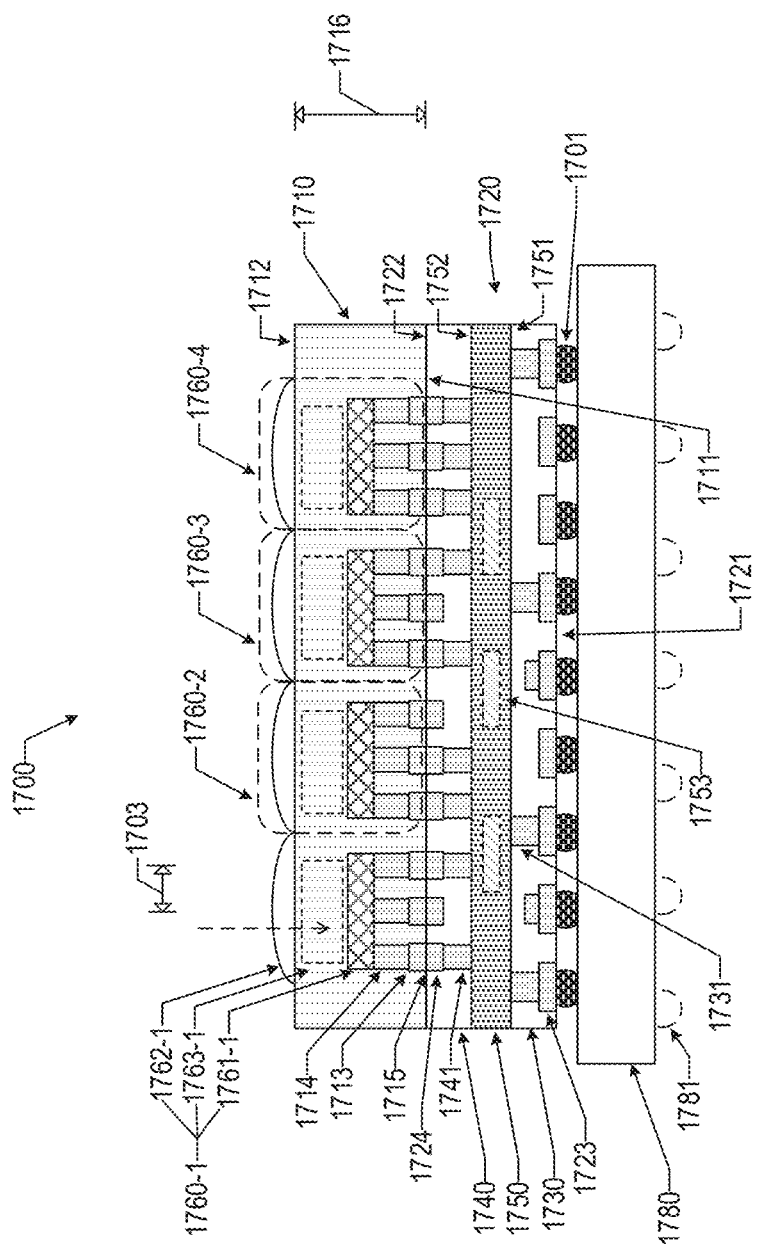
FIGS. 12-13 are side, cross-sectional views of other microelectronic assemblies, in accordance with various embodiments.

FIG. 12 illustrates a side, cross-sectional view of a microelectronic assembly 1700 including photonic receiver channels 1760, in accordance with various embodiments. Although four photonic receiver channels 1760-1/1760-2/1760-3/1760-4 are illustrated in the microelectronic assembly 1700, any number of photonic receiver channels may be included in a microelectronic assembly 1700 in accordance with various embodiments described herein. Microelectronic assembly 1700 may include a die 1710 including photodetectors and lenses coupled to a double-sided die 1720 including devices 1753 associated with the operation of optical-to-electronic conversion of photonic signals received by the photodiodes in the device layer of the die 1710. In particular, the die 1710 may have a first face 1711 and an opposing second face 1712 and the double-sided die 1720 may have a first face 1721 and an opposing second face 1722. Conductive contacts 1713 at the first face of the die 1710 may be electrically and mechanically coupled to conductive contacts 1724 at the second face 1722 of the double-sided die 1720 by DTD interconnects 1715 using any suitable technique. Non-solder metal-to-metal (e.g., direct or hybrid bonded) DTD interconnects 1715 are illustrated for the embodiment of FIG. 12; however, it is to be understood that any solder or non-solder conductive interconnects may be used to couple the die 1710 to the double-sided die 1720. Die 1710 and double-sided die 1720 may be coupled together to form a composite die; however, in other embodiments, they may not form a composite die. The double-sided die 1720 may be further coupled to a package substrate 1780. In particular, conductive contacts 1723 at a first face 1721 of the double-sided die 1720 may be coupled to the package substrate 1780 by first-level interconnects 1701 using any suitable technique. In some embodiments, the package substrate 1780 may be further coupled to a circuit board, interposer or the like by second-level interconnects 1781 using any suitable technique.

In some embodiments, the conductive contacts 1713 and 1724 may have a pitch 1703 ranging between 0.1 microns and 55 microns. In some embodiments, the die 1710 may have a thickness 1716 ranging between 10 microns and 780 microns. In some embodiments, the die 1710 may have X-Y dimensions ranging between 1 millimeters and 16 millimeters by 0.5 millimeters and 16 millimeters pending the number of receiver channels and pitch of the conductive contacts. The conductive contacts 1723 at the first face 1721 of the double-sided die 1720 may have a pitch in the range of finer pitch conductive contacts, as discussed herein. In various embodiments, the conductive contacts 1723 at the first face 1721 of the double-sided die 1720 and the conductive contacts 1724 at the second face 1722 of the double-sided die 1720 may have a same pitch, a different pitch, or mixed pitches at the faces.

Individual photonic receiver channels 1760 may include various devices to facilitate capturing optical signals (e.g., light, illustrated as the dashed-line arrow in FIG. 12) such as a lens 1762 and a photodetector 1761. For example, the photonic receiver channel 1760-1 may include a photodetector 1761-1 within the die 1710 and a lens 1762-1 at a second face 1712 of the die 1710, above the photodetector 1761-1. In some embodiments, a photonic receiver channel 1760 may additionally include an optical waveguide 1763 (e.g., optical waveguide 1763-1 for photonic receiver channel 1760-1) between the lens 1762 and the photodetector 1761 to direct light towards the photodetector 1761 if light is directed from the top of the die 1710 into the photodetector 1761. In some embodiments, metallized reflectors may be included in the die 1710 below the photodetector 1761 for capturing reflections. In some embodiments, metallization can be included around a lateral circumference of a waveguide, if a waveguide is included in the die 1710. In various embodiments, the photodetectors 1761 may be photodiodes or phototransistors. The die 1710 may include interconnect structures 1714 to electrically couple the photodetectors 1761 to the conductive contacts 1713 at the first face 1711 of the die 1710.

The interconnect structures 1714 may be composed of any conductive materials (e.g., metal) as discussed herein. The die 1710 may be composed of a semiconductor material that is sensitive to light, such as silicon or silicon on insulator with photodetectors of alternative active material grown on top such as germanium, InP, or InGaAs.

In various embodiments, the double-sided die 1720 may take the form of any double-sided die as discussed herein. The double-sided die 1720 may include a first interconnect layer 1730, a second interconnect layer 1740, and a device layer 1750. In some embodiments, the device layer 1750 may include multiple device layers and/or the interconnect layers 1730/1740 may each include multiple interconnect layers, as discussed herein. For the embodiment of FIG. 12, the first interconnect layer 1730 may extend between a first side 1751 of the device layer 1750 and the first face 1721 of the double-sided die 1720, as discussed herein. The second interconnect layer 1740 may extend between a second side 1752 of the device layer 1750 and the second face 1722 of the double-sided die, as discussed herein. It is to be understood that the connections of interconnect structures 1731/1741 illustrated in FIG. 12 are provided for illustrative purposes only and are not meant to limit the broad scope of the present disclosure. Any interconnect structures may be provided for the double-sided die 1720 in accordance with various embodiments. Various devices 1753 (e.g., transistors, TIAs, clocks, drivers, etc.) associated with the operation of photonic receivers 1760 may be included in the device layer 1750. For example, devices 1753 may include TIAs and clock re-timer circuitry that converts a received optical signal to a digital signal to be sent to storage and/or for data processing.

Figure 13:
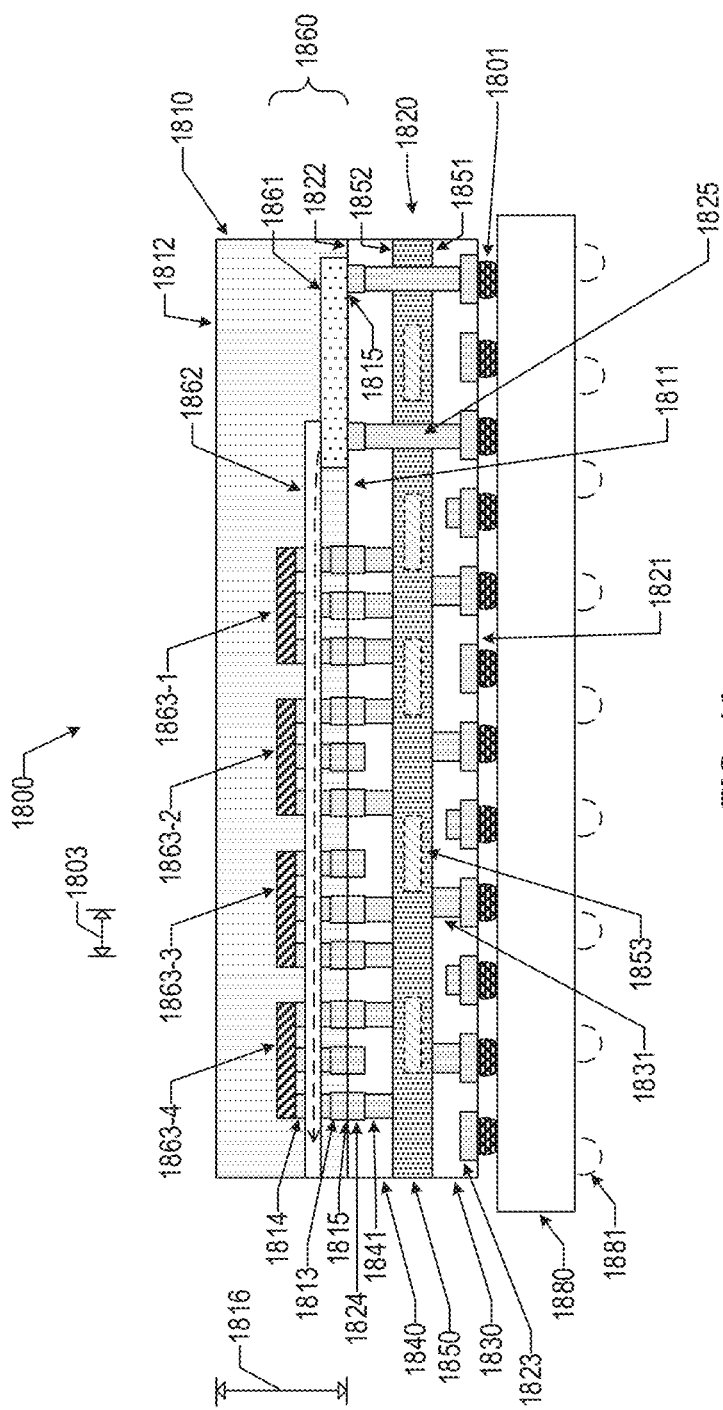

FIG. 13 illustrates a side, cross-sectional view of a microelectronic assembly 1800 including photonic transmitter channels, in accordance with various embodiments. Microelectronic assembly 1800 may include a die 1810 including photonic transmitter 1860 coupled to a double-sided die 1820 including devices 1853 associated with the electronic operation of the photonic transmitter 1860. In particular, the die 1810 may have a first face 1811 and a second face 1812 and the double-sided die 1820 may have a first face 1821 and a second face 1822. Conductive contacts 1813 at the first face of the die 1810 may be electrically and mechanically coupled to conductive contacts 1824 at the second face 1822 of the double-sided die 1820 by DTD interconnects 1815 using any suitable technique. Non-solder metal-to-metal (e.g., direct or hybrid bonded) DTD interconnects 1815 are illustrated for the embodiment of FIG. 13; however, it is to be understood that any solder or non-solder interconnects may be used to couple the die 1810 to the double-sided die 1820. In some embodiments, die 1810 and double-sided die 1820 may be coupled together to form a composite die; however, in other embodiments, they may not form a composite die. The double-sided die 1820 may be further coupled to a package substrate 1880. In particular, conductive contacts 1823 at a first face 1821 of the double-sided die 1820 may be coupled to the package substrate 1880 by first-level interconnects 1801 using any suitable technique. In some embodiments, the package substrate 1880 may be further coupled to a circuit board, interposer or the like by second-level interconnects 1881 using any suitable technique.

In some embodiments, the conductive contacts 1813 and 1824 may have a pitch 1803 ranging between 0.1 microns and 50 microns. In some embodiments, the die 1810 may have a thickness 1816 ranging between 5 microns and 780 microns. In some embodiments, the die 1810 may have X-Y dimensions ranging between 0.5 millimeters and 25 millimeters by 1 millimeter and 33 millimeters. The maximum size may be the reticle size in wafer processing and the minimum size may be based on the number of channels multiplied by channel pit (e.g., 0.125 mm×4 channels). The conductive contacts 1823 at the first face 1821 of the double-sided die 1820 may have a pitch in the range of finer pitch conductive contacts, as discussed herein. In various embodiments, the conductive contacts 1823 at the first face 1821 of the double-sided die 1820 and the conductive contacts 1824 at the second face 1822 of the double-sided die 1820 may have a same pitch, a different pitch, or mixed pitches at the faces (e.g., the pitch between conductive contacts for the modulators 1863 may be different than conductive contacts for the laser 1861).

The photonic transmitter 1860 may include various devices to facilitate transmitting optical signals (e.g., light, illustrated as the dashed-line arrow in FIG. 13) such as a laser 1861, an optical waveguide 1862, and electro-optic modulators 1863. In some embodiments, the laser 1861 may be an indium phosphide (InP) laser. In some embodiments, the laser 1861 may be an array of lasers. In some embodiments, the electro-optic modulators 1863 may be Mach Zender modulators, ring resonator modulators, combinations thereof, or the like. Although four modulators 1863-1/1863-2/1863-3-11863-4 are illustrated in the microelectronic assembly 1800, it is to be understood that any number of modulators may be included any number of modulators may be included in a microelectronic assembly 1800 in accordance with various embodiments described herein. The die 1810 may include interconnect structures 1814 to electrically couple the modulators 1863 to the conductive contacts 1813 at the first face 1811 of the die 1810. The interconnect structures 1814 may be composed of any conductive materials (e.g., metal) as discussed herein. The die 1810 may be composed of a semiconductor material such as silicon. Although not illustrated in FIG. 13, the laser 1861 may, in some embodiments, include conductive contacts to electrically and mechanically couple the laser 1861 to conductive contacts 1824 at the second face 1822 of the double-sided die 1820 by DTD interconnects 1815. In still some embodiments, electrical connections to the laser 1861 could extend laterally into die 1810 and then to conductive contacts that could be electrically and mechanically coupled to conductive contacts of double-sided die 1820.

In various embodiments, the double-sided die 1820 may take the form of any double-sided die as discussed herein. The double-sided die 1820 may include a first interconnect layer 1830, a second interconnect layer 1840, and a device layer 1850. In some embodiments, the device layer 1850 may include multiple device layers and/or the interconnect layers 1830/1840 may each include multiple interconnect layers as discussed herein. For the embodiment of FIG. 13, the first interconnect layer 1830 may extend between a first side 1851 of the device layer 1850 and the first face 1821 of the double-sided die 1820 and may include non-TSV first interconnect structures 1831, which may be unidirectional or multidirectional interconnect structures, as discussed herein. The second interconnect layer 1840 may extend between a second side 1852 of the device layer 1850 and the second face 1822 of the double-sided die 1820 and may include non-TSV second interconnect structures 1841, which may be unidirectional or multidirectional interconnect structures, as discussed herein. The double-sided die 1820 may also include TSV interconnect structures 1825. It is to be understood that the connections of interconnect structures 1831/1841 illustrated in FIG. 13 are provided for illustrative purposes only and are not meant to limit the broad scope of the present disclosure. Any interconnect structures may be provided for the double-sided die 1820 in accordance with various embodiments. Various devices 1853 (e.g., transistors, TIAs, drivers, thermodes, etc.) associated with the operation of the photonic transmitter 1860 may be included in the device layer 1850.

Microelectronic assemblies 1700/1800; and other microelectronic assemblies discussed herein may provide an advantageous approach for mixed node and/or heterogeneous technology integration into a stacked photonics solution; in particular, dies formed using different manufacturing technologies and/or processes may be combined in the microelectronic assemblies 1700/1800. For example, photonics features and drive/control circuitry associated therewith may be completed using separate processes. The dies of the different processes may be bonded together to ensure fast bandwidth drive circuitry and/or off package power delivery.

For the microelectronic assembly 1800, the double-sided die 1820 may seal the laser 1861, which may, in some embodiments, advantageously provide thermal cooling for the laser 1861 (e.g., the double-sided die 1820 may act as a heat spreader to pull heat away from the laser 1861). In some embodiments thermodes or other temperature sensing devices 1853 may be included in the device layer 1850 of the double-sided die 1820 to measure the temperature of the laser 1861 in order to control power to the laser 1861 for maintaining a stable wavelength of optical signals transmitted from the laser 1861. In addition, drive circuitry in the device layer 1850 may control the modulators 1863 at an appropriate frequency that may be synchronized with digital data packets encoded in the optical signals transmitted from the laser 1861.

In some embodiments, microelectronic assembly 1700 and microelectronic assembly 1800 may advantageously be integrated into a monolithic composite microelectronic assembly (e.g., a transceiver), which may be attached to a package that may include a switch, processing unit(s), memory, etc. and optical fibers may be attached to provide optical interconnects for the integrated assemblies 1700/1800. In still some embodiments, if the photonic devices of dies 1710 or 1810 have a larger X-Y area than their underlying circuitry, additional photonic processing device(s), encoding, memory, etc. may be advantageously integrated into microelectronic assemblies 1700/1800 (e.g., as illustrated in the microelectronic assembly 100 of FIG. 1, the microelectronic assembly 1100 of FIG. 9, or the like). For example, in some embodiments, devices capable of providing serialiizer/deserializer (SERDES) protocol features may be locally integrated with photonic devices in a microelectronic assembly 1700/1800. In some embodiments, a microelectronic assembly 1700 can include multiple double-sided dies 1720, which could be the same or multiple distinct double-sided dies 1720 coupled to die 1710. In some embodiments, a microelectronic assembly 1800 can include multiple double-sided dies 1820, which could be the same or multiple distinct double-sided dies 1820, coupled to die 1810. In still some embodiments, die 1710 and die 1810 can be coupled to a same double-sided die (e.g., to form a transceiver).

Figure 14B:
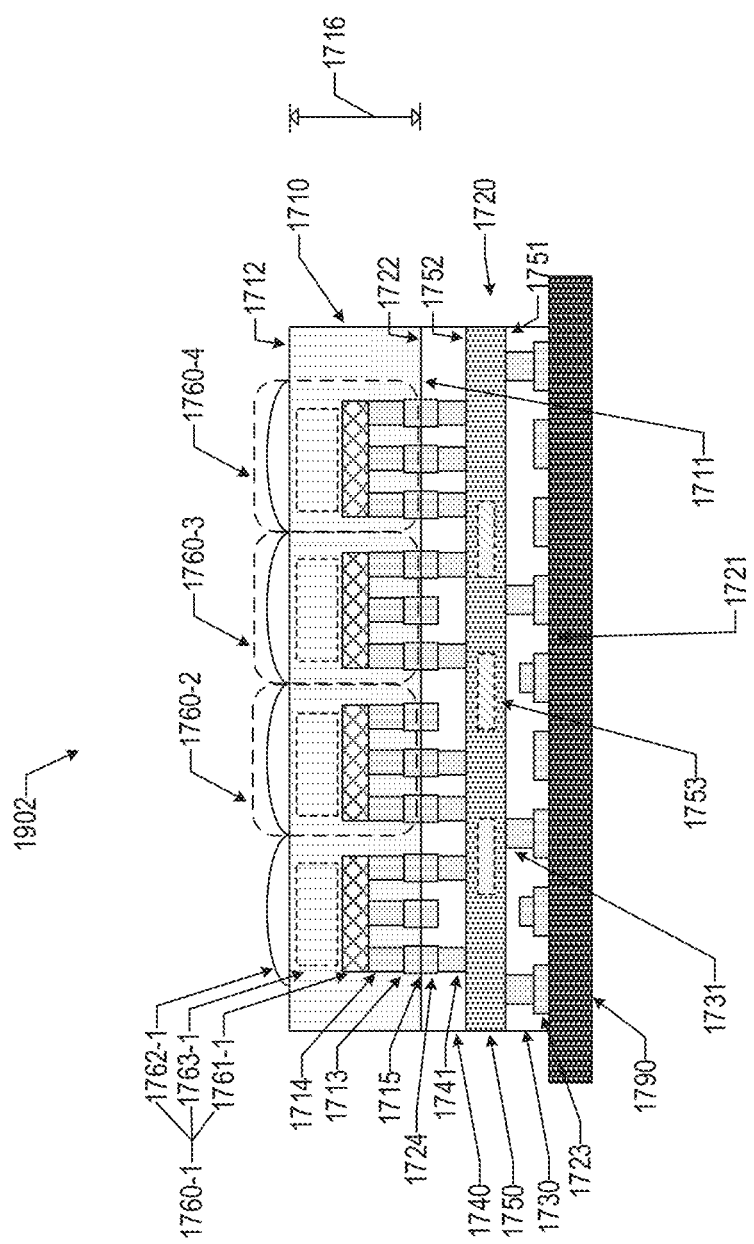
Figure 14C:
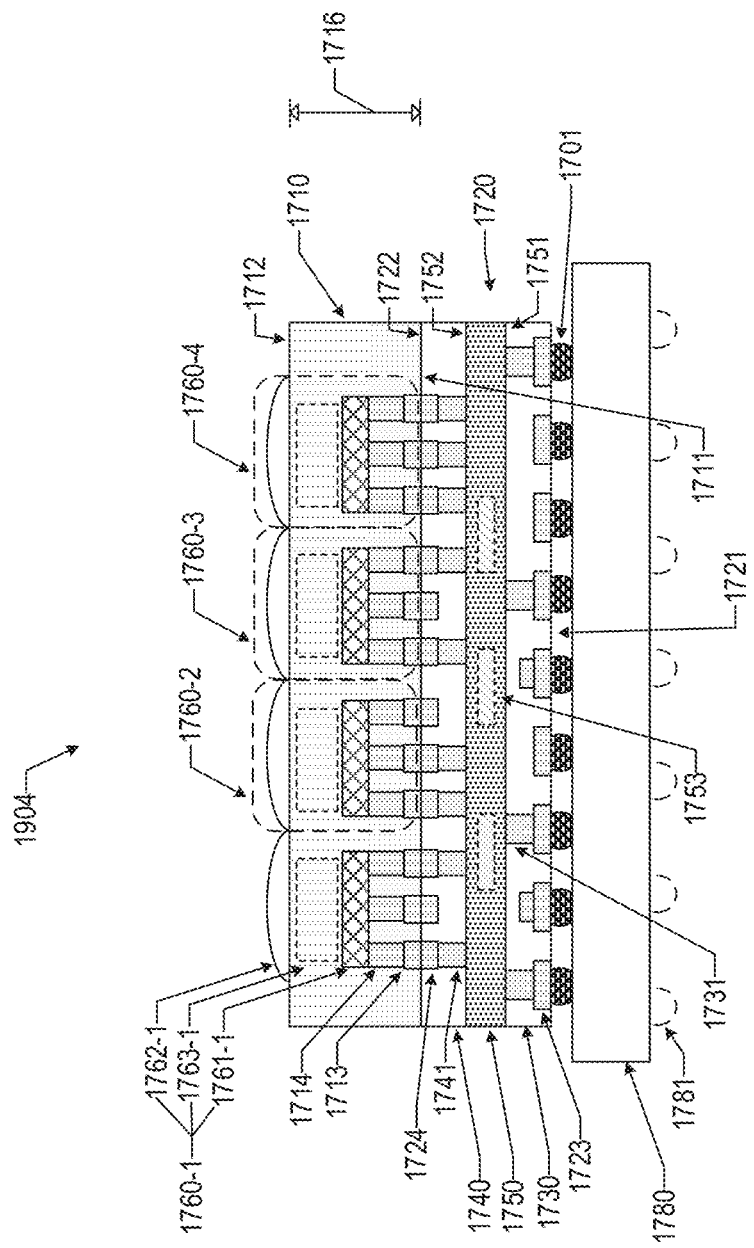

FIGS. 14A-14C are side, cross-sectional views of various stages in an example process for manufacturing the microelectronic assembly 1700 of FIG. 12, in accordance with various embodiments. FIG. 14A illustrates an assembly 1900 including the double-sided die 1720 secured to a carrier 1790. The double-sided may be secured to the carrier 1790 using any suitable technique, such as a removable adhesive. The carrier 1790 may include any suitable material for providing mechanical stability during subsequent manufacturing operations and could include bulk silicon that is subsequently removed through planarization.

FIG. 14B illustrates an assembly 1902 subsequent to coupling the die 1710 to the double-sided die 1720. Conductive contacts 1724 at the second face 1722 of the double-sided die 1720 may be electrically and mechanically coupled to conductive contacts 1713 at the first face 1711 of the die 1710 by DTD interconnects 1715. Any suitable technique may be used to form the DTD interconnects 1715 of the assembly 1902 such as solder techniques or non-solder techniques (e.g., metal-to-metal attachment techniques or anisotropic conductive material techniques). In some embodiments, DTD interconnects 1715 may be formed using die-to-die, die-to-wafer, or wafer-to-wafer bonding techniques.

FIG. 14C illustrates an assembly 1904 subsequent to removing the carrier 1790 from the assembly 1902 and coupling the assembly to the package substrate 1780 by first-level interconnects 1701. Any suitable techniques may be used to form the first-level interconnects 1701 (e.g., a mass reflow process or a thermal compression bonding process). The assembly 1904 may take the form of the microelectronic assembly 1700 of FIG. 12.

Figure 15A:
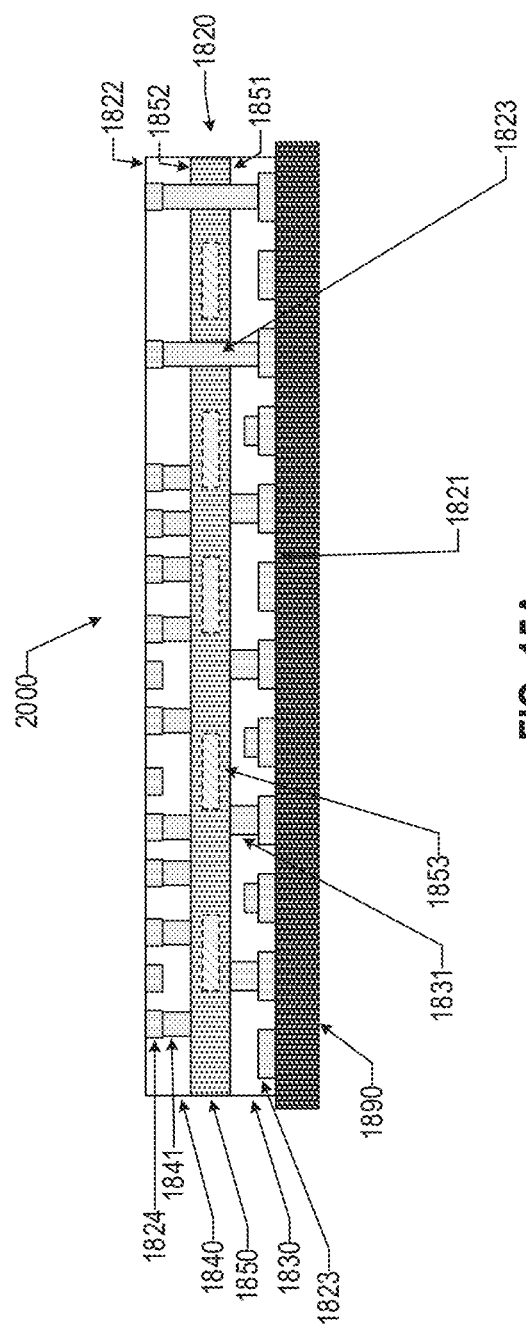
FIGS. 15A-15C are side, cross-sectional views of various stages in an example process for manufacturing the microelectronic assembly of FIG. 13, in accordance with various embodiments.
Figure 15B:
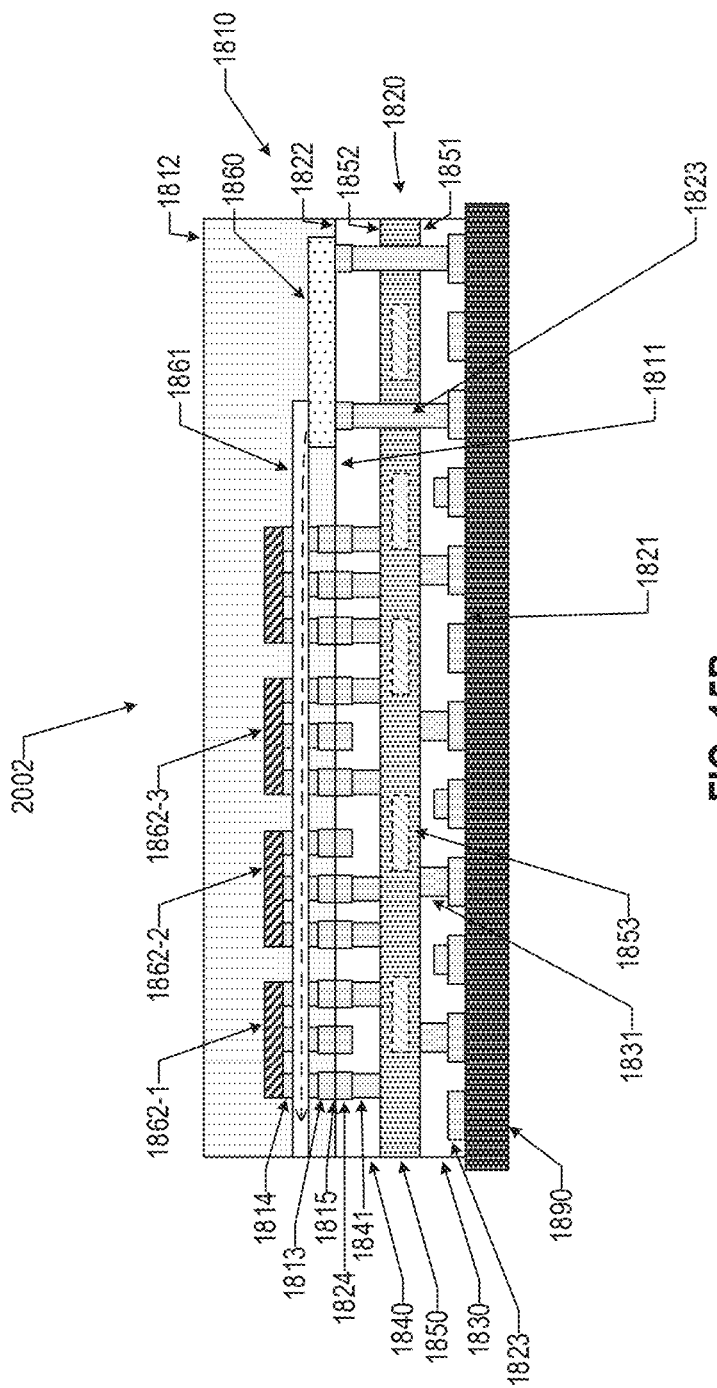
Figure 15C:
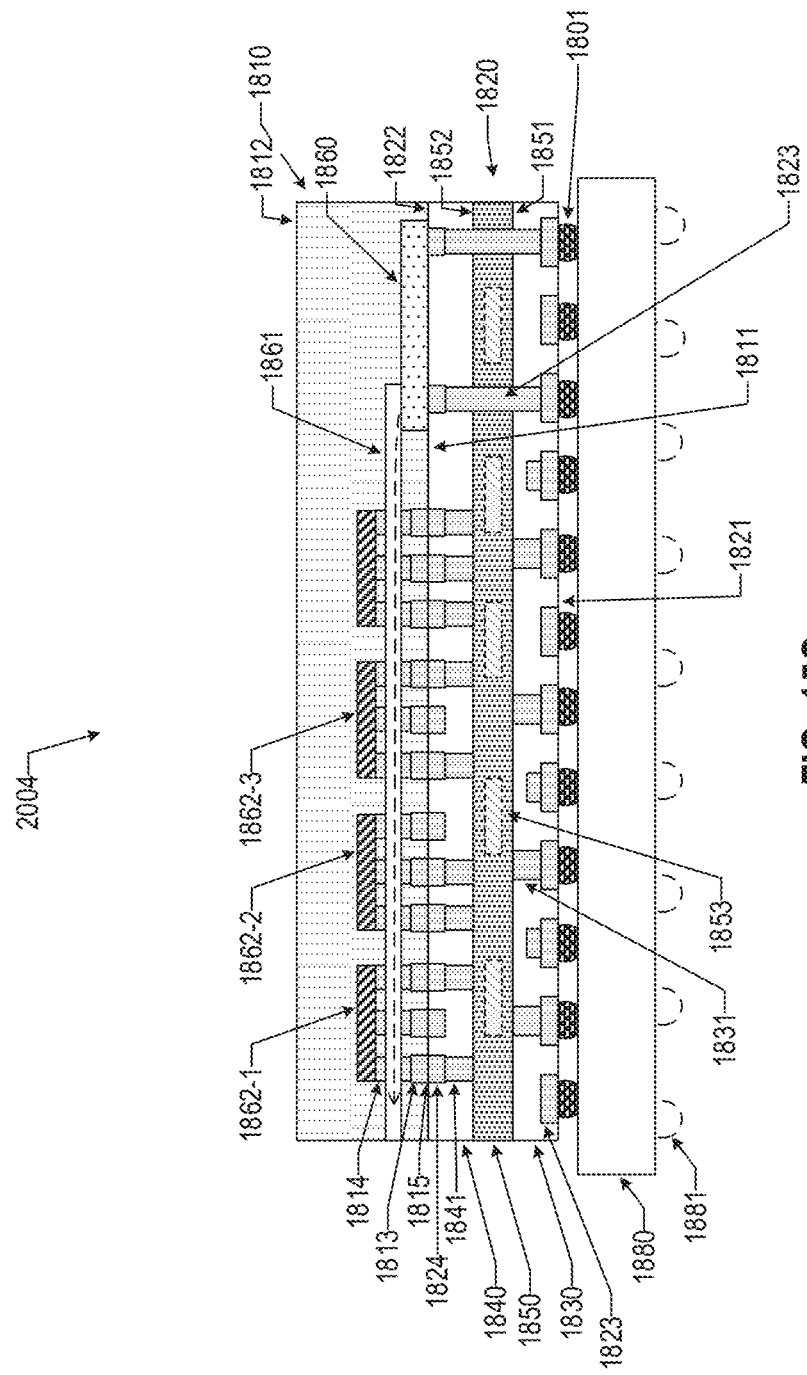

FIGS. 15A-15C are side, cross-sectional views of various stages in an example process for manufacturing the microelectronic assembly 1800 of FIG. 13, in accordance with various embodiments. FIG. 15A illustrates an assembly 2000 including the double-sided die 1820 secured to a carrier 1890. The double-sided may be secured to the carrier 1890 using any suitable technique, such as a removable adhesive. The carrier 1890 may include any suitable material for providing mechanical stability during subsequent manufacturing operations.

FIG. 15B illustrates an assembly 2002 subsequent to coupling the die 1810 to the double-sided die 1820. Conductive contacts 1824 at the second face 1822 of the double-sided die 1820 may be electrically and mechanically coupled to conductive contacts 1813 at the first face 1811 of the die 1810 by DTD interconnects 1815. Any suitable technique may be used to form the DTD interconnects 1815 of the assembly 1802 such as solder techniques or non-solder techniques (e.g., metal-to-metal attachment techniques or anisotropic conductive material techniques). In some embodiments, DTD interconnects 1815 may be formed using die-to-die, die-to-wafer, or wafer-to-wafer bonding techniques.

FIG. 15C illustrates an assembly 2004 subsequent to removing the carrier 1890 from the assembly 2002 and coupling the assembly to the package substrate 1880 by first-level interconnects 1801. Any suitable techniques may be used to form the first-level interconnects 1801 (e.g., a mass reflow process or a thermal compression bonding process). The assembly 2004 may take the form of the microelectronic assembly 1800 of FIG. 13.

The microelectronic assemblies 100/1000/1100/1700/1800 disclosed herein may be included in any suitable electronic component. FIGS. 16-20 illustrate various examples of apparatuses that may include, or be included in, any of the microelectronic assemblies 100/1000/1700/1800 disclosed herein.

Figure 16:
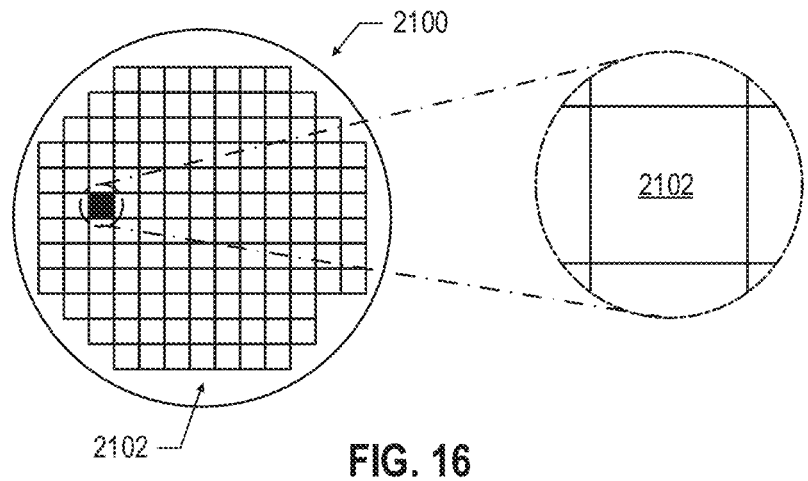
FIG. 16 is a top view of a wafer and dies that may include a microelectronic assembly, in accordance with any of the embodiments disclosed herein.

FIG. 16 is a top view of a wafer 2100 and dies 2102 that may be included in any of the microelectronic assemblies 100/1000/1700/1800 disclosed herein (e.g., as any suitable ones of the dies disclosed herein). The wafer 2100 may be composed of semiconductor material and may include one or more dies 2102 having IC structures formed on a surface of the wafer 2100. Each of the dies 2102 may be a repeating unit of a semiconductor product that includes any suitable IC. After the fabrication of the semiconductor product is complete, the wafer 2100 may undergo a singulation process in which the dies 2102 are separated from one another to provide discrete "chips" of the semiconductor product. The die 2102 may be any of the dies disclosed herein. The die 2102 may include one or more transistors (e.g., some of the transistors 2240 of FIG. 16, discussed below), supporting circuitry to route electrical signals to the transistors, passive components (e.g., signal traces, resistors, capacitors, or inductors), and/or any other IC components. In some embodiments, the wafer 2100 or the die 2102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2102. For example, a memory array formed by multiple memory devices may be formed on a same die 2102 as a processing device (e.g., the processing device 2502 of FIG. 20) or other logic that is configured to store information in the memory devices or execute instructions stored in the memory array. Various ones of the microelectronic assemblies 100/1000/1700/1800 disclosed herein may be manufactured using a die-to-wafer assembly technique in which some dies are attached to a wafer 2100 that include others of the dies, and the wafer 2100 is subsequently singulated.

Figure 17:
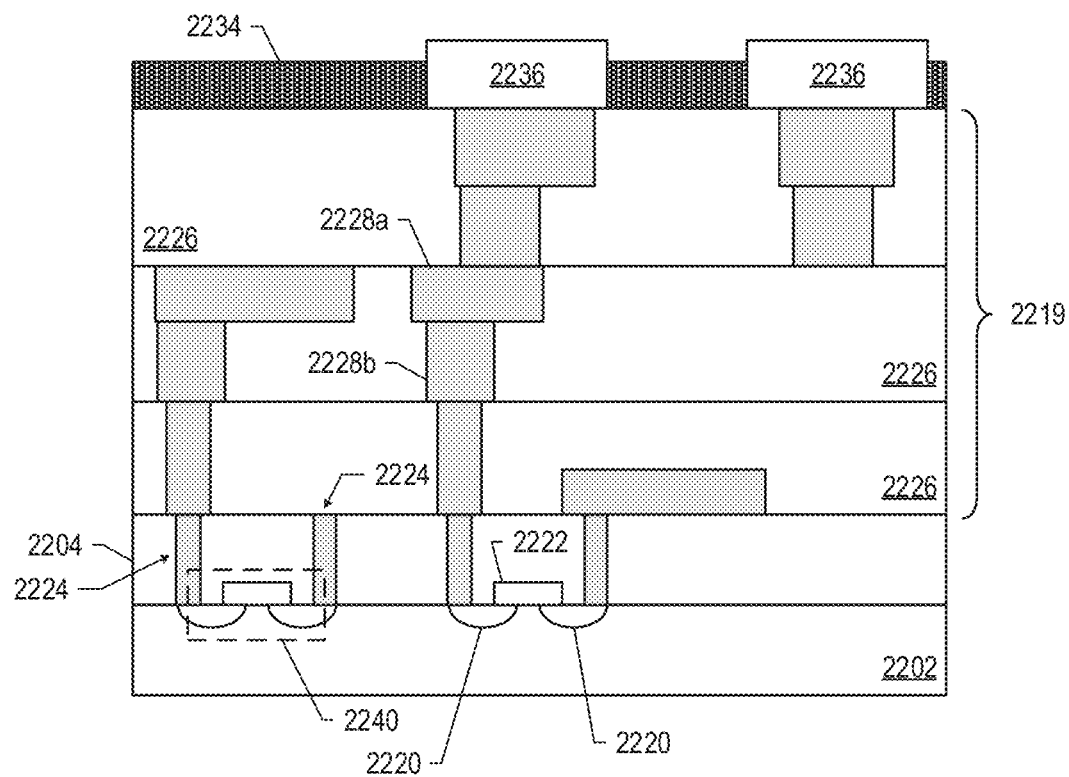
FIG. 17 is a cross-sectional side view of an integrated circuit (IC) device that may be included in a microelectronic assembly, in accordance with any of the embodiments disclosed herein.

FIG. 17 is a cross-sectional side view of an example IC device 2200 that may be included in any of the microelectronic assemblies 100/1000/1700/1800 disclosed herein (e.g., in any of the dies disclosed herein). One or more of the IC devices 2200 may be included in one or more dies 2102 (FIG. 16). The IC device 2200 may be formed on a die substrate 2202 (e.g., the wafer 2100 of FIG. 16) and may be included in a die (e.g., the die 2102 of FIG. 16). The die substrate 2202 may be a semiconductor substrate composed of semiconductor material systems including, for example, n-type or p-type materials systems (or a combination of both). The die substrate 2202 may include, for example, a crystalline substrate formed using a bulk silicon or a SOI substructure. In some embodiments, the substrate 2202 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2202. Although a few examples of materials from which the die substrate 2202 may be formed are described here, any material that may serve as a foundation for an IC device 2200 may be used. The die substrate 2202 may be part of a singulated die (e.g., the dies 2102 of FIG. 16) or a wafer (e.g., the wafer 2100 of FIG. 16).

The IC device 2200 may include one or more device layers 2204 disposed on the die substrate 2202. The device layer 2204 may include features of one or more transistors 2240 (e.g., metal oxide semiconductor field-effect transistors (MOSFETs)) formed on the die substrate 2202 and/or any other active and/or passive circuitry as may be desired by a device manufacturer. The device layer 2204 may include, for example, one or more source and/or drain (S/D) regions 2220, a gate 2222 to control current flow in the transistors 2240 between the S/D regions 2220, and one or more S/D contacts 2224 to route electrical signals to/from the S/D regions 2220. The transistors 2240 may include additional features not depicted for the sake of clarity, such as device isolation regions, gate contacts, and the like. The transistors 2240 are not limited to the type and configuration depicted in FIG. 17 and may include a wide variety of other types and configurations such as planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2240 may include a gate 2222 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2240 along the source-channel-drain direction, the gate electrode may consist of a U-shaped structure that includes a bottom portion substantially parallel to the surface of the die substrate and two sidewall portions that are substantially perpendicular to the top surface of the die substrate. In other embodiments, at least one of the metal layers that form the gate electrode may simply be a planar layer that is substantially parallel to the top surface of the die substrate and does not include sidewall portions substantially perpendicular to the top surface of the die substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2220 may be formed within the die substrate 2202 adjacent to the gate 2222 of each transistor 2240. The S/D regions 2220 may be formed using an implantation/diffusion process or an etching/deposition process, for example. In the former process, dopants such as boron, aluminum, antimony, phosphorous, or arsenic may be ion-implanted into the die substrate 2202 to form the S/D regions 2220. An annealing process that activates the dopants and causes them to diffuse farther into the die substrate 2202 may follow the ion-implantation process. In the latter process, the die substrate 2202 may first be etched to form recesses at the locations of the S/D regions 2220. An epitaxial deposition process may then be carried out to fill the recesses with material that is used to fabricate the S/D regions 2220. In some implementations, the S/D regions 2220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2220 may be formed using one or more alternate semiconductor materials such as germanium or a group III-V material or alloy. In further embodiments, one or more layers of metal and/or metal alloys may be used to form the S/D regions 2220.

Electrical signals, such as power and/or input/output (I/O) signals, may be routed to and/or from the devices (e.g., transistors 2240) of the device layer 2204 through one or more interconnect layers disposed on the device layer 2204 (illustrated in FIG. 22 as interconnect layers 2206, 2208, and 2210). For example, electrically conductive features of the device layer 2204 (e.g., the gate 2222 and the S/D contacts 2224) may be electrically coupled with the interconnect structures 2228 of the interconnect layers 2206-2210. The one or more interconnect layers 2206-2210 may form a metallization stack (also referred to as an "ILD stack") 2219 of the IC device 2200.

The interconnect structures 2228 may be arranged within the interconnect layers 2206-2210 to route electrical signals according to a wide variety of designs. In particular, the arrangement is not limited to the particular configuration of interconnect structures 2228 depicted in FIG. 17. Although a particular number of interconnect layers 2206-2210 is depicted in FIG. 17, embodiments of the present disclosure include IC devices having more or fewer interconnect layers than depicted.

In some embodiments, the interconnect structures 2228 may include lines 2228a and/or vias 2228b filled with an electrically conductive material such as a metal. The lines 2228a may be arranged to route electrical signals in a direction of a plane that is substantially parallel with a surface of the die substrate 2202 upon which the device layer 2204 is formed. For example, the lines 2228a may route electrical signals in a direction in and out of the page from the perspective of FIG. 17. The vias 2228b may be arranged to route electrical signals in a direction of a plane that is substantially perpendicular to the surface of the die substrate 2202 upon which the device layer 2204 is formed. In some embodiments, the vias 2228b may electrically couple lines 2228a of different interconnect layers 2206-2210 together.

The interconnect layers 2206-2210 may include a dielectric material 2226 disposed between the interconnect structures 2228, as shown in FIG. 17. In some embodiments, the dielectric material 2226 disposed between the interconnect structures 2228 in different ones of the interconnect layers 2206-2210 may have different compositions; in other embodiments, the composition of the dielectric material 2226 between different interconnect layers 2206-2210 may be the same.

A first interconnect layer 2206 (referred to as Metal 1 or "M1") may be formed directly on the device layer 2204. In some embodiments, the first interconnect layer 2206 may include lines 2228a and/or vias 2228b, as shown. The lines 2228a of the first interconnect layer 2206 may be coupled with contacts (e.g., the S/D contacts 2224) of the device layer 2204.

A second interconnect layer 2208 (referred to as Metal 2 or "M2") may be formed directly on the first interconnect layer 2206. In some embodiments, the second interconnect layer 2208 may include vias 2228b to couple the lines 2228a of the second interconnect layer 2208 with the lines 2228a of the first interconnect layer 2206. Although the lines 2228a and the vias 2228b are structurally delineated with a line within each interconnect layer (e.g., within the second interconnect layer 2208) for the sake of clarity, the lines 2228a and the vias 2228b may be structurally and/or materially contiguous (e.g., simultaneously filled during a dual-damascene process) in some embodiments.

A third interconnect layer 2210 (referred to as Metal 3 or "M3") (and additional interconnect layers, as desired) may be formed in succession on the second interconnect layer 2208 according to similar techniques and configurations described in connection with the second interconnect layer 2208 or the first interconnect layer 2206. In some embodiments, the interconnect layers that are "higher up" in the metallization stack 2219 in the IC device 2200 (i.e., farther away from the device layer 2204) may be thicker.

The IC device 2200 may include a solder resist material 2234 (e.g., polyimide or similar material) and one or more conductive contacts 2236 formed on the interconnect layers 2206-2210. In FIG. 17, the conductive contacts 2236 are illustrated as taking the form of bond pads. The conductive contacts 2236 may be electrically coupled with the interconnect structures 2228 and configured to route the electrical signals of the transistor(s) 2240 to other external devices. For example, solder bonds may be formed on the one or more conductive contacts 2236 to mechanically and/or electrically couple a chip including the IC device 2200 with another component (e.g., a circuit board). The IC device 2200 may include additional or alternate structures to route the electrical signals from the interconnect layers 2206-2210; for example, the conductive contacts 2236 may include other analogous features (e.g., posts) that route the electrical signals to external components. The conductive contacts 2236 may serve as the conductive contacts for any of the dies discussed herein, as appropriate.

In some embodiments in which the IC device 2200 is a double-sided die, the IC device 2200 may include another metallization stack (not shown) on the opposite side of the device layer(s) 2204. This metallization stack, may include multiple interconnect layers as discussed above with reference to the interconnect layers 2206-2210, to provide conductive pathways (e.g., including conductive lines and vias) between the device layer(s) 2204 and additional conductive contacts (not shown) on the opposite side of the IC device 2200 from the conductive contacts 2236. These additional conductive contacts may serve as the conductive contacts 136 or 138, as appropriate. In other embodiments in which the IC device 2200 is a double-sided die, the IC device 2200 may include one or more TSVs through the die substrate 2202; these TSVs may make contact with the device layer(s)

2204, and may provide conductive pathways between the device layer(s) 2204 and additional conductive contacts (not shown) on the opposite side of the IC device 2200 from the conductive contacts 2236. These additional conductive contacts may serve as the conductive contacts for any of the double-sided dies discussed herein, as appropriate. Example details of one example type of a double-sided IC device are discussed in further detail in FIG. 18.

Figure 18:
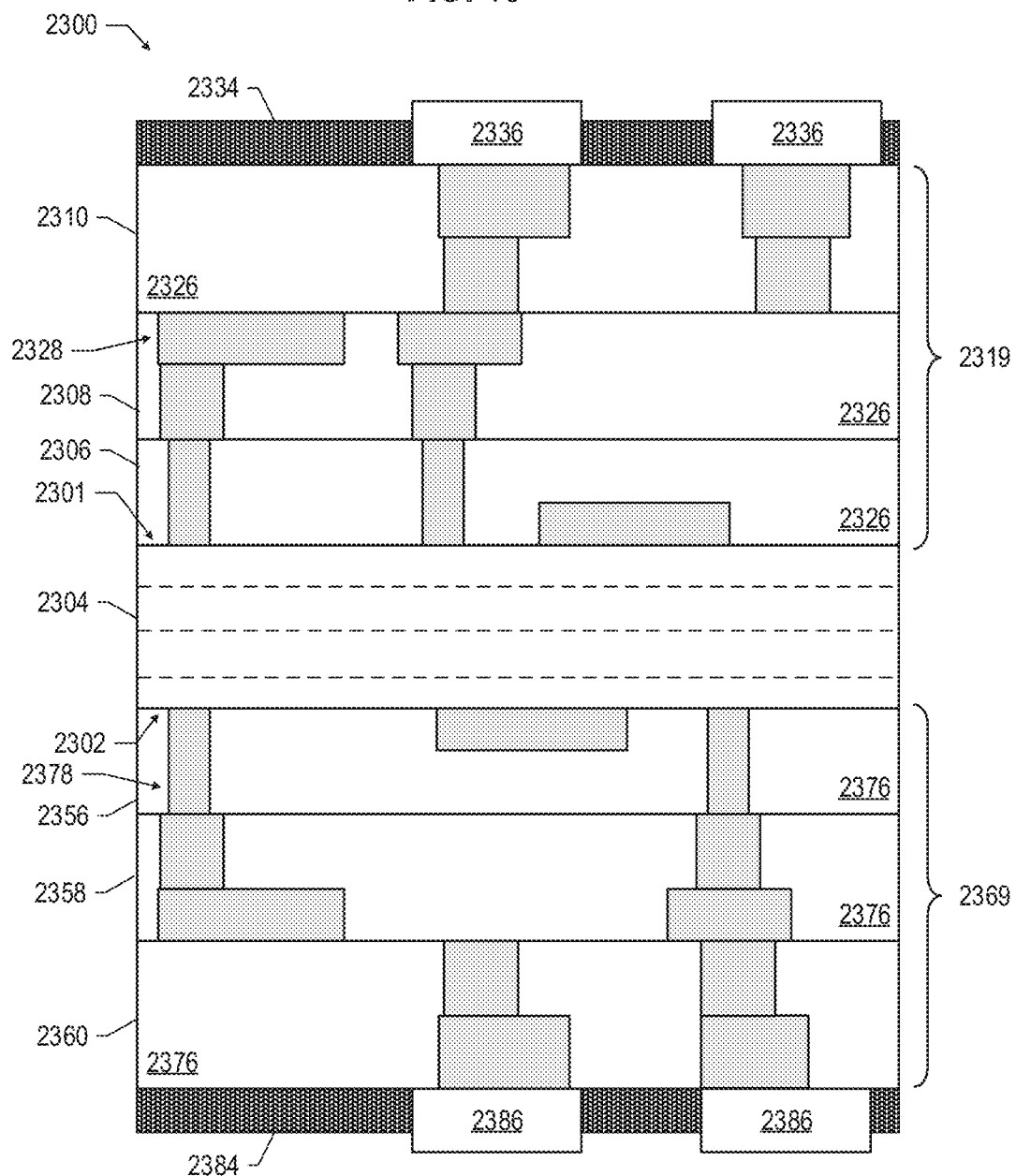
FIG. 18 is a cross-sectional side view of one example type of a double-sided IC device that may be included in a microelectronic assembly, in accordance with any of the embodiments disclosed herein.

FIG. 18 is a side, cross-sectional view of one example type of a double-sided IC device 2300 that may be included in any of the microelectronic assemblies 100/1000/1100/1700/1800 disclosed herein (e.g., in any of the double-sided dies disclosed herein). One or more of the double-sided IC devices 2300 may be included in one or more dies 2102 (FIG. 16). The double-sided IC device 2300 may be composed of semiconductor material systems including, for example, n-type or p-type materials systems (or a combination of both). In some embodiments, the IC device may be composed of alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the double-sided IC device 2300.

The double-sided IC device 2300 may include one or more device layers 2304. The device layers 2304 may include features of one or more transistors (e.g., as discussed in FIG. 17) and/or any other active and/or passive circuitry as may be desired by a device manufacturer.

Electrical signals, such as power and/or input/output (I/O) signals, may be routed to and/or from the devices of the device layers 2304 through one or more interconnect layers disposed on opposing sides of the device layers 2304 (illustrated in FIG. 18 as first interconnect layers 2306, 2308, and 2310 on a first side 2301 of the device layers and second interconnect layers 2356, 2358, and 2360 on an opposing second side 2302 of the device layers 2304). For example, electrically conductive features of the device layers 2304 may be electrically coupled with the first interconnect structures 2328 of the first interconnect layers 2306-2310 and/or with the second interconnect structures 2378 of the second interconnect layers 2356-2360. The one or more first interconnect layers 2306-2310 may form a first metallization stack (e.g., an ILD stack) 2323 and the one or more second interconnect layers 2356-2360 may form a second metallization stack 2369 of the double-sided IC device 2300.

The first interconnect structures 2328 may be arranged within the first interconnect layers 2306-2310 and the second interconnect structures 2378 may be arranged within the second interconnect layers 2356-2360 to route electrical signals according to a wide variety of designs (in particular, the arrangement is not limited to the particular configuration of the first interconnect structures 2328 and the second interconnect structures 2378 depicted in FIG. 18). Although a particular number of first interconnect layers 2306-2310 and a particular number of second interconnect layers 2356-2360 are depicted in FIG. 18, embodiments of the present disclosure include IC devices having more or fewer first and/or second interconnect layers than depicted. Further, the particular number of first interconnect layers and second interconnect layers on opposing sides of the device layers 2304 may be the same or different from each other.

In some embodiments, the first interconnect structures 2328 and/or the second interconnect structures 2378 may include lines and/or vias as discussed herein filled with an electrically conductive material such as a metal. The first interconnect layers 2306-2310 may include a first dielectric material 2326 disposed between the first interconnect structures 2328, as shown in FIG. 18. In some embodiments, the first dielectric material 2326 disposed between the first interconnect structures 2328 in different ones of the first interconnect layers 2306-2310 may have different compositions; in other embodiments, the composition of the first dielectric material 2326 between different first interconnect layers 2306-2310 may be the same. The second interconnect layers 2356-2360 may include a second dielectric material 2376 disposed between the second interconnect structures 2378, as shown in FIG. 18. In some embodiments, the second dielectric material 2376 disposed between the second interconnect structures 2378 in different ones of the second interconnect layers 2356-2360 may have different compositions; in other embodiments, the composition of the second dielectric material 2376 between different second interconnect layers 2356-2360 may be the same. In some embodiments, the composition of the first dielectric material 2326 and the second dielectric material 2376 may be different; in other embodiments, the composition of the first dielectric material 2326 and the second dielectric material 2376 may be the same. The first interconnect layers 2306-2310 and the second interconnect layers 2356-2360 may be formed using any techniques as discussed herein (e.g., composed of M1-M3 layers, etc.).

The double-sided IC device 2300 may include a first solder resist material 2334 (e.g., polyimide or similar material) and one or more first conductive contacts 2336 formed on the first interconnect layers 2306-2310. The double-sided IC device 2300 may include a second solder resist material 2384 (e.g., polyimide or similar material) and one or more second conductive contacts 2386 formed on the second interconnect layers 2356-2360. In some embodiments, the composition of the first solder resist material 2334 and the second solder resist material 2384 may be the same; in other embodiments, the composition of the first solder resist material 2334 and the second solder resist material 2384 may be different.

In FIG. 18, the first conductive contacts 2336 and the second conductive contacts 2386 are illustrated as taking the form of bond pads. The first conductive contacts 2336 may be electrically coupled with the first interconnect structures 2328 and the second conductive contacts 2386 may be electrically coupled with the second interconnect structures 2378. In some embodiments, TSV interconnect structures may be integrated into the double-sided IC device 2300; in such embodiments, the first conductive contacts 2336 and the second conductive contacts 2386 may be electrically coupled via one or more TSV interconnect structures. The double-sided IC device 2300 may include additional or alternate structures to route the electrical signals from the first interconnect layers 2306-2310 and/or the second interconnect layers 2356-2360; for example, the first conductive contacts 2336 and/or the second conductive contacts 2386 may include other analogous features (e.g., posts) that route the electrical signals to external components. The conductive contacts 2336 and/or 2386 may serve as the conductive contacts for any of the double-sided dies discussed herein, as appropriate.

Figure 19:
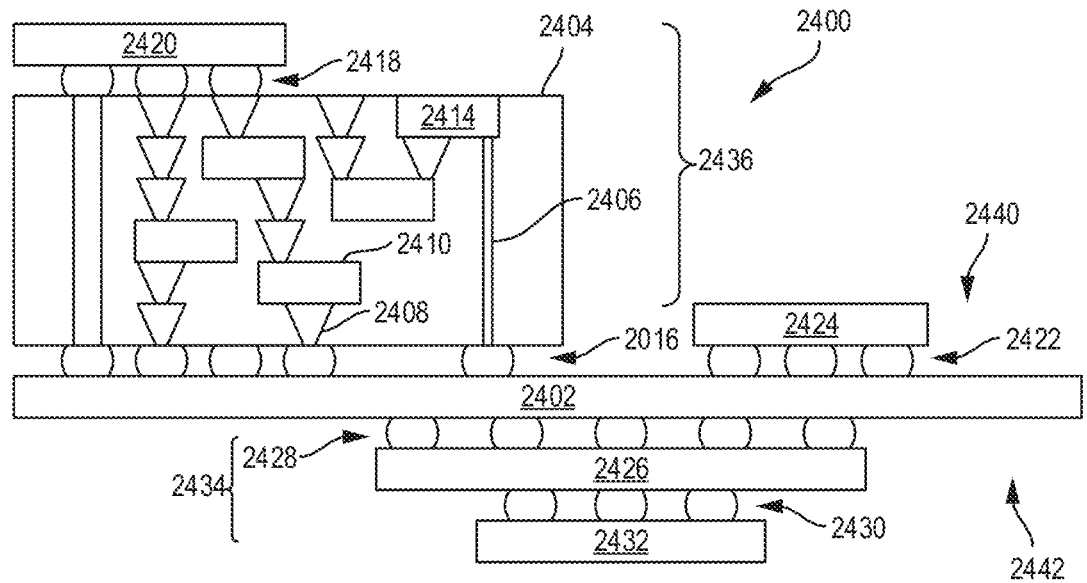
FIG. 19 is a cross-sectional side view of an IC device assembly that may include a microelectronic assembly, in accordance with any of the embodiments disclosed herein.

FIG. 19 is a cross-sectional side view of an IC device assembly 2400 that may include any of the microelectronic assemblies 100/1000/1100/1700/1800 disclosed herein. In some embodiments, the IC device assembly 2400 may be a microelectronic assembly 100/1000/1100/1700/1800. The IC device assembly 2400 includes a number of components disposed on a circuit board 2402 (which may be, e.g., a motherboard). The IC device assembly 2400 includes components disposed on a first face 2440 of the circuit board 2402 and an opposing second face 2442 of the circuit board 2402; generally, components may be disposed on one or both faces 2440 and 2442. Any of the IC packages discussed below with reference to the IC device assembly 2400 may take the form of any suitable ones of the embodiments of the microelectronic assemblies 100/1000/1100/1700/1800 disclosed herein.

In some embodiments, the circuit board 2402 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other embodiments, the circuit board 2402 may be a non-PCB substrate.

The IC device assembly 2400 illustrated in FIG. 19 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 19), male and female portions of a socket, an adhesive, an underfill material, and/or any other suitable electrical and/or mechanical coupling structure.

The package-on-interposer structure 2436 may include an IC package 2420 coupled to an interposer 2404 by coupling components 2418. The coupling components 2418 may take any suitable form for the application, such as the forms discussed above with reference to the coupling components 2416. Although a single IC package 2420 is shown in FIG. 19, multiple IC packages may be coupled to the interposer 2404; indeed, additional interposers may be coupled to the interposer 2404. The interposer 2404 may provide an intervening substrate used to bridge the circuit board 2402 and the IC package 2420. The IC package 2420 may be or include, for example, a die (the die 2102 of FIG. 16), an IC device (e.g., the IC device 2200 of FIG. 17 or the double-sided IC device 2300 of FIG. 18), or any other suitable component. Generally, the interposer 2404 may spread a connection to a wider pitch or reroute a connection to a different connection. For example, the interposer 2404 may couple the IC package 2420 (e.g., a die) to a set of ball grid array (BGA) conductive contacts of the coupling components 2416 for coupling to the circuit board 2402. In the embodiment illustrated in FIG. 19, the IC package 2420 and the circuit board 2402 are attached to opposing sides of the interposer 2404; in other embodiments, the IC package 2420 and the circuit board 2402 may be attached to a same side of the interposer 2404. In some embodiments, three or more components may be interconnected by way of the interposer 2404.

In some embodiments, the interposer 2404 may be formed as a PCB, including multiple metal layers separated from one another by layers of dielectric material and interconnected by electrically conductive vias. In some embodiments, the interposer 2404 may be formed of an epoxy resin, a fiberglass-reinforced epoxy resin, an epoxy resin with inorganic fillers, a ceramic material, or a polymer material such as polyimide. In some embodiments, the interposer 2404 may be formed of alternate rigid or flexible materials that may include the same materials described above for use in a semiconductor substrate, such as silicon, germanium, and other group III-V and group IV materials. The interposer 2404 may include metal interconnects 2408 and vias 2410, including but not limited to TSVs 2406. The interposer 2404 may further include embedded devices 2414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an IC package 2424 coupled to the first face 2440 of the circuit board 2402 by coupling components 2422. The coupling components 2422 may take the form of any of the embodiments discussed above with reference to the coupling components 2416, and the IC package 2424 may take the form of any of the embodiments discussed above with reference to the IC package 2420.

The IC device assembly 2400 illustrated in FIG. 19 includes a package-on-package structure 2434 coupled to the second face 2442 of the circuit board 2402 by coupling components 2428. The package-on-package structure 2434 may include an IC package 2426 and an IC package 2432 coupled together by coupling components 2430 such that the IC package 2426 is disposed between the circuit board 2402 and the IC package 2432. The coupling components 2428 and 2430 may take the form of any of the embodiments of the coupling components 2416 discussed above, and the IC packages 2426 and 2432 may take the form of any of the embodiments of the IC package 2420 discussed above. The package-on-package structure 2434 may be configured in accordance with any of the package-on-package structures known in the art.

Figure 20:
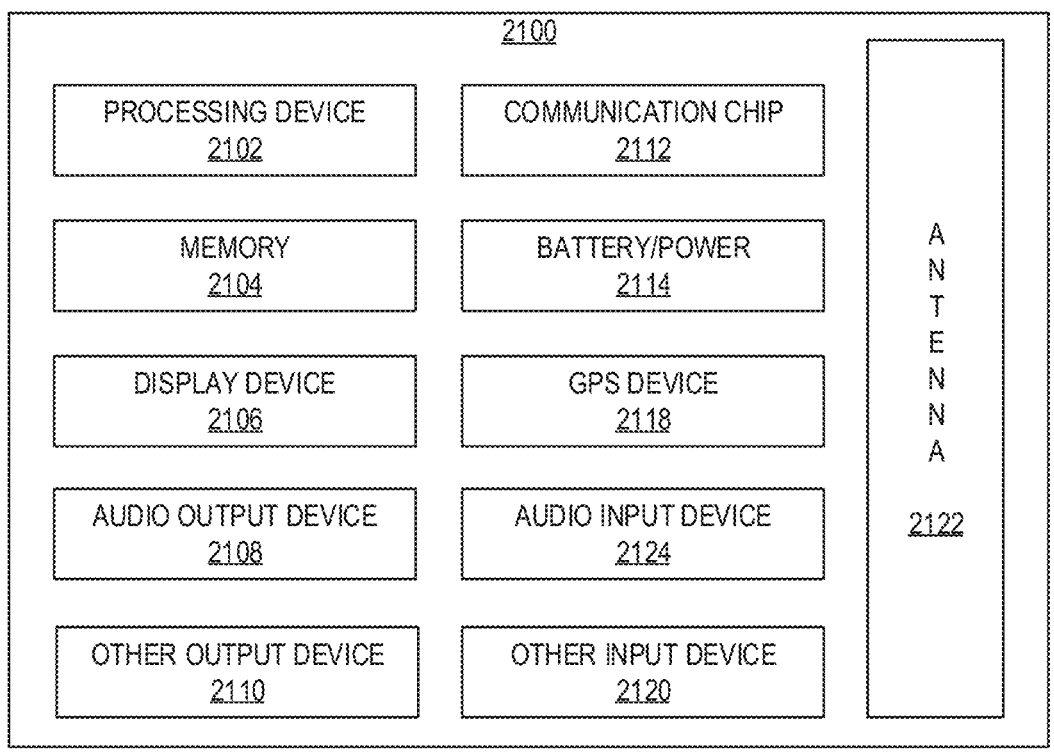
FIG. 20 is a block diagram of an example electrical device that may include a microelectronic assembly, in accordance with any of the embodiments disclosed herein.

FIG. 20 is a block diagram of an example electrical device 2500 that may include one or more of the microelectronic assemblies 100/1000/1100/1700/1800 disclosed herein. For example, any suitable ones of the components of the electrical device 2500 may include one or more of the IC device assemblies 2400, IC devices 2200, double-sided IC devices 2300 or dies 2102 disclosed herein, and may be arranged in any of the microelectronic assemblies 100/1000/1100/1700/1800 disclosed herein. A number of components are illustrated in FIG. 20 as included in the electrical device 2500, but any one or more of these components may be omitted or duplicated, as suitable for the application. In some embodiments, some or all of the components included in the electrical device 2500 may be attached to one or more motherboards. In some embodiments, some or all of these components are fabricated onto a single system-on-a-chip (SoC) die.

Additionally, in various embodiments, the electrical device 2500 may not include one or more of the components illustrated in FIG. 20, but the electrical device 2500 may include interface circuitry for coupling to the one or more components. For example, the electrical device 2500 may not include a display device 2506, but may include display device interface circuitry (e.g., a connector and driver circuitry) to which a display device 2506 may be coupled. In another set of examples, the electrical device 2500 may not include an audio input device 2524 or an audio output device 2508, but may include audio input or output device interface circuitry (e.g., connectors and supporting circuitry) to which an audio input device 2524 or audio output device 2508 may be coupled.

The electrical device 2500 may include a processing device 2502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2502 may include one or more digital signal processors (DSPs), application-specific integrated circuits (ASICs), central processing units (CPUs), GPUs, cryptoprocessors (specialized processors that execute cryptographic algorithms within hardware), server processors, or any other suitable processing devices. The electrical device 2500 may include a memory 2504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2504 may include memory that shares a die with the processing device 2502. This memory may be used as cache memory and may include embedded dynamic random access memory (eDRAM) or spin transfer torque magnetic random access memory (STT-M RAM).

In some embodiments, the electrical device 2500 may include a communication chip 2512 (e.g., one or more communication chips). For example, the communication chip 2512 may be configured for managing wireless communications for the transfer of data to and from the electrical device 2500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2512 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2512 may operate in accordance with other wireless protocols in other embodiments. The electrical device 2500 may include an antenna 2522 to facilitate wireless communications and/or to receive other wireless communications (such as AM or FM radio transmissions).

In some embodiments, the communication chip 2512 may manage wired communications, such as electrical, optical, or any other suitable communication protocols (e.g., the Ethernet). As noted above, the communication chip 2512 may include multiple communication chips. For instance, a first communication chip 2512 may be dedicated to shorter-range wireless communications such as Wi-Fi or Bluetooth, and a second communication chip 2512 may be dedicated to longer-range wireless communications such as global positioning system (GPS), EDGE, GPRS, CDMA, WiMAX, LTE, EV-DO, or others. In some embodiments, a first communication chip 2512 may be dedicated to wireless communications, and a second communication chip 2512 may be dedicated to wired communications.

The electrical device 2500 may include battery/power circuitry 2514. The battery/power circuitry 2514 may include one or more energy storage devices (e.g., batteries or capacitors) and/or circuitry for coupling components of the electrical device 2500 to an energy source separate from the electrical device 2500 (e.g., AC line power).

The electrical device 2500 may include a display device 2506 (or corresponding interface circuitry, as discussed above). The display device 2506 may include any visual indicators, such as a heads-up display, a computer monitor, a projector, a touchscreen display, a liquid crystal display (LCD), a light-emitting diode display, or a flat panel display.

The electrical device 2500 may include an audio output device 2508 (or corresponding interface circuitry, as discussed above). The audio output device 2508 may include any device that generates an audible indicator, such as speakers, headsets, or earbuds.

The electrical device 2500 may include an audio input device 2524 (or corresponding interface circuitry, as discussed above). The audio input device 2524 may include any device that generates a signal representative of a sound, such as microphones, microphone arrays, or digital instruments (e.g., instruments having a musical instrument digital interface (MIDI) output).

The electrical device 2500 may include a GPS device 2518 (or corresponding interface circuitry, as discussed above). The GPS device 2518 may be in communication with a satellite-based system and may receive a location of the electrical device 2500, as known in the art.

The electrical device 2500 may include a other output device 2510 (or corresponding interface circuitry, as discussed above). Examples of the other output device 2510 may include an audio codec, a video codec, a printer, a wired or wireless transmitter for providing information to other devices, or an additional storage device.

The electrical device 2500 may include a other input device 2520 (or corresponding interface circuitry, as discussed above). Examples of the other input device 2520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 2500 may be any other electronic device that processes data.

The following paragraphs provide various examples of the embodiments disclosed herein.

Example 1 is a microelectronic assembly including: a photonic receiver; and a die coupled to the photonic receiver by interconnects, wherein the die includes a device layer between a first interconnect layer of the die and a second interconnect layer of the die.

Example 2 may include the subject matter of Example 1 and may further specify that the microelectronic assembly further includes a package substrate, wherein the die is coupled to the package substrate by first-level interconnects.

Example 3 may include the subject matter of Example 1 and may further specify that the photonic receiver includes a lens; and a photodetector.

Example 4 may include the subject matter of Example 3 and may further specify that the photonic receiver further includes an optical waveguide between the lens and the photodetector.

Example 5 may include the subject matter of Example 4 and may further specify that the optical waveguide includes metallization around a lateral circumference of the optical waveguide.

Example 6 may include the subject matter of Example 1 and may further specify that the photonic receiver comprises at least one photonic receiver channel coupled to the die.

Example 7 may include the subject matter of Example 1 and may further specify that the photonic receiver has a thickness between 10 microns and 780 microns.

Example 8 may include the subject matter of 1 and may further specify that the die includes conductive contacts having a pitch between 0.1 microns and 55 microns.

Example 9 may include the subject matter of Example 8 and may further specify that the die includes first conductive contacts at a first face and second conductive contacts at a second face, wherein the first conductive contacts and the second conductive contacts have a same pitch.

Example 10 may include the subject matter of Example 8 and may further specify that the die includes first conductive contacts at a first face and second conductive contacts at a second face, wherein the first conductive contacts and the second conductive contacts have a different pitch.

Example 12 may include the subject matter of Example 1 and may further specify that the die has a thickness between 10 microns and 75 microns.

Example 13 may include the subject matter of any of Examples 1-12 and may further specify that the die is one of a plurality of dies coupled to the photonic receiver.

Example 14 may include the subject matter of any of Examples 1-13 and may further specify that the die is further coupled to a photonic transmitter.

Example 15 is a microelectronic assembly including a photonic transmitter; and a die coupled to the photonic transmitter by interconnects, wherein the die includes a device layer between a first interconnect layer of the die and a second interconnect layer of the die.

Example 16 may include the subject matter of Example 15 and may further include a package substrate, wherein the die is coupled to the package substrate by first-level interconnects.

Example 17 may include the subject matter of Example 15 and may further specify that the photonic transmitter includes a laser; an optical waveguide; and an electro-optic modulator.

Example 18 may include the subject matter of Example 17 and may further specify that the electro-optic modulator is an individual one of a plurality of electro-optic modulators of the photonic transmitter.

Example 19 may include the subject matter of Example 17 and may further specify that the laser is an array comprising a plurality of lasers and optical waveguides.

Example 20 may include the subject matter of Example claim 15 and may further specify that the photonic transmitter has a thickness between 5 microns and 780 microns.

Example 21 may include the subject matter of Example 15 and may further specify that the die comprises conductive contacts having a pitch between 0.1 microns and 50 microns.

Example 22 may include the subject matter of Example 21 and may further specify that the die includes first conductive contacts at a first face and second conductive contacts at a second face, wherein the first conductive contacts and the second conductive contacts have a same pitch.

Example 23 may include the subject matter of Example 21 and may further specify that the die includes first conductive contacts at a first face and second conductive contacts at a second face, wherein the first conductive contacts and the second conductive contacts have a different pitch.

Example 24 may include the subject matter of Example 15 and may further specify that the die has a thickness between 10 microns and 75 microns.

Example 25 may include the subject matter of any of Examples 17-24 and may further specify that the die is one of a plurality of dies coupled to the photonic transmitter.

Example 26 may include the subject matter of any of Examples 17-25, wherein the die is further coupled to a photonic receiver.

Example 27 is an electronic device including a composite die, the composite die including: a photonic receiver; and a die coupled to the photonic receiver by interconnects, wherein the die includes a device layer between a first interconnect layer and a second interconnect layer of the die.

Example 28 may include the subject matter of Example 27 and may further specify that the photonic receiver is a first die having a first face and an opposing second face, the die is a second die having a first face and an opposing second face, and conductive contacts at the first face of the first die are coupled to conductive contacts at the second face of the second die by the interconnects.

Example 29 may include the subject matter of Example 28 and may further specify that conductive contacts at the first face of the second die are coupled to a package substrate by first-level interconnects.

Example 30 may include the subject matter of Example 27 and may further specify that the electronic device is included in a networked computing device.

Example 31 may include the subject matter of Example 27 and may further specify that the photonic receiver has a thickness between 10 microns and 780 microns.

Example 32 may include the subject matter of Example 27 and may further specify that the die comprises conductive contacts having a pitch between 0.1 microns and 55 microns.

Example 33 may include the subject matter of Example 27 and may further specify that the die includes first conductive contacts at a first face and second conductive contacts at a second face, wherein the first conductive contacts and the second conductive contacts have a same pitch.

Example 34 may include the subject matter of Example 27 and may further specify that the die includes first conductive contacts at a first face and second conductive contacts at a second face, wherein the first conductive contacts and the second conductive contacts have a different pitch.

Example 35 may include the subject matter of Example 27 and may further specify that the die has a thickness between 10 microns and 75 microns.

Example 36 may include the subject matter of any of Examples 27-35 and may further specify that the die is one of a plurality of dies coupled to the photonic receiver.

Example 37 may include the subject matter of any of Examples 27-36 and may further specify that the die is further coupled to a photonic transmitter.

Example 38 is an electronic device including: a composite die, the composite die including: a photonic transmitter; and a die coupled to the photonic transmitter by interconnects, wherein the die includes a device layer between a first interconnect layer and a second interconnect layer of the die.

Example 39 may include the subject matter of Example 38 and may further specify that the photonic transmitter is a first die having a first face and an opposing second face, the die is a second die having a first face and an opposing second face, and conductive contacts at the first face of the first die are coupled to conductive contacts at the second face of the second die by the interconnects.

Example 40 may include the subject matter of Example 39 and may further specify that conductive contacts at the first face of the second die are coupled to a package substrate by first-level interconnects.

Example 41 may include the subject matter of Example 38 and may further specify that the photonic transmitter includes: a laser; an optical waveguide; and an electro-optic modulator.

Example 42 may include the subject matter of Example 38 and may further specify that the electro-optic modulator is an individual one of a plurality of electro-optic modulators of the photonic transmitter.

Example 43 may include the subject matter of Example 38 and may further specify that the laser is an array comprising a plurality of lasers and optical waveguides.

Example 44 may include the subject matter of Example 38 and may further specify that the photonic transmitter has a thickness between 5 microns and 780 microns.

Example 45 may include the subject matter of Example 38 and may further specify that the die comprises conductive contacts having a pitch between 0.1 microns and 50 microns.

Example 46 may include the subject matter of any of Examples 38-45 and may further specify that the die is one of a plurality of dies coupled to the photonic transmitter.

Example 47 may include the subject matter of any of Examples 38-46 and may further specify that the die is further coupled to a photonic receiver.

The invention claimed is:

1. A microelectronic assembly, comprising:
a photonic receiver including a lens and a photodetector; and
a die coupled to the photonic receiver by interconnects, wherein the die comprises a device layer between a first interconnect layer of the die and a second interconnect layer of the die.

2. The microelectronic assembly of claim 1, further comprising:
a package substrate, wherein the die is coupled to the package substrate by first-level interconnects.

3. The microelectronic assembly of claim 1, wherein the photonic receiver further comprises an optical waveguide between the lens and the photodetector; and
wherein the optical waveguide includes metallization around a lateral circumference of the optical waveguide.

4. The microelectronic assembly of claim 1, wherein the photonic receiver comprises at least one photonic receiver channel coupled to the die.

5. The microelectronic assembly of claim 1, wherein the die is one of a plurality of dies coupled to the photonic receiver.

6. The microelectronic assembly of claim 1, wherein the die is further coupled to a photonic transmitter.

7. A microelectronic assembly, comprising:
a photonic transmitter including a laser, an optical waveguide, and an electro-optic modulator; and
a die coupled to the photonic transmitter by interconnects, wherein the die comprises a device layer between a first interconnect layer of the die and a second interconnect layer of the die.

8. The microelectronic assembly of claim 7, further comprising:
a package substrate, wherein the die is coupled to the package substrate by first-level interconnects.

9. The microelectronic assembly of claim 7, wherein the electro-optic modulator is an individual one of a plurality of electro-optic modulators of the photonic transmitter.

10. The microelectronic assembly of claim 7, wherein the laser is an array comprising a plurality of lasers and optical waveguides.

11. The microelectronic assembly of claim 7, wherein the die is one of a plurality of dies coupled to the photonic transmitter.

12. The microelectronic assembly of claim 7, wherein the die is further coupled to a photonic receiver.

13. An electronic device, comprising:
a composite die, the composite die comprising:
a photonic receiver, wherein the photonic receiver is a first die having a first face with first conductive contacts and an opposing second face; and
a second die having a first face and an opposing second face with second conductive contacts, wherein the first conductive contacts at the first face of the first die are coupled the second conductive contacts at the second face of the second die by interconnects, and wherein the second die comprises a device layer between a first interconnect layer and a second interconnect layer of the second die.

14. The electronic device of claim 13, wherein conductive contacts at the first face of the second die are coupled to a package substrate by first-level interconnects.

15. An electronic device, comprising:
a composite die, the composite die comprising:
a photonic receiver; and
a die coupled to the photonic receiver by interconnects, wherein the die comprises a device layer between a first interconnect layer and a second interconnect layer of the die, and wherein the electronic device is included in a networked computing device.

16. The electronic device of claim 15, wherein the die is one of a plurality of dies coupled to the photonic receiver.

17. The electronic device of claim 15, wherein the die is further coupled to a photonic transmitter.

\* \* \* \* \*

UNITED STATES PATENT AND TRADEMARK OFFICE
CERTIFICATE OF CORRECTION

PATENT NO. : 11,756,943 B2  
APPLICATION NO. : 16/650698  
DATED : September 12, 2023  
INVENTOR(S) : Shawna M. Liff et al.

Page 1 of 1

It is certified that error appears in the above-identified patent and that said Letters Patent is hereby corrected as shown below:

In the Claims

In Column 44, Claim 13, Line 49, delete "coupled the" and insert -- coupled to the --, therefor.

Signed and Sealed this
Tenth Day of October, 2023

Katherine Kelly Vidal
*Director of the United States Patent and Trademark Office*